US010043755B2

(12) United States Patent
Betsui et al.

(10) Patent No.: US 10,043,755 B2
(45) Date of Patent: Aug. 7, 2018

(54) ELECTRONIC DEVICE

(71) Applicant: Renesas Electronics Corporation, Tokyo (JP)

(72) Inventors: Takafumi Betsui, Kodaira (JP); Motoo Suwa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/552,774

(22) PCT Filed: Jun. 26, 2015

(86) PCT No.: PCT/JP2015/068574
§ 371 (c)(1),
(2) Date: Aug. 22, 2017

(87) PCT Pub. No.: WO2016/208081
PCT Pub. Date: Dec. 29, 2016

(65) Prior Publication Data
US 2018/0033731 A1 Feb. 1, 2018

(51) Int. Cl.
*H05K 1/18* (2006.01)
*H01L 23/538* (2006.01)
(Continued)

(52) U.S. Cl.
CPC ............ *H01L 23/538* (2013.01); *H01L 23/50* (2013.01); *H01L 2027/11875* (2013.01); *H01L 2027/11881* (2013.01)

(58) Field of Classification Search
USPC ........................................ 361/764, 761, 783
See application file for complete search history.

(56) References Cited

U.S. PATENT DOCUMENTS 6,078,514 A 6/2000 Takemae et al.
8,786,102 B2 * 7/2014 Yoshida .................. H01L 24/81
257/621
(Continued)

FOREIGN PATENT DOCUMENTS

JP     H 06-151639 A    5/1994
JP       H 11-86546 A    3/1999
(Continued)

OTHER PUBLICATIONS

International Search Report (ISR) (PCT Form PCT/ISA/210), in PCT/JP2015/068574, dated Sep. 15, 2015.

*Primary Examiner* — Andargie M Aychillhum
(74) *Attorney, Agent, or Firm* — McGinn IP Law Group, PLLC

(57) ABSTRACT

An electronic device includes a first wiring substrate and a semiconductor device mounted on the first wiring substrate. The semiconductor device includes a second wiring substrate having a plurality of terminals, a plurality of first semiconductor chips mounted on the second wiring substrate, and a second semiconductor chip mounted on the second wiring substrate. The first wiring substrate includes a first power supply line and a second power supply line supplying a plurality of power supply potentials, whose types are different from each other, to the second semiconductor chip. In a plan view, the second power supply line is arranged to cross over a first substrate side of the second wiring substrate and a first chip side of the second semiconductor chip. In a plan view, the first power supply line is arranged to pass between the second power supply line and a part of the plurality of first semiconductor chips and to extend toward a region overlapping with the second semiconductor chip. An area of a region of the first power supply line, the region overlapping with the second power supply line in a thickness direction, is smaller than an area of
(Continued)

another region of the first power supply line, the another region not overlapping with the second power supply line.

19 Claims, 21 Drawing Sheets

(51) Int. Cl.
  *H01L 23/50* (2006.01)
  *H01L 27/118* (2006.01)

(56) References Cited

U.S. PATENT DOCUMENTS

| | | |
|---|---|---|
| 2002/0108779 A1 | 8/2002 | Ohsaka |
| 2006/0192282 A1 | 8/2006 | Suwa et al. |
| 2007/0192559 A1 | 8/2007 | Betsui et al. |
| 2007/0194433 A1 | 8/2007 | Suwa et al. |
| 2010/0062727 A1 | 3/2010 | Kemmochi et al. |
| 2011/0089563 A1* | 4/2011 | Kikuchi ................ H01L 21/565 257/738 |
| 2012/0079238 A1 | 3/2012 | Betsui et al. |
| 2013/0063902 A1 | 3/2013 | Yoshida et al. |
| 2013/0128647 A1 | 5/2013 | Betsui et al. |
| 2014/0160826 A1 | 6/2014 | Betsui et al. |
| 2015/0036406 A1 | 2/2015 | Betsui et al. |
| 2017/0062020 A1 | 3/2017 | Betsui et al. |
| 2017/0062021 A1 | 3/2017 | Betsui et al. |

FOREIGN PATENT DOCUMENTS

| | | |
|---|---|---|
| JP | 2002-290058 A | 10/2002 |
| JP | 2006-237385 A | 9/2006 |
| JP | 2007-213375 A | 8/2007 |
| JP | 2013-058646 A | 3/2013 |
| WO | WO 2005/091367 A1 | 9/2005 |
| WO | WO 2008/084723 A1 | 7/2008 |

* cited by examiner

ELECTRONIC DEVICE

TECHNICAL FIELD

This invention relates to a semiconductor device in which, for example, a plurality of semiconductor chips are mounted side by side on a wiring substrate, and relates to an electronic device on which the semiconductor device is mounted.

BACKGROUND ART

Japanese Patent Application Laid-Open Publication No. 2006-237385 (Patent Document 1) and Japanese Patent Application Laid-Open Publication No. 2007-213375 (Patent Document 2) describe a semiconductor device in which a plurality of memory chips and a data processing chip controlling the plurality of memory chips are mounted side by side on a wiring substrate.

Japanese Patent Application Laid-Open Publication No. H06-151639 (Patent Document 3) describes a semiconductor device in which a ground pin and a power supply pin of a plurality of pins (terminals) of the wiring substrate are continuously arranged in series from the inside to the outside.

RELATED ART DOCUMENTS

Patent Documents

Patent Document 1: Japanese Patent Application Laid-Open Publication No. 2006-237385
Patent Document 2: Japanese Patent Application Laid-Open Publication No. 2007-213375
Patent Document 3: Japanese Patent Application Laid-Open Publication No. H06-151639

SUMMARY OF THE INVENTION

Problems to be Solved by the Invention

There is a semiconductor device in which a plurality of semiconductor chips are arranged on a wiring substrate so that the plurality of semiconductor chips are electrically connected via the wiring substrate. In order to improve the performance of such a semiconductor device, a technique of increasing the amount of data that can be processed by the semiconductor device is required.

In order to increase the amount of data processed by the semiconductor device, a technique of improving the transmission speed of the signal is required. In order to increase the amount of data processed by the semiconductor device, a technique of efficiently supplying a large current to the arithmetic processing circuit is required since the current value supplied to the arithmetic processing circuit is large.

Other object and novel characteristics will be apparent from the description of the present specification and the accompanying drawings.

Means for Solving the Problems

An electronic device according to an embodiment includes a first wiring substrate and a semiconductor device mounted on the first wiring substrate. The semiconductor device includes a second wiring substrate including a plurality of terminals, a plurality of first semiconductor chips mounted on the second wiring substrate, and a second semiconductor chip mounted on the second wiring substrate. The first wiring substrate includes a first power supply line and a second power supply line supplying a plurality of power supply potentials whose types are different from one another to the second semiconductor chip. In a plan view, the second power supply line is arranged to cross over a first board side of the second wiring substrate and a first chip side of the second semiconductor chip. In a plan view, the first power supply line is arranged to pass between the second power supply line and at least one of the plurality of first semiconductor chips and to extend toward a region overlapping with the second semiconductor chip. An area of a region of the first power supply line, the region overlapping with the second power supply line in a thickness direction, is smaller than an area of a region of the first power supply line, the region not overlapping with the second power supply line.

Effects of the Invention

According to the embodiment, the performance of the electronic device mounted with the semiconductor device in which the plurality of semiconductor chips are electrically connected to each other via the wiring substrate can be improved.

BRIEF DESCRIPTIONS OF THE DRAWINGS

Figure 1:
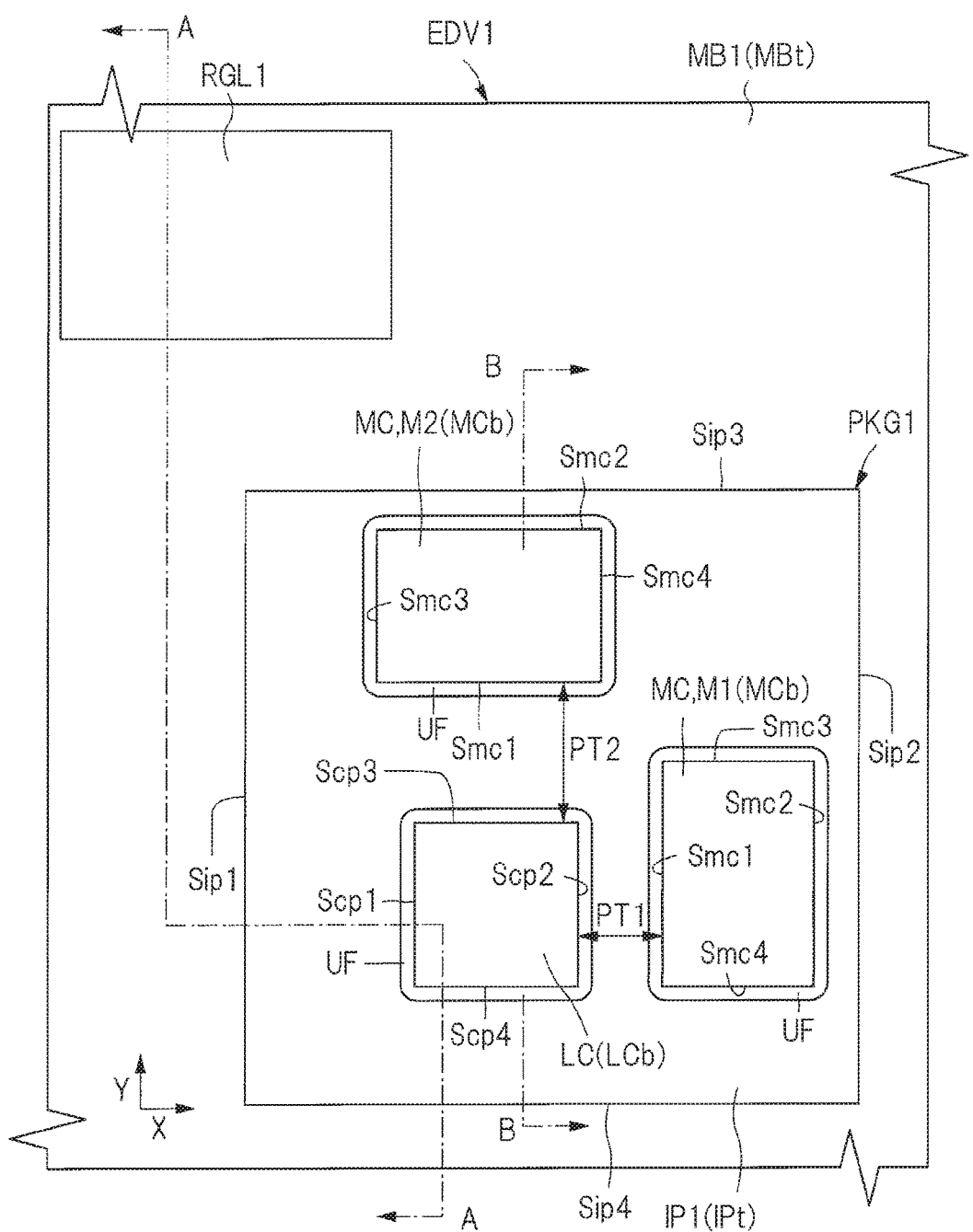
FIG. 1 is an enlarged plan view illustrating an example of configuration of an electronic device including a semiconductor device according to an embodiment.

BEST MODE FOR CARRYING OUT THE INVENTION (Explanation of Description Form, Basic Term and Usage in Present Application)

In the present application, the embodiments will be described in a plurality of sections if needed when required as a matter of convenience. However, these sections are not irrelevant to each other unless otherwise stated, and each part of one single example is the detailed part, the entire or a part of the other as a modification example or others, regardless of before and after the description. Also, in principle, the repetitive description of the same part is omitted. Further, each element in the embodiment is not indispensable unless otherwise described to be particularly so, logically limited to the number, and described to be clearly so from the contexts.

Similarly, when "X made of A" or others is described for materials, compositions, and others in the description of the embodiment and others, the one containing other components than A is not eliminated unless otherwise specified not to be only the component and clearly to be so from the contexts. For example, the component means "X containing A as a main component" or others. For example, it is needless to say that a "silicon material" and others includes not only pure silicon but also SiGe (silicon germanium) alloy or other multicomponent alloy containing silicon as a main component, or a member containing other additives or others. Also, gold plating, a Cu layer, nickel plating, and others include not only pure material but also members containing gold, Cu, nickel, and others as a main component, respectively, unless otherwise specified not to be so.

Further, even when a specific numerical value and numerical amount are mentioned, they may be numerical values that excess the specific numerical values or smaller than the specific numerical values unless otherwise specified not to be so, logically limited to the number, and clearly described to be so from the contents.

Still further, in each drawing of the embodiments, the same or similar parts are denoted by the same or similar symbol or reference number, and the description thereof is not repeated.

Also, in the attached drawings, hatching or others is omitted even in a cross-sectional view in a conversely complicated case or in a case in which a space is clearly distinguished therefrom. In respect to this, in a case in which it is clear from the description or others, an outline of the background is omitted even in a hole which is closed in a plan view. Further, hatching or a dot pattern is added to a drawing even when the drawing is not a cross-sectional view in order to explicitly illustrate so as not to be the space or explicitly illustrate a boundary between regions.

EMBODIMENT

In the present embodiment, as an example of a semiconductor device in which a plurality of semiconductor chips are electrically connected via a wiring substrate and an example of an electronic device on which the semiconductor device is mounted, a semiconductor device mounted into a car navigation device and a module (electronic device) having the semiconductor device will be exemplified and explained.

A car navigation device, which is explained as the example in the present embodiment, is electronic equipment mounted on an automobile. In recent years, it has been attempted to sophisticate the functions of the car navigation device by providing various functions (systems) in one device. For example, some car navigation devices have not only a car navigation system that displays the current position of the automobile and that guides the path to the destination but also various functions (systems) such as a music reproduction system and a moving picture reproduction system. From the viewpoint of improving the performance of each of the above-described various systems, it is preferable to increase the amount of data per unit time processed by each system.

The electronic device including a plurality of systems as described above is considered to be achieved by mounting a plurality of functionally-different semiconductor devices (for example, a semiconductor device for control and a semiconductor device for storage) on the motherboard and by electrically connecting the plurality of semiconductor devices via wirings on the motherboard. However, in a case of the method of connecting the plurality of semiconductor devices via the wirings on the motherboard in consideration of the increase of the amount of the processed data per unit time or the improvement of the data transfer speed, it is difficult to improve the electrical characteristics.

Therefore, the inventors of the present application have studied a configuration in which a plurality of semiconductor chips are mounted on one semiconductor device so that the plurality of semiconductor chips are electrically connected via a wiring substrate which is an interposer. That is, the semiconductor device PKG1 (see FIG. 1) described below is a multi-chip module (MCM) having a plurality of semiconductor chips. The semiconductor device PKG1 is an SiP (System in Package) in which a system is formed in one semiconductor package. A wiring substrate IP1 (see FIG. 2) included in the semiconductor device PKG1 has a smaller plane area than that of the wiring substrate MB1 which is the motherboard, and the wiring substrate IP1 can be formed with wirings with higher processing accuracy. Therefore, when a plurality of semiconductor chips are electrically connected, high electrical characteristics can be obtained.

However, when a plurality of systems are to be made in one semiconductor package as similar to the semiconductor device PKG1 and when the electric characteristics are to be improved, it has been found out that it is necessary to efficiently arrange a path that supplies a power supply that drives a plurality of systems or a path that inputs or outputs signal current to and from the semiconductor device PKG1.

For example, in order to drive a circuit that forms graphics, moving images, and others, a large current larger than 5 A (ampere) is required in some cases. When the cross-sectional area of the supply path for the power supply decreases as the wiring density increases, the impedance increases. However, when a large current flows in a power supply path having a large impedance, the amount of voltage drop increases. When the margin of the power supply potential for operating the circuit is small, there is a concern that the circuit does not operate due to the voltage drop. Therefore, it is preferable to widen the wiring width in the path that supplies the driving power supply potential.

When a plurality of types of power supply currents are supplied, it is preferable to reduce the mutual influence between supply paths of a plurality of types of power supplies. For example, when each of different currents is supplied through a wide wiring, capacitive coupling occurs between wirings at a portion where the wirings overlap each other in the thickness direction. Depending on the degree of this capacitive coupling, the capacitive coupling becomes a cause of noises in the supply path of the power supply.

When the resistance value of the supply path of the driving voltage is large, there is a concern about increase in the temperature of the semiconductor device PKG1, which results in instability of the circuit operation. For example, when the power supply path in which the large current as described above flows and a high speed signal transmission path of 1.6 Gbps (Giga bits per second) or higher exist together, it is necessary to consider countermeasure against noises in the high speed signal transmission path. In particular, when a signal is transmitted by using a differential pair, or when the signal transmission amount per unit time is increased by increase the bus width, the number of signal transmission paths increases. Therefore, a technique of efficiently forming a wiring path in a wiring substrate of an interposer whose plane area is smaller than that of the motherboard is required.

Hereinafter, an example of configuration of an electronic device according to the present embodiment will be described in an order of the configuration of the electronic device and the semiconductor device included in the electronic device.

<Electronic Device>

Figure 2:
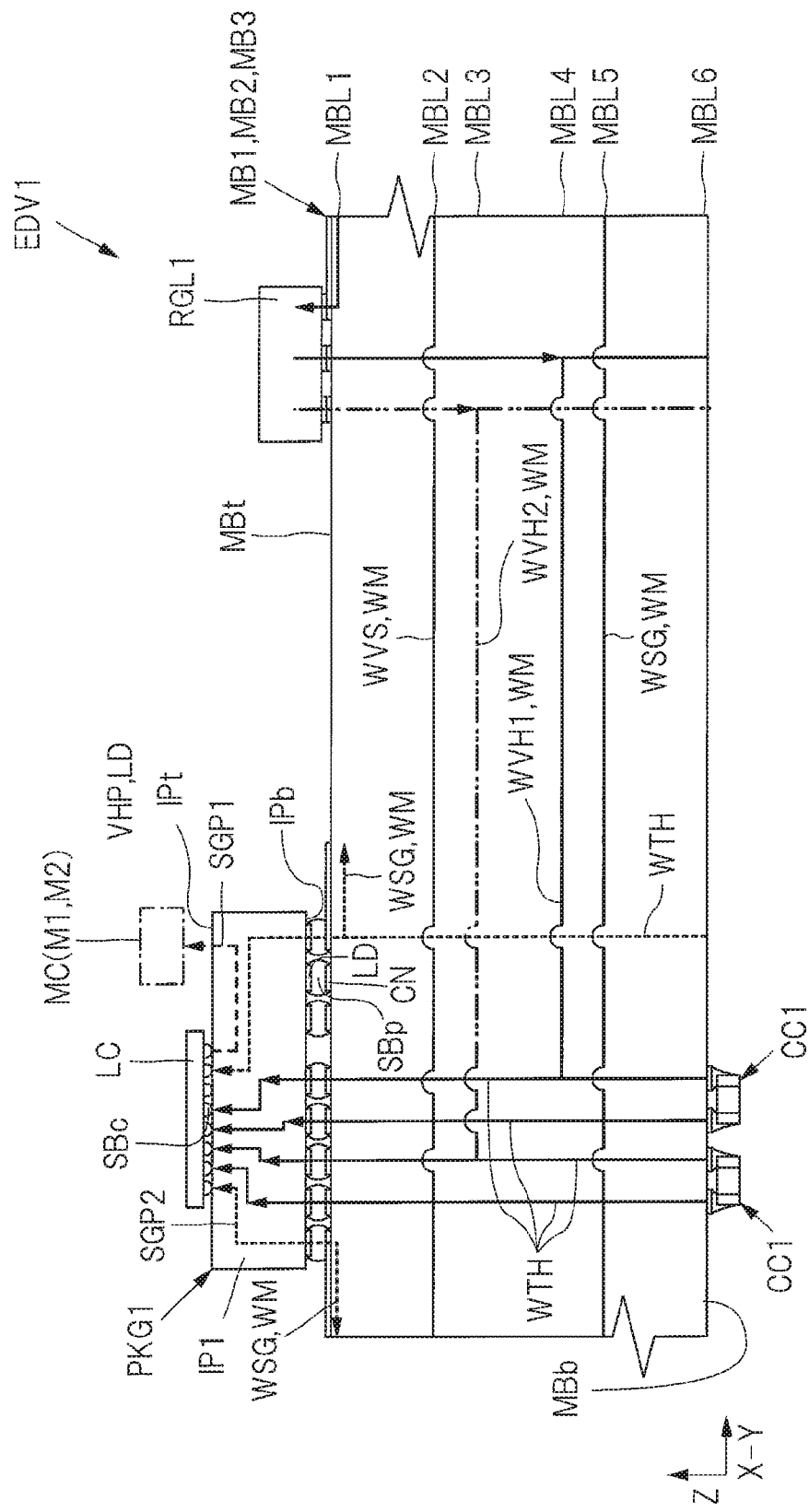
FIG. 2 is an explanatory diagram illustrating an electric connection relation of components included in the electronic device in a cross section taken along a line A-A of FIG. 1.
Figure 3:
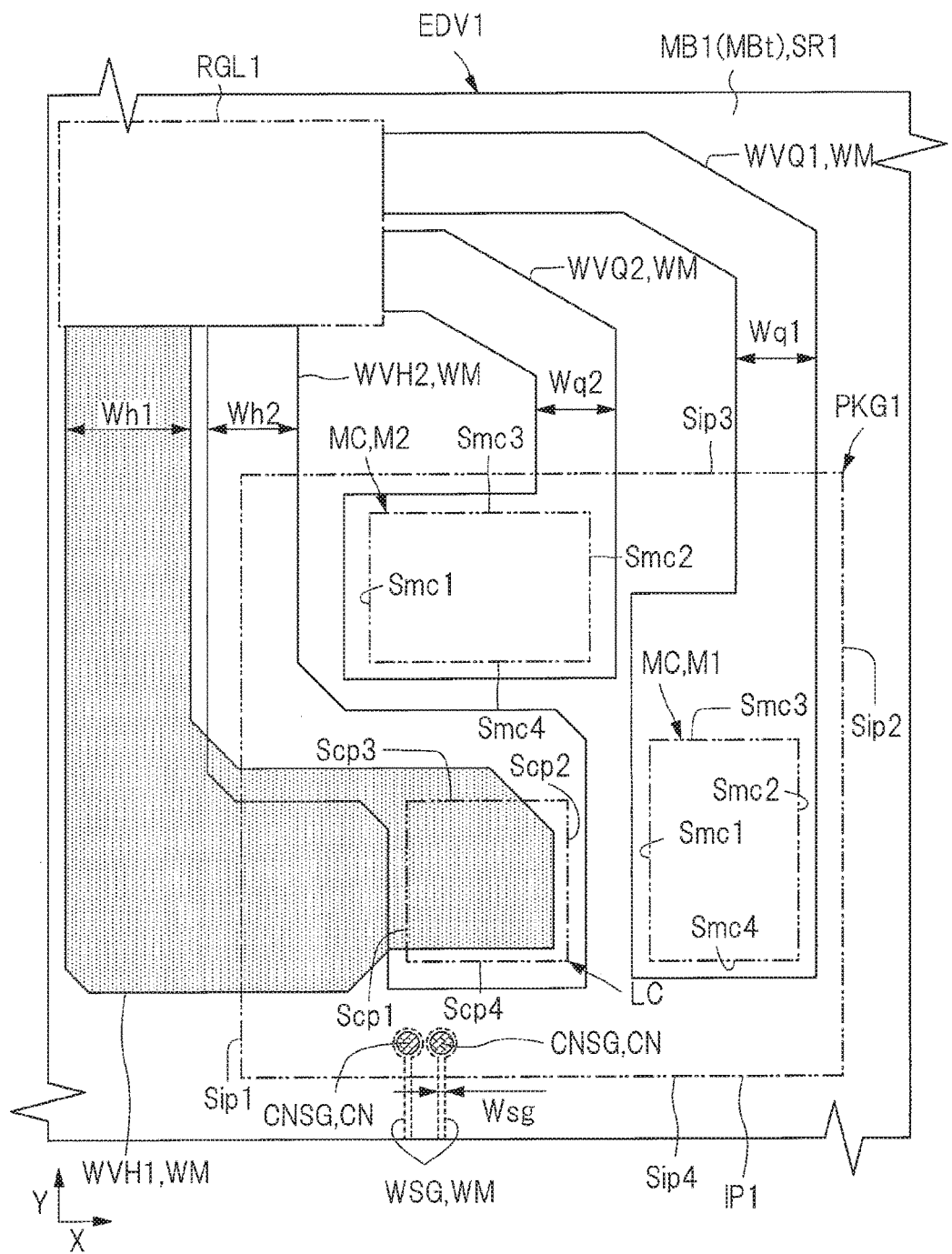
FIG. 3 is an enlarged plan view illustrating an example of a wiring layout in a plan view of a motherboard illustrated in FIG. 1.
Figure 4:
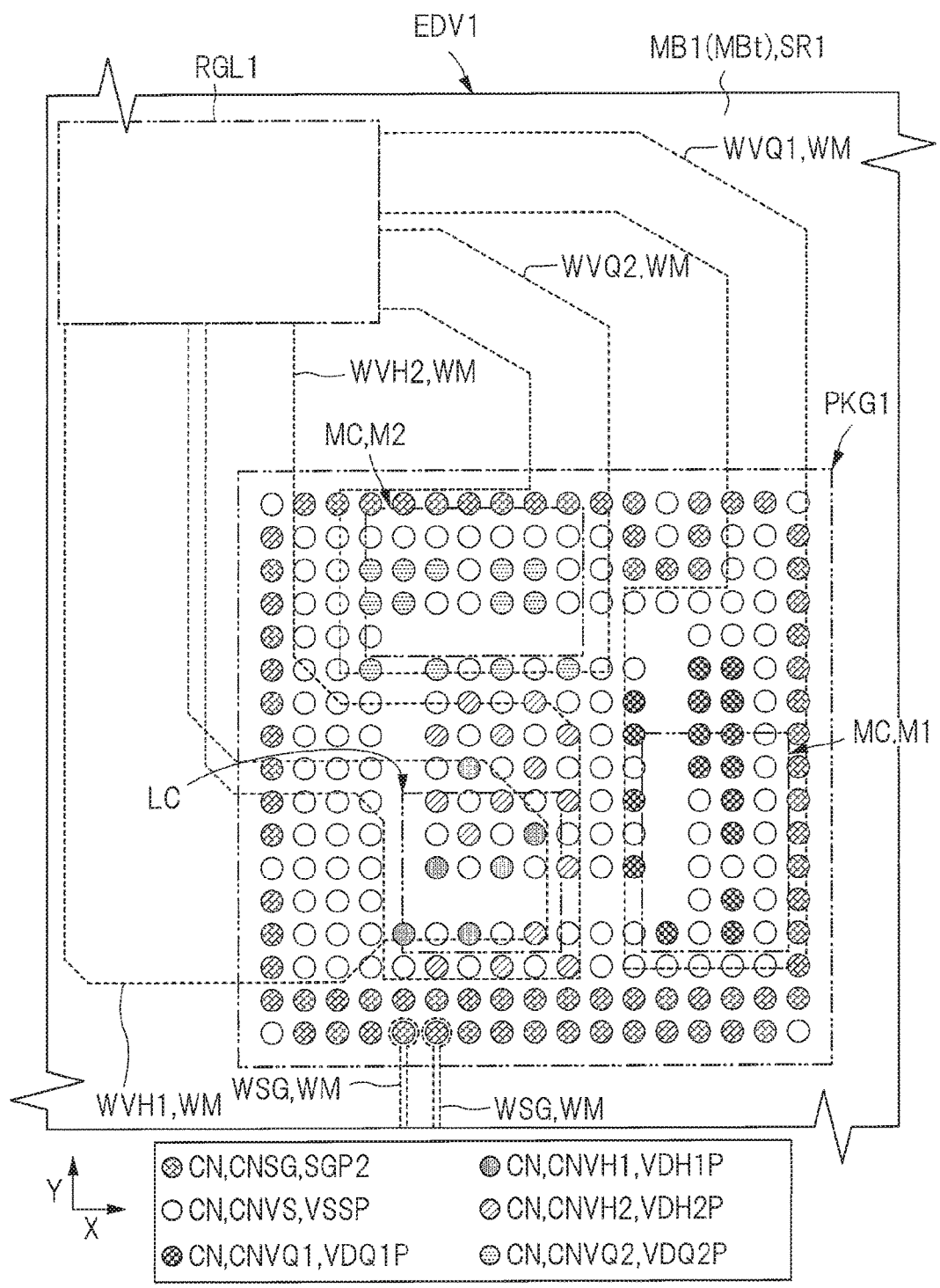
FIG. 4 is an enlarged plan view illustrating an example of a terminal layout in a plan view of a motherboard illustrated in FIG. 1.
Figure 5:
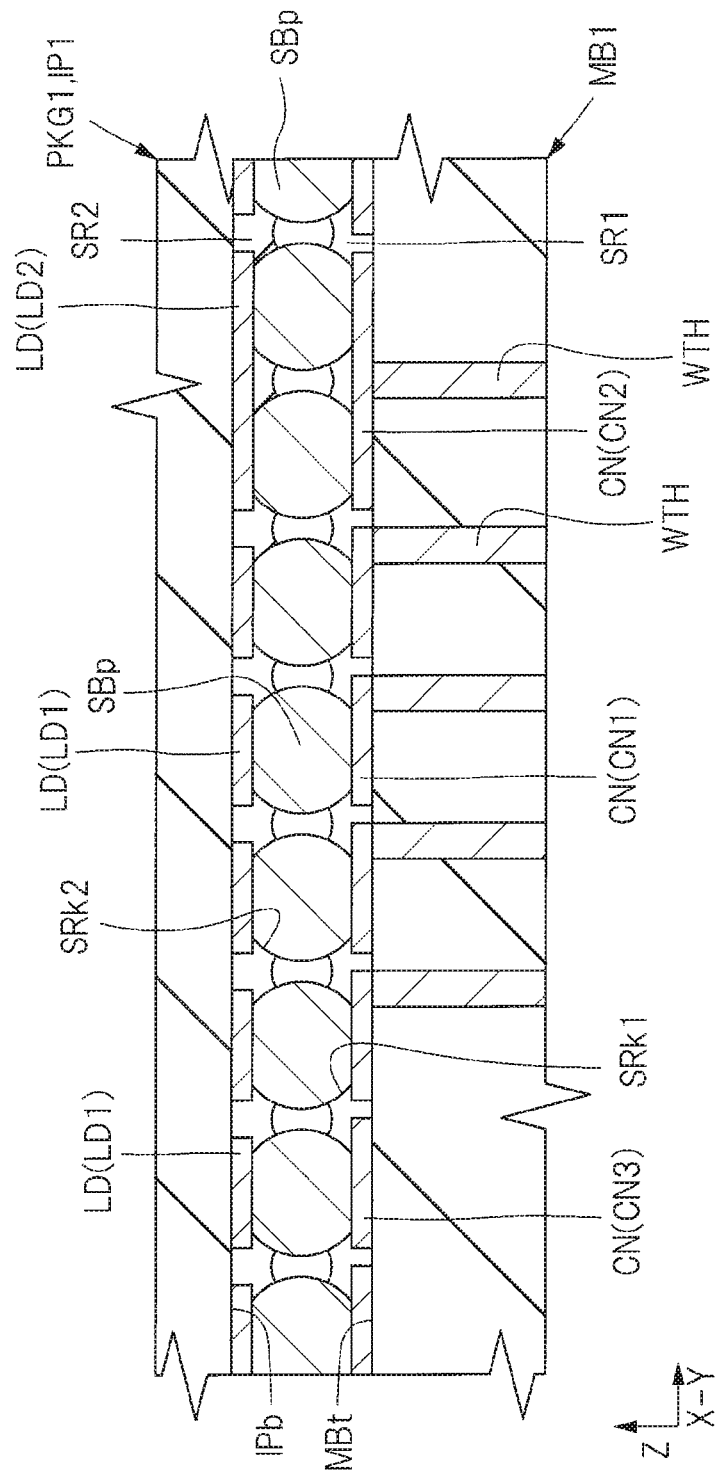
FIG. 5 is an enlarged cross-sectional view enlarging a periphery of a plurality of terminals illustrated in FIG. 4.

First, an example of configuration of the electronic device according to the present embodiment will be explained. FIG. 1 is an enlarged plan view illustrating an example of configuration of the electronic device according to the present embodiment. FIG. 2 is an explanatory diagram illustrating an electric connection relation of components included in the electronic device in a cross section taken along a line A-A of FIG. 1. FIG. 3 is an enlarged plan view illustrating an example of a wiring layout in a plan view of the motherboard illustrated in FIG. 1. FIG. 4 is an enlarged plan view illustrating an example of a terminal layout in a plan view of the motherboard illustrated in FIG. 1. FIG. 5 is an enlarged cross-sectional view enlarging a periphery of a plurality of terminals illustrated in FIG. 4.

Note that, while FIG. 2 is a cross-sectional view, hatching is omitted and the plurality of wirings WM are indicated by any of a solid line, a two-dot chain line, and a dotted line in order to easily see an example of an electric connection relation of components of an electronic device EDV1. In a cross section taken along a line A-A of FIG. 1, a power supply line WVH1 and a power supply line WVH2 which supply power supply potentials to a logic chip LC do not overlap in the thickness direction in the vicinity of a power supply device RGL1. However, in order to explicitly indicate that each of the power supply line WVH1 and the power supply line WVH2 is electrically connected to the logic chip LC and the power supply device RGL1, FIG. 2 illustrates a part of the power supply line WVH2 (a part thereof not overlapping with the power supply line WVH1) in the vicinity of the power supply device RGL1 by a two-dot chain line. A signal line WSG which is one of a plurality of wirings WM connected to the logic chip LC and which transmits an electric signal is indicated with a dotted line. A memory chip MC is not mounted in the cross section taken along the line A-A illustrated in FIG. 1. However, in order to explicitly indicate that the logic chip LC and the memory chip MC are electrically connected, FIG. 2 schematically illustrates the memory chip MC by an alternate long and short dash line.

The power supply line WVH1, the power supply line WVH2, the power supply line WVQ1, and the power supply line WVQ2 illustrated in FIG. 3 are formed in the wiring layer of the wiring substrate MB1 which is the multi-layer wiring substrate. However, in order to easily see the wiring layout, FIG. 3 illustrates each of the power supply line WVH1, the power supply line WVH2, the power supply line WVQ1, and the power supply line WVQ2 by a solid line. In order to easily understand how the power supply line WVH1 and the power supply line WVH2 overlap each other, a pattern is attached to the power supply line WVH1. From an upper surface MBt of the wiring substrate MB1 illustrated in FIG. 3, a plurality of terminals CN illustrated in FIG. 4 are exposed at the position at which the semiconductor device PKG1 is mounted. However, in order to easily see the wiring layout, most of the plurality of terminals CN are not illustrated in FIG. 3, and FIG. 3 illustrates some of the plurality of terminals CNSG connected to the signal line WSG as a representative example. Although the wiring substrate MB1 has many signal lines WSG, some of many signal lines WSG are illustrated by dotted lines in order to easily see the drawing. In order to show the planar positional relation between each component of the semiconductor device PKG1 illustrated in FIG. 1 and the wirings, a contour of each of the wiring substrate IP1, the logic chip LC, the memory chip MC, and the power supply device RGL1 is illustrated by a two-dot chain line.

FIG. 4 illustrates the power supply line WVH1, the power supply line WVH2, the power supply line WVQ1, and the power supply line WVQ2 by dotted lines. FIG. 4 is a plan view so that the plurality of terminals CN are illustrated with different patterns in accordance with the types of the currents flowing therein and so that the meaning represented by the pattern is illustrated with a reference symbol next to a legend.

The electronic device (electronic equipment) EDV1 illustrated in FIG. 1 includes the wiring substrate (motherboard, mounting substrate) MB1, the semiconductor device PKG1 mounted on the wiring substrate MB1, and the power supply device (regulator) RGL1 mounted on the wiring substrate MB1. Not only the semiconductor device PKG1 and the power supply device RGL1 but also a plurality of electronic components such as the capacitor CC1 (see FIG. 2) and others are mounted on the wiring substrate MB1.

The power supply device RGL1 mounted on the wiring substrate MB1 is a power supply component for supplying power to each of the plurality of electronic components included in the electronic device EDV1. The power supply device RGL1 includes, for example, a power conversion circuit which converts the power, that is input from the not-illustrated external power supply provided outside the electronic device EDV1, into voltage values and current values corresponding to the operation voltages and the operation currents of various circuits included in the electronic device EDV1. The power converted by the power supply device RGL1 is supplied to each of the plurality of circuits included in the electronic device EDV1 (circuits included in an electronic component not illustrated) through a wiring WM of the wiring substrate MB1.

The wiring substrate MB1 included in the electronic device EDV1 has an upper surface (surface, semiconductor device mounting surface) MBt which is the mounting surface of the semiconductor device PKG1 and a lower surface (surface, back surface) MBb (see FIG. 2) opposite to the upper surface MBt. The wiring substrate MB1 is a substrate which is mounted with the plurality of electronic components including the semiconductor device PKG1 and to which they are electrically connected so as to configure a module, and is required to have a strength to support the plurality of electronic components. Therefore, the thickness of the wiring substrate MB1 is larger (thicker) than the thickness of the wiring substrate IP1 of the semiconductor device PKG1.

For example, in the example illustrated in FIG. 2, the thickness of the wiring substrate MB1 is 1.4 mm. On the other hand, the thickness of the wiring substrate IP1 is thinner than the thickness of the wiring substrate MB1 and is 1.2 mm. Note that the thickness of each board is not limited to the above-described value, and that a wiring substrate MB1 having a thickness of, for example, about 1.0 mm to 2.0 mm, and a wiring substrate IP1 having a thickness of, for example, about 0.2 mm to 1.5 mm may be used. The thickness of the wiring substrate MB1 is a distance from one surface to the other surface of the upper surface MBt and the lower surface MBb. The thickness of the wiring substrate IP1 is a distance from one surface of the upper surface IPt and the lower surface IPb to the other surface.

The wiring substrate MB1 has a base member made of an insulating material such as a prepreg material obtained by impregnating glass cloth with an epoxy resin. In the example illustrated in FIG. 2, the wiring substrate MB1 is a multi-layer wiring substrate (laminated board) formed by alternately stacking a plurality of insulating layers made of prepreg and a plurality of wiring layers made of a conductive film such as a copper foil. Note that the wiring substrate IP1 may also have a base material (core material) made of prepreg, but the wiring substrate MB1 requires a base material relatively thicker than the base material included in the wiring substrate IP1. As described above, in the present embodiment, prepreg is used as the insulating layer configuring the wiring substrates MB1, IP1, and therefore, the strength of the wiring substrate can be improved. When the thickness of the wiring substrate is large, i.e., when the thickness of each insulating layer is large, note that the insulating layer may be made of not prepreg but an insulating material made of only an epoxy-based resin.

As illustrated in FIG. 2, the wiring substrate MB1 has a plurality of wirings (mounting board wirings, motherboard wirings) WM. The wiring substrate MB1 is a multi-layer wiring substrate having a plurality of wiring layers, and the wiring WM is formed in each of the plurality of wiring layers. In the example as illustrated in FIG. 2, the wiring substrate MB1 includes six-layered wiring layers made of a wiring layer MBL1, a wiring layer MBL2, a wiring layer MBL3, a wiring layer MBL4, a wiring layer MBL5, and a wiring layer MBL6, which are arranged along the thickness direction (Z direction) from the upper surface MBt to the lower surface MBb.

The plurality of wirings WM include the power supply line WVH1 and the power supply line WVH2 supplying the power supply potential to the logic chip (semiconductor chip) LC of the plurality of semiconductor chips included in the semiconductor device PKG1. Although not illustrated in FIG. 2, the plurality of wirings WM include the power supply line WVQ1 (see FIG. 3) and the power supply line WVQ2 (see FIG. 3) supplying the power supply potential to the memory chip (semiconductor chip) MC. The plurality of wirings WM include a signal line WSG transmitting or receiving electric signals to and from the logic chip LC. Note that, while a large number of signal lines WSG are formed in the wiring substrate MB1, FIG. 3 exemplifies two of the large number of signal lines WSG in order to easily see the drawing.

In the example as illustrated in FIG. 2, the wiring layer MBL1 which is the first layer of the plurality of wiring layers included in the wiring substrate MB1, the first layer being arranged to be the closest to the upper surface MBt, is mainly provided with the signal line WSG for transmitting the electric signals. The wiring layer MBL2 which is the second layer being arranged to be the second closest to the upper surface MBt is mainly provided with a reference potential line WVS for supplying a reference potential (such as a ground potential) . The wiring layer MBL3 which is the third layer being arranged to the third closest to the upper surface MBt is mainly provided with a power supply line WVH for supplying a power supply potential. The wiring layer MBL4 which is the fourth layer being arranged to the fourth closest to the upper surface MBt is mainly provided with a power supply line WVH1 for supplying a power supply potential. The wiring layer MBL5 which is the fifth layer being arranged to the fifth closest to the upper surface MBt is mainly provided with a reference potential line WVS for supplying a reference potential. The wiring layer MBL6 which is the sixth layer being arranged to the sixth closest to the upper surface MBt is mainly provided with a wiring for supplying a potential or an electrical signal to other components not illustrated.

Note that the power supply lines WVQ1 and WVQ2 illustrated in FIG. 3 are provided in the wiring layer MBL3 which is the third layer or the wiring layer MBL4 which is the fourth layer illustrated in FIG. 2. The reference potential line WVS of the wiring layer MBL2 and the reference potential line WVS of the wiring layer MBL5 are electrically connected to each other via a through hole wiring WTH penetrating through the wiring substrate MB1 in the thickness direction, and the same potential is supplied to these reference potential lines. The layout of the power supply line WVH1, the power supply line WVH2, the power supply line WVQ1, and the power supply line WVQ2 will be explained in details later.

As illustrated in FIG. 4, the wiring substrate MB1 includes the plurality of terminals CN formed on the side of the upper surface MBt. The plurality of terminals CN are mounting terminals electrically connecting the semiconductor device PKG1 and the wiring substrate MB1. The plurality of terminals CN include a terminal CNVH1 and a terminal CNVH2 for supplying the power supply potential to the logic chip (semiconductor chip) LC and a terminal CNVQ1 and a terminal CNVQ2 for supplying the power supply potential to the memory chip (semiconductor chip) MC, which are of the plurality of semiconductor chips included in the semiconductor device PKG1. The plurality of terminals CN include a terminal CNSG for transmitting or receiving the electric signals to and from the logic chip LC. The plurality of terminals CN include a terminal CNVS supplying the reference potential to the logic chip LC and the memory chip MC. The plurality of terminals CN include terminals used for the purposes other than the above-described purposes. However, FIG. 4 illustrates the terminals CN other than the above-described terminals without any pattern as similar to the terminal CNVS.

The plurality of terminals CN are conductor patterns formed in the uppermost layer (the first layer) of the plurality of wiring layers included in the wiring substrate MB1. More specifically, the conductor pattern formed in the uppermost layer of the plurality of wiring layers included in the wiring substrate MB1 as illustrated in FIG. 5 is covered with an insulating film SR1 formed so as to cover the upper surface MBt of the wiring substrate MB1. A plurality of opening portions SRk1 are formed in the insulating film SR1, and a part of the conductor pattern formed in the uppermost layer is exposed from each of the plurality of opening portions SRk1.

The conductor pattern configuring the terminal CN is electrically isolated from the other terminals CN as seen in the terminal CN1 illustrated in FIG. 5, and includes an individual conductor pattern formed independently for each terminal CN. For example, in the case of the signal terminal CNSG that is electrically connected to the signal line WSG illustrated in FIG. 4, so that the number of terminal per unit area (more specifically, the number of signal transmission paths) can be increased by electrically isolating the terminal CNSG from an adjacent terminal CN. The terminal CNVH1, the terminal CNVH2, the terminal CNVQ1, the terminal CNVQ2, and the terminal CNVS illustrated in FIG. 4 can be formed independently.

However, the conductor patterns configuring the terminals CN may include a conductor pattern having a larger area than that of the terminal CN1 by integrally forming the adjacent terminals CN as seen in the terminal CN2 illustrated in FIG. 5. When such a conductor pattern having a large area is used as a part of the terminal CN, a plurality of opening portions SRk1 are provided on one conductor pattern. For example, when the area of the conductor pattern configuring the supply path of the power supply potential and the reference potential, the resistance in the supply path can be reduced. As a result of reducing the resistance of the supply path of the power supply potential and the reference potential, the circuit operation can be stabilized.

As illustrated in FIG. 5, some of the plurality of terminals CN are connected to through-holes WTH penetrating through the wiring substrate MB1 in the thickness direction. When the terminal CN is connected to the through hole WTH as described above, it is necessary to connect the through hole WTH to the individual terminal CN as seen in the terminal CN1. On the other hand, the number of through holes WTH can be reduced when to plurality of terminals CN are integrally formed as seen in the terminal CN2, the degree of flexibility of the wiring layout is improved.

The conductor patterns configuring the terminals CN may include a terminal CN which is not connected to the through hole WTH as seen in the terminal CN3 illustrated in FIG. 5. In this case, the uppermost wiring layer of the plurality of wiring layers included in the wiring substrate MB1 may be used to lead the wiring. For example, in particularly, a signal line of the plurality of signal lines WSG illustrated in FIG. 3, the signal line (for example, an analog signal path or others) being expected to improve its electric characteristics by reducing the transmission path, is preferably not connected to the through hole wiring WTH, as seen in the terminal CN3 illustrated in FIG. 5.

<Overview of Semiconductor Device>

Figure 6:
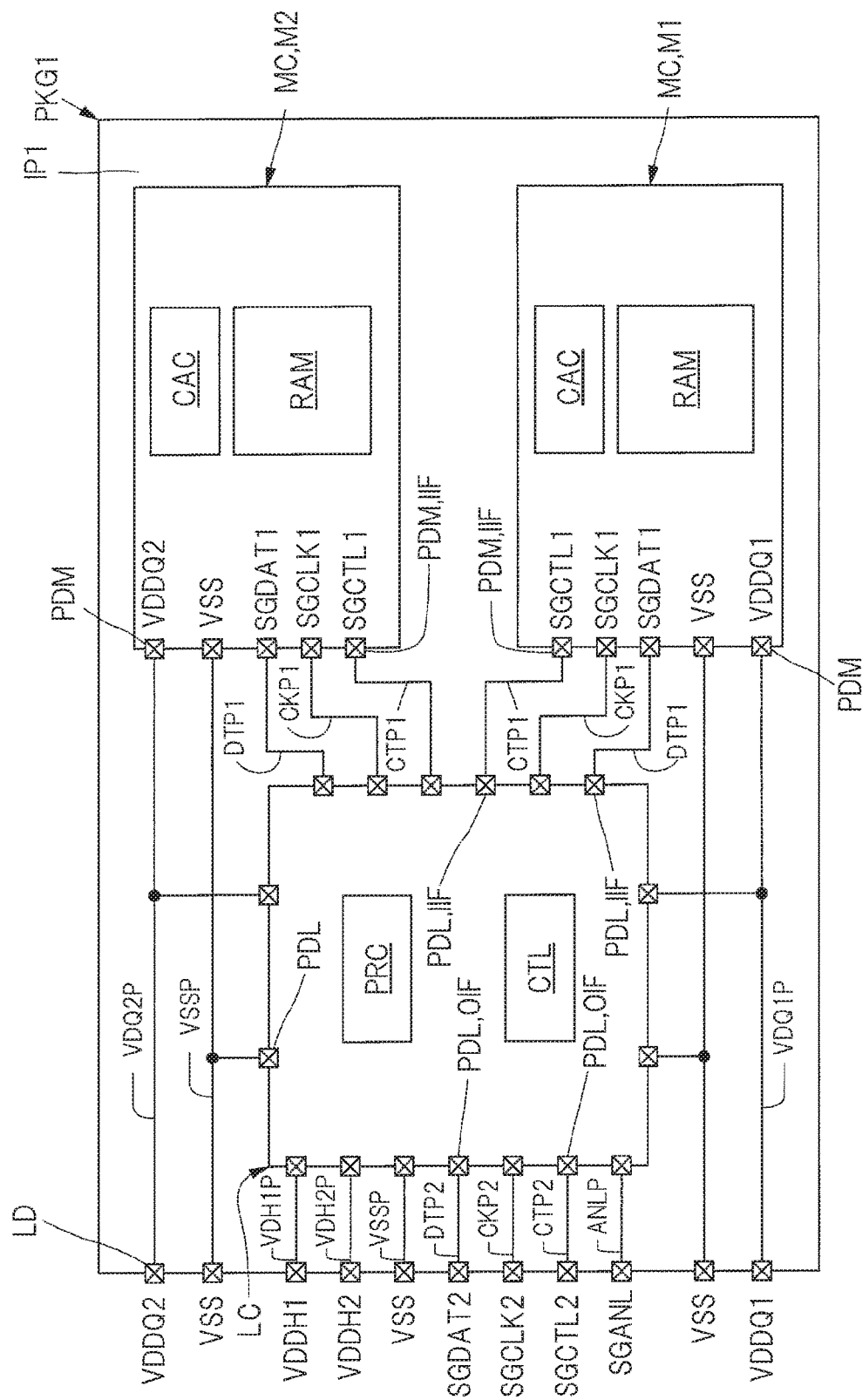
FIG. 6 is an explanatory diagram illustrating an overview of a configuration of a plurality of transmission paths electrically connected to a plurality of semiconductor chips included in the semiconductor device illustrated in FIG. 1.

As illustrated in FIG. 1 and FIG. 2, the electronic device EDV1 according to the present embodiment has the semiconductor device PKG1 mounted on the upper surface MBt of the wiring substrate MB1. Hereinafter, the detailed configuration of the semiconductor device PKG1 will be explained. In this section, an example of circuit configuration of the semiconductor device PKG1 will be explained first, and then, the structure of the semiconductor device PKG1 will be explained. FIG. 6 is an explanatory diagram illustrating an overview of a configuration of a plurality of transmission paths electrically connected to a plurality of semiconductor chips included in the semiconductor device illustrated in FIG. 1.

Note that FIG. 6 illustrates a control circuit CTL controlling the memory chip MC and an arithmetic processing circuit PRC performing arithmetic processing of, for example, an image display system or others as a representative example of a plurality of circuits included the logic chip LC. FIG. 6 illustrates an input/output circuit CAC performing input and output operation of a data signal and a memory circuit RAM storing a data signal as a representative of a plurality of circuits included in the memory chip MC.

As illustrated in FIG. 1 and FIG. 6, the semiconductor device PKG1 according to the present embodiment includes the wiring substrate IP1 and the plurality of semiconductor chips mounted on the upper surface IPt of the wiring substrate IP1. In the example illustrated in FIG. 1 and FIG. 6, the plurality of semiconductor chips include two memory chips MC (memory chips M1, M2) formed with storage circuits (memory circuits) and the logic chip LC having the control circuit for controlling operation of each of the two memory chips MC. Note that the number of the plurality of semiconductor chips is not limited to the above-described number, and various modifications of the number can be applied. In particular, for the number of memory chips MC, a required storage capacity depends on the system provided in the semiconductor device PKG1. The value of the storage capacity increases in proportional to the number of memory chips MC, and therefore, the number of memory chips MC may be, for example, two or more, or may be one. A plurality of logic chips LC may be mounted on the upper surface IPt. Further, a semiconductor chip having a function other than the logic chip LC and the memory chip MC may be mounted.

Each of the plurality of memory chips MC illustrated in FIG. 6 includes a storage circuit (hereinafter, referred to as a memory circuit RAM) called DRAM (Dynamic Random Access Memory) and an input/output circuit CAC performing input and output operation of a data signal to and from the memory circuit RAM. The logic chip LC electrically connected to each of the plurality of memory chips MC includes the control circuit CTL controlling operation of the memory circuit RAM of the memory chip MC and the arithmetic processing circuit PRC performing arithmetic processing on the data signal.

Each of the plurality of memory chips MC includes a power supply potential supply path VDQ1P supplying a power supply potential VDDQ1 for driving the input/output circuit CAC (or a power supply potential supply path VDQ2P supplying a power supply potential VDDQ2) and a reference potential supply path VSSP supplying a reference potential VSS. FIG. 6 illustrates the power supply potential VDDQ1 for the memory chip M1 and the power supply potential VDDQ2 for the memory chip M2 so as to be distinguished from each other. However, the power supply potential VDDQ1 and the power supply potential VDDQ2 are the same potential. For example, each of the power supply potential VDDQ1 and the power supply potential VDDQ2 is about 1.1 V, and a current of about 4 A flows in each of the power supply potential VDDQ1 and the power supply potential VDDQ2. The reference potential VSS is a potential having a value different from the power supply potential such as a ground potential (GND potential).

Each of the power supply potential supply paths VDQ1P, VDQ2P, and the reference potential supply path VSSP is connected to a terminal (land) LD which is an external terminal included in the wiring substrate IP1. Each of the power supply potential supply paths VDQ1P, VDQ2P, and the reference potential supply path VSSP is branched at the wiring substrate IP1 and is connected to an electrode PDL of the logic chip LC.

Each of the plurality of memory chips MC includes a plurality of signal transmission paths SGP1 (see FIG. 2) transmitting electric signals. The plurality of signal transmission paths SGP1 include a data signal transmission path DTP1 transmitting a data signal SGDAT1, a clock signal transmission path CKP1 transmitting a clock signal SGCLK1 for synchronizing operation timing, and a control signal transmission path CTP1 transmitting a control signal SGCTL1 controlling input and output operation. Each of the data signal transmission path DTP1, the clock signal transmission path CKP1, and the control signal transmission path CTP1 connects an electrode PDL of the logic chip LC and an electrode PDM of the memory chip MC.

As paths for supplying the power supply potential to the memory chip MC, note that FIG. 6 illustrates the power supply potential supply path VDQ1P supplying the power supply potential VDDQ1 driving the input/output circuit CAC, the power supply potential supply path VDQ2P supplying the power supply potential VDDQ2, and the reference potential supply path VSSP supplying the reference potential VSS. However, the paths may include not only the above-described paths but also a supply path of a power supply potential for a core circuit for driving a main circuit (core circuit) such as a power supply control circuit and a clock oscillation circuit not illustrated, or a supply path of another reference potential.

FIG. 6 illustrates an example in which the data signal transmission path DTP1, the clock signal transmission path CKP1, and the control signal transmission path CTP1 are connected to the plurality of memory chips MC, respectively. However, the plurality of data signal transmission paths DTP1, the plurality of clock signal transmission paths CKP1, and the plurality of control signal transmission paths CTP1 are connected to the memory chip MC.

For example, the data signal transmission paths the number of which is in accordance with the number of channels included in the memory circuit RAM and the width of the data bus of each channel are connected to the memory chip MC. For example, when each of the memory chips MC has four channels having 8-bit bus width, data signal transmission paths DTP1 for 64 bits are connected. The number of data signal transmission paths DTP1 increases in consideration of not only the data signal SGDAT1 but also a data strobe signal and a data mask signal not illustrated.

The signal currents transmitted through the clock signal transmission path CKP1 illustrated in FIG. 6 include not only the clock signal SGCLK1 which is a timing signal but also a clock enable signal controlling to enable the clock signal SGCLK1.

The control signal SGCTL1 illustrated in FIG. 6 includes command-type system signals such as a chip select signal, a row address strobe signal, a column address strobe signal and a write enable signal, and address-designation-type system signals such as an address signal and a bank address signal. Therefore, the control signal transmission paths CTP1 the number of which is in accordance with the number of types of control signals SGCTL1 are connected to each of the plurality of memory chips MC.

The logic chip LC includes a power supply potential supply path VDH1P supplying a power supply potential VDDH1 for driving the arithmetic processing circuit PRC, a power supply potential supply path VDH2P supplying a power supply potential VDDH2 for driving the control circuit CTL, and a reference potential supply path VSSP supplying the reference potential VSS. When the arithmetic processing circuit PRC and the control circuit CTL are driven with the same driving voltage as each other, the power supply potential VDDH1 and the power supply potential VDDH2 can be commonly used. However, when the arithmetic processing circuit PRC and the control circuit CTL are driven with different driving voltages from each other, it is necessary to provide a power supply potential supply path in accordance with the values of the driving voltages. As the reference potential VSS, note that the same potential (for example, ground potential) is supplied to the arithmetic processing circuit PRC and the control circuit CTL.

As similar to the present embodiment, when a plurality of systems are constructed inside one semiconductor device PKG1, the consumed power amount depends on the type of the system. For example, a relatively large amount of the power is consumed in order to drive the arithmetic processing circuit PRC performing arithmetic processing for forming graphics and moving images, and others.

For example, in the example as illustrated in FIG. 6, a current of about 12 A at maximum flows through the power supply potential supply path VDH1P for the arithmetic processing circuit PRC supplying the power supply potential VDDH1 of 0.85 V (Volt). On the other hand, the power consumption amount of the control circuit CTL which controls the input and output operation is smaller than the power consumption amount of the arithmetic processing circuit PRC, and the current value flowing through the power supply potential supply path VDH2P for the control circuit CTL is relatively small. However, as the semiconductor device PKG1 is sophisticated, a large number of control circuits CTL are operated at the same time in some cases. Therefore, the value of the current flowing through the power supply potential supply path VDH2P is also large when it is evaluated as the maximum value. For example, in the example illustrated in FIG. 6, a current of about 10 A at the maximum flows through the power supply potential supply path VDH2P for the control circuit CTL supplying the power supply potential VDDH2 of 0.80 V (Volt).

As described above, in the present embodiment, the value of the current flowing through the power supply potential supply path VDH1P for the arithmetic processing circuit PRC is larger than the value of the current flowing through the power supply potential supply path VDH2P for the control circuit CTL. In a modification example of the present embodiment, the power supply potential VDDH1 supplied to drive the arithmetic processing circuit PRC and the power supply potential VDDH2 supplied to drive the control circuit CTL are the same as each other in some cases. However, even when the power supply potential VDDH1 and the power supply potential VDDH2 are the same as each other, the value of the current flowing through the power supply potential supply path VDH1P is larger than the value of the current flowing through the power supply potential supply path VDH2P.

Note that the value of the current changes in accordance with the operation of the loading-side circuit, i.e. the circuit consuming the power. Therefore, in design, the maximum value of the current is evaluated in an assumption of a case in which the power consumption amount of the loading-side circuit is the largest.

In the conductor path such as the power supply potential supply path VDH1P and the power supply potential supply path VDH2P in which a large current flows, the power consumption can be reduced if the values of the power supply potential VDDH1 and the power supply potential VDDH2 are small. If the power consumption is reduced, the operation can be stabilized since the heat generation in the conductor path is suppressed. Therefore, in the present embodiment, the values of the power supply potential VDDH1 and the power supply potential VDDH2 are smaller than the values of the power supply potential VDDQ1 and the power supply potential VDDQ2.

Each of the power supply potential supply path VDH1P, the power supply potential supply path VDH2P, and the reference potential supply path VSSP is connected to the terminal LD which is the external terminal of the wiring substrate IP1.

The logic chip LC includes the plurality of signal transmission paths SGP1 (see FIG. 2) transmitting electric signals. The plurality of signal transmission paths SGP1 include the data signal transmission path DTP1 transmitting the data signal SGDAT1 to and from the memory chip MC, the clock signal transmission path CKP1 transmitting the clock signal SGCLK1 for synchronizing operation timing, and the control signal transmission path CTP1 transmitting the control signal SGCTL1 controlling input and output operation. The plurality of signal transmission paths include a data signal transmission path DTP2 transmitting a data signal SGDAT2 to and from external equipment of the semiconductor device PKG1, a clock signal transmission path CKP2 transmitting a clock signal SGCLK2 for synchronizing operation timing, and a control signal transmission path CTP2 transmitting a control signal SGCTL2 controlling input and output operation. In the present embodiment, the plurality of signal transmission paths SGP2 include an analog signal transmission path ANLP for inputting an analog signal SGANL into the logic chip LC.

Note that electrodes PDL each serving as a signal transmission path of the plurality of electrodes PDL included in the logic chip LC includes an internal interface electrode (interface terminal) IIF transmitting the clock signal SGCLK1, the control signal SGCTL1, and the data signal SGDAT1 to and from the memory chip MC. Also, the electrodes PDL each serving as a signal transmission path includes an external interface electrode (interface terminal) OIF transmitting the clock signal SGCLK2, the control signal SGCTL2, and the data signal SGDAT2 to and from external equipment of the semiconductor device PKG1.

The data signal SGDAT2 transmitted between the logic chip LC and the terminal LD of the wiring substrate IP1 and the data signal SGDAT1 transmitted between the logic chip LC and the memory chip MC may be different data signals from each other. Because of the arithmetic processing performed by the arithmetic processing circuit PRC of the logic chip LC, the input signal and the output signal are different from each other before and after the processing.

The control signal SGCTL2 transmitted between the logic chip LC and the terminal LD of the wiring substrate IP1 includes a signal and others for controlling the control circuit CTL and the arithmetic processing circuit PRC. Therefore, the control signal SGCTL2 transmitted between the logic chip LC and the terminal LD of the wiring substrate IP1 and the control signal SGCTL1 transmitted between the logic chip LC and the memory chip MC are different from each other.

The clock signal SGCLK2 transmitted between the logic chip LC and the terminal LD of the wiring substrate IP1 may include not only a timing signal for the control circuit CTL but also a timing signal for the arithmetic processing circuit PRC. Therefore, the clock signal SGCLK2 transmitted between the logic chip LC and the terminal LD of the wiring substrate IP1 and the clock signal SGCLK1 transmitted between the logic chip LC and the memory chip MC may be different from each other.

As described above, the input of the data signal SGDAT1 to the memory circuit RAM and the output of the data signal SGDAT1 from the memory circuit RAM are performed via the logic chip LC. Therefore, most of the signal transmission paths (see FIG. 2) connected to the memory chip MC are electrically connected to the terminals LD of the wiring substrate IP1 via the logic chip LC, and there is almost no signal transmission path electrically connected with the terminal LD of the wiring substrate IP1 without through the logic chip LC.

In other words, the electrode PDL configuring the signal transmission path of the logic chip LC includes the plurality of external interface electrodes OIF and the plurality of internal interface electrodes IIF. On the other hand, most of the electrodes PDM configuring the signal transmission paths of the memory chip MC are the internal interface electrodes IIF transmitting signals to and from the logic chip LC, and there are no or few external interface electrodes OIF.

In the example as illustrated in FIG. 6, all the signal transmission paths connected to the memory chip MC are electrically connected to the logic chip LC. In other words, in the example illustrated in FIG. 6, the external interface electrode OIF of the memory chip MC does not exist. However, as a modification example of FIG. 6, a signal transmission path other than the signal transmission path illustrated in FIG. 6 may be electrically connected to the terminal LD of the wiring substrate IP1 without through the logic chip LC.

Although not illustrated, for example, a test signal transmission path and others for individually testing the memory chip MC after the assembly of the semiconductor device PKG1 may be electrically connected to the terminal LD of the wiring substrate IP1 without through the logic chip LC.

In other words, in the modification example of FIG. 6, the plurality of terminals LD of the wiring substrate IP1 includes a signal terminal electrically connected to the memory chip MC without going through the logic chip LC and a plurality of signal terminals electrically connected to the memory chip MC through the logic chip LC.

In the above-described case, the input and output operation of the memory circuit RAM is controlled through the control circuit CTL. Therefore, even if there is a signal transmission path electrically connected with the terminal LD of the wiring substrate IP1 without through the logic chip LC, the number of the signal transmission paths is small. That is, the number of signal terminals electrically connected to the memory chip MC via the logic chip LC is larger than the number of signal terminals electrically connected to the memory chip MC without through the logic chip LC.

Note that the term "the number of signal terminals that are electrically connected to the memory chip MC without through the logic chip LC" as described above also includes a case in which the number of signal terminals that are electrically connected to the memory chip MC without through the logic chip LC is zero as illustrated in the example of FIG. 6.

<Structure of Semiconductor Device>

Figure 7:
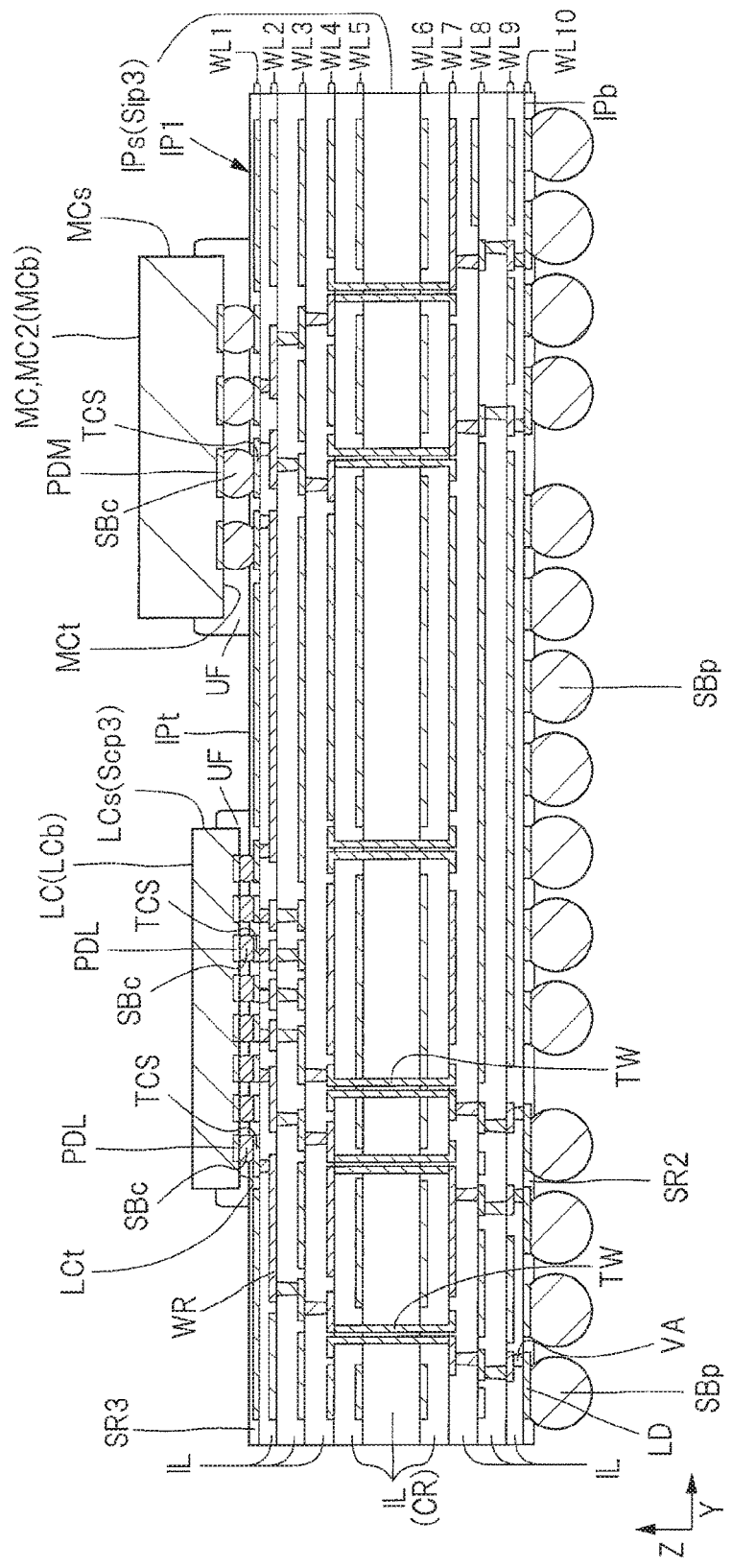
FIG. 7 is a cross-sectional view taken along a line B-B of the semiconductor device illustrated in FIG. 1.
Figure 8:
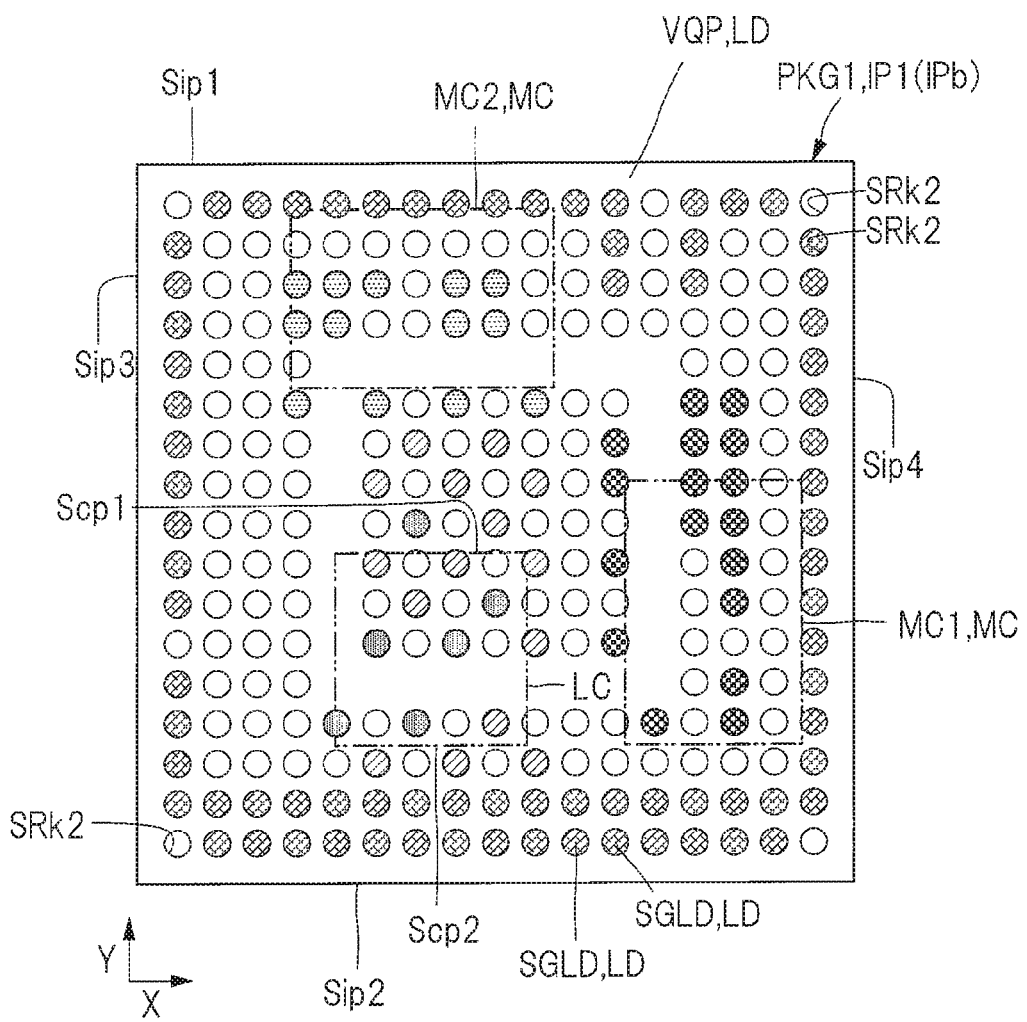
FIG. 8 is a plan view illustrating a structure of a lower surface side of the semiconductor device illustrated in FIG. 1.
Figure 9:
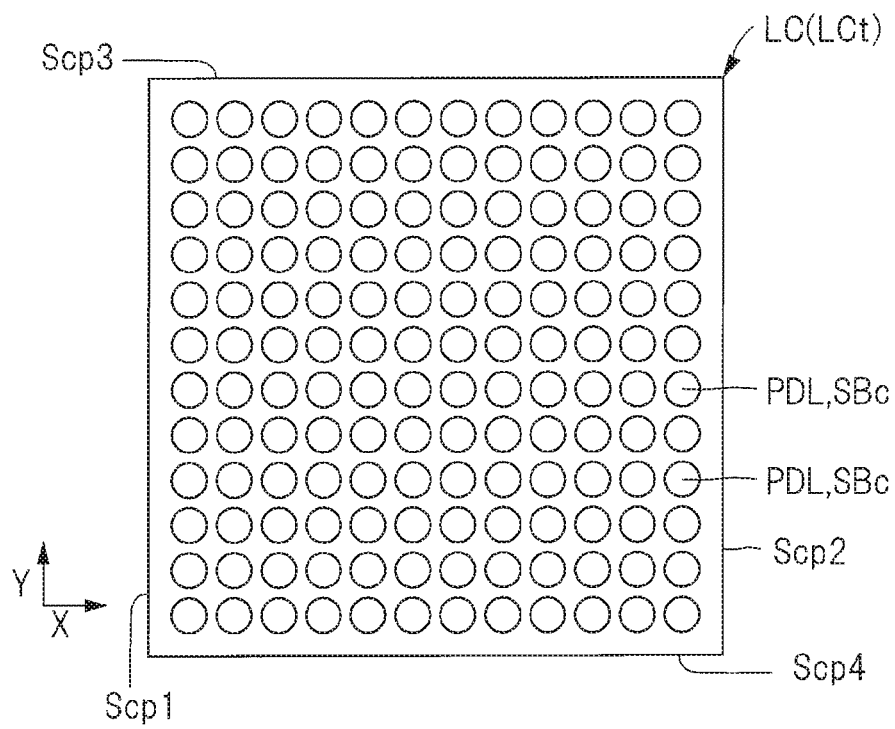
FIG. 9 is a plan view illustrating a front surface side of a logic chip illustrated in FIG. 1.
Figure 10:
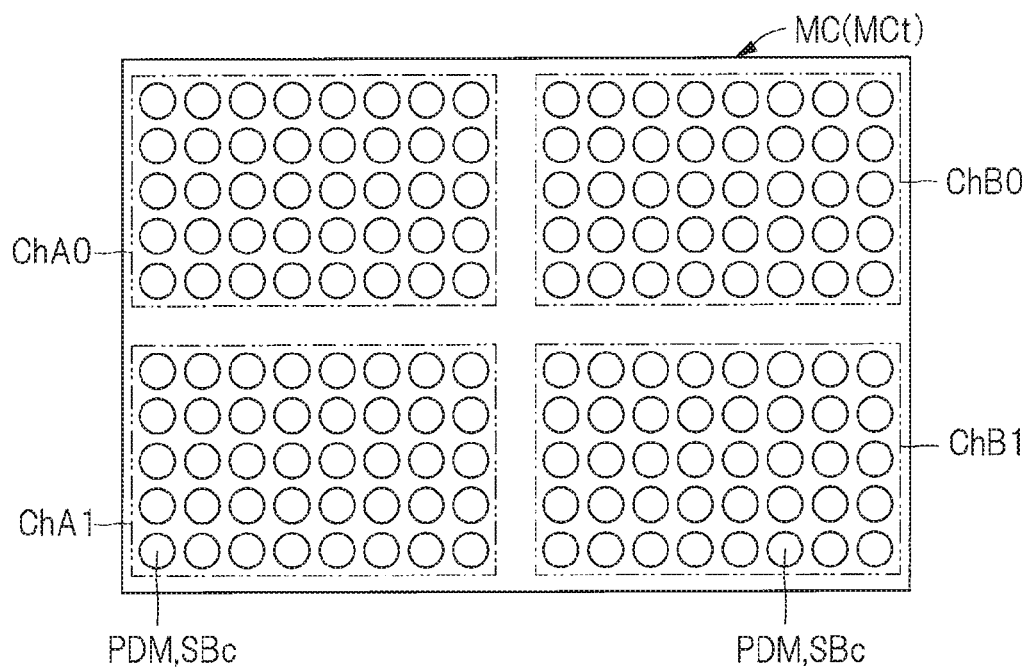
FIG. 10 is a plan view illustrating a front surface side of a memory chip illustrated in FIG. 1.

Subsequently, the structure of the semiconductor device PKG1 will be explained. FIG. 7 is a cross-sectional view taken along a line B-B of the semiconductor device illustrated in FIG. 1. FIG. 8 is a plan view illustrating a structure of a lower surface side of the semiconductor device illustrated in FIG. 1. FIG. 9 is a plan view illustrating a front surface side of the logic chip illustrated in FIG. 1. FIG. 10 is a plan view illustrating a front surface side of the memory chip illustrated in FIG. 1.

Although FIG. 7 is a cross-sectional view, note that hatching for the insulating layers IL, SR2, SR3, and an underfill resin UF are omitted in order to easily see the drawing.

As illustrated in FIG. 7, the wiring substrate IP1 includes the upper surface (surface, main surface, chip mounting surface) IPt on which the logic chip LC and the memory chip MC are mounted, a lower surface (surface, main surface, mounting surface) IPb opposite to the upper surface IPt, and a plurality of side surfaces IPs arranged between the upper surface IPt and the lower surface IPb, and has a rectangular outer shape as illustrated in FIG. 1. In the example illustrated in FIG. 1, as a planar size of the wiring substrate IP1 (a dimension in a plan view, dimensions of the upper surface IPt and the lower surface IPb, an outer size), a rectangle whose one side length is, for example, about 30 mm to 100 mm is formed.

As illustrated in FIG. 1, in a plan view, the peripheral portion of the wiring substrate IP1 includes a wiring substrate side Sip1, a wiring substrate side Sip2 opposite to the wiring substrate side Sip1, a wiring substrate side Sip3 crossing the wiring substrate side Sip1 and the wiring substrate side Sip2, and a wiring substrate side Sip4 opposite to the wiring substrate side Sip3. In the example illustrated in FIG. 1, the wiring substrate side Sip1 and the wiring substrate side Sip2 extend along the Y direction. The wiring substrate side Sip3 and the wiring substrate side Sip4 extend along the X direction orthogonal to the Y direction. In the example illustrated in FIG. 1, the semiconductor device PKG1 is mounted on the wiring substrate MB1 so that a part of the wiring substrate side Sip3 of the four sides of the wiring substrate IP1 faces the power supply device RGL1.

The wiring substrate IP1 is an interposer (relay wiring substrate) electrically connecting the plurality of semiconductor chips including the logic chip LC mounted on the upper surface IPt and the wiring substrate MB1 which is the motherboard (mounting board) illustrated in FIG. 1. The wiring substrate IP1 is an interposer electrically connecting the logic chip LC mounted on the upper surface IPt and the plurality of memory chips MC.

As illustrated in FIG. 7, the wiring substrate IP1 includes a plurality of wiring layers (10 layers in the example illustrated in FIG. 7) WL1, WL2, WL3, WL4, WL5, WL6, WL7, WL8, WL9, WL10 electrically connecting the upper surface IPt which is the chip mounting surface, and the lower surface IPb which is the mounting surface. A conductor pattern such as a wiring which is a path for supplying an electric signal and power is formed in each wiring layer, and each wiring layer is covered with the insulating layer IL.

Most part of the wiring layer WL1 of the plurality of wiring layers, the wiring layer WL1 being arranged closest to the upper surface IPt, is covered with an insulating film SR3 which is a solder resist film. Most part of the wiring layer WL10 of the plurality of wiring layers, the wiring layer WL10 being arranged closest to the lower surface IPb, is covered with an insulating film SR2 which is a solder resist film.

The wiring substrate IP1 is formed by, for example, through a build-up method, laminating each of a plurality of layers on an upper surface and a lower surface of a core layer (core material, core insulating layer) CR made of a prepreg material obtained by impregnating glass fiber with resin. In the example as illustrated in FIG. 7, the core layer CR has a structure in which three insulating layers IL are laminated, and the insulating layer between the layer WL4 and the layer WL7 serves as the core layer CR. The wiring layer WL4 relatively close to the uppermost surface and the wiring layer WL7 relatively close to the lowermost surface of the core layer CR are electrically connected to each other through a plurality of through hole wirings TW embedded in the plurality of through holes (through holes) provided to penetrate from one of the upper surface and the lower surface of the core layer CR to the other of the upper surface and the lower surface of the core layer CR.

As illustrated in FIG. 7, in the upper surface IPt of the wiring substrate IP1, a plurality of bonding pads (bonding leads, semiconductor chip connection terminals) TCS electrically connected to the logic chip LC or the memory chip MC are formed.

In the lower surface IPb of the wiring substrate IP1, the plurality of terminals (lands, external connection terminals) LD which are external input and output terminals of the semiconductor device PKG1 are formed. The plurality of bonding pads TCS and the plurality of terminals LD are electrically connected to each other through the wiring WR, the via VA, and the through hole wiring TW formed in the wiring substrate IP1.

In the example as illustrated in FIG. 7, note that the wiring substrate IP1 indicates a wiring substrate obtained by laminating each of a plurality of wiring layers onto the upper surface side and the lower surface side of the core layer CR which is the core material. However, as a modification example of FIG. 7, a so-called core-less wiring substrate may be used, the core-less wiring substrate not having the core layer CR made of a hard material such as a prepreg material and being formed by sequentially laminating conductor patterns such as the insulating layer IL and the wiring WR. When the core-less wiring substrate is used, the through hole wiring TW is not formed, and the wiring layers are electrically connected to each other through the via VA. Although FIG. 7 exemplifies the wiring substrate IP1 having 10 wiring layers, for example, a wiring substrate having 11 or more layers or having 9 or less layers may be used as a modification example.

The plurality of terminals LD illustrated in FIG. 7 are conductor patterns formed in the lowermost layer (the wiring layer WL10 which is the tenth layer in the example as illustrated in FIG. 7) of the plurality of wiring layers included in the wiring substrate IP1. More specifically, as illustrated in FIG. 5, the conductor patterns formed in the lowermost layer are covered with the insulating film SR2 formed so as to cover the lower surface IPb of the wiring substrate IP1. A plurality of opening portions SRk2 are formed in the insulating film SR2, and a part of each of the conductor patterns formed in the wiring layer WL10 which is the lowermost layer is exposed from each of the plurality of opening portions SRk2.

The plurality of conductor patterns configuring the terminal LD illustrated in FIG. 7 include an individual conductor pattern that is electrically separated from other terminals LD and that is formed independently for each terminal LD as similar to the terminal LD1 illustrated in FIG. 5. However, as similar to the terminal LD2 illustrated in FIG. 5, the plurality of conductor patterns may include a conductor pattern that is integrally formed with an adjacent terminal LD and that has a larger area than that of another terminal LD1. When such a conductor pattern having a large area is used as a part of the terminal LD, a plurality of opening portions SRk2 are provided on one conductor pattern. For example, when the area of the conductor pattern configuring the supply path for the power supply potential and the reference potential is large, the resistance in the supply path can be reduced. As a result of reducing the resistance of the supply path of the power supply potential and the reference potential, the circuit operation can be stabilized.

In the example as illustrated in FIG. 7, a solder ball (solder material, external terminal, electrode, external electrode) SBp is connected to each of the plurality of terminals LD. The solder ball SBp is a conductive member electrically connecting the plurality of terminals CN (see FIG. 4) closer to the wiring substrate MB1 and the plurality of terminals LD when the semiconductor device PKG1 is mounted on the wiring substrate MB1 illustrated in FIG. 1. The solder ball SBp is made of, for example, a Sn-Pb solder material containing lead (Pb) or a solder material made of a so-called lead-free solder substantially not containing Pb. As examples of the lead-free solder, for example, only tin (Sn), tin-bismuth (Sn—Bi), tin-copper-silver (Sn—Cu—Ag), tin-copper (Sn—Cu), and others are cited. Here, the lead-free solder means a material having a content of lead (Pb) of 0.1 wt % or less, and this content is defined as a standard of RoHS (Restriction of Hazardous Substances) directive.

As illustrated in FIG. 8, the plurality of terminals LD are (orderly) arranged in a plurality of rows along the outer periphery of the lower surface IPb of the wiring substrate IP1. The plurality of solder balls SBp (see FIG. 7) joined with the plurality of terminals LD are also (orderly) arranged in a plurality of rows along the outer periphery of the lower surface IPb of the wiring substrate IP1. In other words, the plurality of terminals LD arranged on the lower surface IPb of the wiring substrate IP1 and the plurality of solder balls SBb connected to the plurality of terminals LD are arranged in a matrix form. The semiconductor device having a plurality of external terminals (solder balls SBp, terminals LD) in a plurality of rows arranged on the mounting surface side of the wiring substrate IP1 as described above is referred to as an area array type semiconductor device. In the area array type semiconductor device, a region of the mounting surface (lower surface IPb) of the wiring substrate IP1 can be effectively used as a space for arranging the external terminals, and therefore, the area array type semiconductor device is preferable in that the increase in the mounting area of the semiconductor device can be suppressed even when the number of external terminals increases. More specifically, a semiconductor device having a larger number of external terminals due to the device sophistication and high integration can be mounted in a space that is saved.

As illustrated in FIG. 1, the semiconductor device PKG1 includes the plurality of memory chips MC and the logic chip LC mounted on the wiring substrate IP1. The logic chip LC and the plurality of memory chips MC are mounted side by side on the wiring substrate IP1. In other words, the logic chip LC and the plurality of memory chips MC are not stacked, and do not have any portion overlapping with each other in a plan view.

In a plan view, the logic chip LC has a rectangular outer shape whose plane area is smaller than that of the wiring substrate IP1. More specifically, in a plan view, the peripheral edge portion of the logic chip LC includes a chip side Scp1, a chip side Scp2 opposite to the chip side Scp1, a chip side Scp3 crossing the chip side Scp1 and the chip side Scp2, and a chip side Scp4 opposite to the chip side Scp3. In the example illustrated in FIG. 1, the logic chip LC is mounted on the wiring substrate IP1 so that the chip side Scp1 and the wiring substrate side Sip1 extend side by side. More specifically, the logic chip LC is mounted on the wiring substrate IP1 so that the chip side Scp1 and the wiring substrate side Sip1 are arranged side by side, so that the chip side Scp2 and the wiring substrate side Sip2 are arranged side by side, so that the chip side Scp3 and the wiring substrate side Sip3 are arranged side by side, and so that the chip side Scp4 and the wiring substrate side Sip4 are arranged side by side.

In a plan view, each of the plurality of memory chips MC has a rectangular outer shape whose plane area is smaller than that of the wiring substrate IP1. In the example illustrated in FIG. 1, each of the plurality of memory chips MC has a rectangle shape . More specifically, as illustrated in FIG. 1, in a plan view, the peripheral edge portion of the memory chip MC includes a chip side Smc1, a chip side Smc2 opposite to the chip side Smc1, a chip side Smc3 crossing the chip side Smc1 and the chip side Smc2, and a chip side Smc4 opposite to the chip side Smc3. In the example illustrated in FIG. 1, each of the chip side Smc1 and the chip side Smc2 is a long side, and each of the chip side Smc3 and the chip side Smc4 is a short side.

In the example illustrated in FIG. 1, an area of each of the plurality of memory chips MC is larger than an area of the logic chip LC. The storage capacity of the memory chip MC increases in proportion to an area of a region where the memory circuit RAM (see FIG. 6) is formed. Therefore, by forming the area of each of the plurality of memory chips MC to be larger than the area of the logic chip LC, the storage capacity of the memory chip MC can be increased.

In the present embodiment, the memory chip M1 of the plurality of memory chips MC is mounted between the chip side Scp2 of the logic chip LC and the wiring substrate side Sip2 of the wiring substrate IP1. The memory chip M2 of the plurality of memory chips MC is mounted between the chip side Scp3 of the logic chip LC and the wiring substrate side Sip3 of the wiring substrate IP1. As described above, by mounting the memory chip M1 and the memory chip M2 so as to face each of the chip side Scp2 and the chip side Scp3 of the four sides included in the logic chip LC, a space for arranging wirings electrically connecting the memory chip MC and the logic chip LC can be widely ensured.

As illustrated in FIG. 7, the logic chip LC includes the front surface (main surface, upper surface) LCt, the back surface (main surface, lower surface) LCb opposite to the front surface LCt, and the side surface LCs located between the front surface LCt and the back surface LCb.

The plurality of electrodes (chip terminal, bonding pad) PDL are formed in a region closer to the front surface LCt of the logic chip LC. The plurality of electrodes PDL are exposed from a protective film protecting the front surface LCt of the logic chip LC in the front surface LCt of the logic chip LC. In the present embodiment, as illustrated in FIG. 9, the plurality of electrodes PDL are arranged on the front surface LCt of the logic chip LC in a plurality of rows (in a array form) along the outer periphery of the front surface LCt. By arranging the plurality of electrodes PDL which are electrodes of the logic chip LC in the plurality of rows in the array form, the front surface LCt of the logic chip LC can be efficiently used as the space for arranging the electrodes. Therefore, this arrangement is advantageous in that the increase in the plane area can be suppressed even if the number of electrodes of the logic chip LC increases. However, although not illustrated, a modification example of the present embodiment can also be applied to a type of a semiconductor chip in which the plurality of electrodes PDL are formed on the peripheral edge portion of the front surface LCt.

In the example as illustrated in FIG. 7, the logic chip LC is mounted on the wiring substrate IP1 so that the front surface LCt is arranged to face the upper surface IPt of the wiring substrate IP1. Such a mounting method is called a face down mounting method or a flip chip connection method.

Although not illustrated in the drawing, a plurality of semiconductor elements (circuit elements) are formed on a main surface of the logic chip LC (more specifically, in a semiconductor element formation region provided on an element formation surface of a semiconductor substrate which is a base member of the logic chip LC). To these plurality of semiconductor elements, the plurality of electrodes PDL are electrically connected, respectively, via wirings (not illustrated) formed in the wiring layer arranged inside the logic chip LC (more specifically, between the front surface LCt and the semiconductor element formation region not illustrated).

The logic chip LC (more specifically, a base member of the logic chip LC) is made of, for example, silicon (Si). On the front surface LCt, the insulating film covering the base member of the logic chip LC and the wirings is formed. In the opening portions formed in this insulating film, a part of each of the plurality of electrodes PDL is exposed from the insulating film. Each of the plurality of electrodes PDL is made of a metal, for example, aluminum (Al) in the present embodiment. Note that the material configuring the electrode PDL is not limited to aluminum (Al) and may be made of copper (Cu).

As illustrated in FIG. 7, protrusion electrodes SBc are connected to the plurality of electrodes PDL, and the plurality of electrodes PDL of the logic chip LC and the plurality of bonding pads TCS of the wiring substrate IP1 are electrically connected to each other via the plurality of protrusion electrodes SBc. The protrusion electrode (bump electrode) SBc is a metal member (conductive member) formed to protrude from the front surface LCt of the logic chip LC. In the present embodiment, the protrusion electrode SBc is a so-called solder bump obtained by stacking a solder material on the electrode PDL through an underlying metal film (under bump metal). As the underlying metal film, for example, a stacked film obtained by stacking titanium (Ti), copper (Cu), and nickel (Ni) (a gold (Au) film is further formed on the nickel film in some cases) in an order from the connection surface side with the electrode PDL can be exemplified.

As similar to the solder ball SBp explained above, a lead-containing solder material and a lead-free solder ca be used as a solder material configuring the solder bump. When the logic chip LC is mounted on the wiring substrate IP1, the protrusion electrodes SBc are formed by previously forming the solder bumps on both of the plurality of electrodes PDL and the plurality of bonding pads TCS and performing a heating process (reflow process) while the solder bumps are brought into contact with each other to integrate the solder bumps. As a modification example of the present embodiment, a pillar bump (pillar-shaped electrode) obtained by forming a solder film on a tip surface of a conductor pillar made of copper (Cu) or nickel (Ni) maybe used as the protrusion electrode SBc.

As illustrated in FIG. 7, each of the memory chips MC includes a front surface (main surface, upper surface) MCt, a back surface (main surface, lower surface) MCb opposite to the front surface MCt, and a side surface MCs located between the front surface MCt and the back surface MCb.

The plurality of electrodes (chip terminal, bonding pad) PDM are formed in a region closer to the front surface MCt of the memory chip MC. The plurality of electrodes PDM are exposed from a protective film protecting the front surface MCt of the memory chip MC in the front surface MCt of the memory chip MC. In the present embodiment, as illustrated in FIG. 10, the plurality of electrodes PDM are arranged on the front surface MCt of the memory chip MC in a plurality of rows (in a array form) along the outer periphery of the front surface MCt.

In the example as illustrated in FIG. 10, the memory chip MC is divided into four channel regions which are channels ChA0, ChA1, ChB0, ChB1, and the plurality of electrodes PDM are arranged in a matrix form in each of the channel regions. Each channel region of the memory chip MC includes a region where each of the memory circuits RAM (see FIG. 6) is formed, and each of the memory circuits RAM in the respective channel regions is electrically connected to the logic chip LC illustrated in FIG. 7 via the electrode PDM.

As described above, one memory chip MC is divided into a plurality of channel regions, so that it is easy to adjust the delay time in the channel, and the operation of signal transmission at high speed is stabilized.

The plurality of electrodes PDM which are the electrodes of the memory chip MC are arranged in a plurality of rows, so that the front surface MCt of the memory chip MC can be efficiently used as the space for arranging the electrodes, and therefore, this is advantageous in that the increase in the plane area can be suppressed even if the number of electrodes of the memory chip MC increases.

In the example as illustrated in FIG. 7, the memory chip MC is mounted on the wiring substrate IP1 while the front surface MCt faces the upper surface IPt of the wiring substrate IP1. More specifically, as similar to the logic chip LC, the memory chip MC is mounted on the wiring substrate IP1 by the face down mounting method.

A plurality of semiconductor elements (circuit elements) are formed on a main surface of the memory chip MC (more specifically, the semiconductor element formation region provided on the element formation surface of the semiconductor wiring substrate which is the base member of the memory chip MC). To these plurality of semiconductor elements, the plurality of electrodes PDM are electrically connected, respectively, via wirings (not illustrated) formed in the wiring layer arranged inside the memory chip MC (more specifically, between the front surface MCt and the semiconductor element formation region not illustrated).

The memory chip MC (more specifically, a base member of the memory chip MC) is made of, for example, silicon (Si). On the front surface MCt, the insulating film covering the base member of the memory chip MC and the wirings is formed. In the opening portions formed in this insulating film, a part of each of the plurality of electrodes PDM is exposed from the insulating film. Each of the plurality of electrodes PDM is made of a metal, for example, aluminum (Al) in the present embodiment.

As illustrated in FIG. 7, protrusion electrodes SBc are connected to the plurality of electrodes PDM, and the plurality of electrodes PDM of the memory chip MC and the plurality of bonding pads TCS of the wiring substrate IP1 are electrically connected to each other via the plurality of protrusion electrodes SBc. The protrusion electrode (bump electrode) SBc and the underlying metal film arranged between the protrusion electrode SBc and the electrode PDM are as described above. Therefore, the overlap explanation for them will be omitted.

The underfill resin (insulating resin) UF is arranged between the logic chip LC and the wiring substrate IP1 and between the memory chip MC and the wiring substrate IP1. The underfill resin UF is arranged to cover the space between the front surface LCt of the logic chip LC and the upper surface IPt of the wiring substrate IP1 and between the front surface MCt of the memory chip MC and the upper surface IPt of the wiring substrate IP1.

The underfill resin UF is made of an insulating (non-conductive) material (for example, resin material), and is arranged to seal the electrical connection portions between the semiconductor chips (the logic chip LC and the memory chip MC) and the wiring substrate IP1 (seal joint portions of the plurality of protrusion electrodes SBc). As described above, the joint portions between the plurality of protrusion electrodes SBc and the plurality of bonding pads TCS are covered with the under fill resin UF, so that stress generated in the electrical connection portions between the semiconductor chips and the wiring substrate IP1 can be moderated. In addition, stress generated in the joint portions between the plurality of electrodes PDL of the logic chip LC and the plurality of protrusion electrodes SBc can also be moderated. Further, the main surface on which the semiconductor elements (circuit elements) of the logic chip LC are formed can also be protected.

<Details of Layout of Power Supply Potential Supply Path>

Subsequently, the layout of the transmission paths and the power supply potential supply paths of the semiconductor device PKG1 included in the electronic device EDV1 (see FIG. 1) will be explained in detail. First, as seen in the present embodiment, it is necessary to make a plurality of systems in one semiconductor package, and it is necessary to stably supply the power in accordance with the power demands of the plurality of systems in order to improve the electric characteristics.

For example, the supply path of the power supply potential through which a large current exceeding 5 A (amperes) flows is preferably formed with a thicker wiring width than the signal line in order to stably supply the current. For example, in the present embodiment, as illustrated in FIG. 3, each of the wiring width Wh1 of the power supply line WVH1 and the wiring width Wh2 of the power supply line WVH2 is thicker (larger) than the wiring width Wsg of the signal line WSG. A current of about 4 amperes flows in the power supply potential VDDQ1 and the power supply potential VDDQ2 as described above, and each of the wiring width Wq1 of the power supply line WVQ1 and the wiring width Wq2 of the power supply line WVQ2 is thicker (larger) than the wiring width Wsg of the signal line WSG. In the example as illustrated in FIG. 3, the wiring width Wh1 of the power supply line WVH1 is thicker (larger) than the wiring width Wh2, the wiring width Wq1, and the wiring width Wq2. The wiring width Wh2 of the power supply line WVH2 is thicker (larger) than the wiring width Wq1 and the wiring width Wq2.

From the viewpoint of reducing the power consumption, a lower power supply potential is preferable. From the viewpoint of easily handling the rapid change in the power demand, a lower power supply potential is preferable. For example, in the present embodiment, the power supply potential VDDH1 (see FIG. 6) supplied to the power supply line WVH1 and the power supply potential VDDH2 (see FIG. 6) supplied to the power supply line WVH2 are lower than the power supply potential VDDQ1 (see FIG. 6) supplied to the power supply line WVQ1 and the power supply potential VDDQ2 (see FIG. 6) supplied to the power supply line WVQ2. The power supply potential VDDH1 supplied to the power supply line WVH1 is lower than the power supply potential VDDH2 supplied to the power supply electric WVH2.

However, when the wiring width of the supply path of the power supply potential is large, a part of the wiring overlaps in the thickness direction due to the layout relation in some cases. In particular, as illustrated in FIG. 6, a plurality of types of power supply potentials are supplied to the logic chip LC, and therefore, it is difficult to prevent the crossing of the power supply paths. For example, in the example as illustrated in FIG. 6, four types of the power supply potential VDDH1, the power supply potential VDDH2, the power supply potential VDDQ1, and the power supply potential VDDQ2 are supplied to the logic chip LC. FIG. 6 exemplifies a typical driving power supply, and not only the power supply potentials described above but also another power supply potential is supplied in some cases.

When the supply paths of a plurality of types of power supply potentials are arranged to overlap with each other in the thickness direction of the wiring substrate as described above, one of the supply paths affects the electrical characteristics of the other of the supply paths. For example, when the supply paths supplying power supply potentials different from each other overlap in the thickness direction, a supply path that supplies a relatively high potential affects a supply path that supplies a relatively low potential. For example, when the value of the current flowing in one of the two supply paths overlapping with each other in the thickness direction rapidly changes, the impedance of the other of the supply paths changes in some cases.

The noise influence between the above-described supply paths is caused by the electrical coupling between two supply paths overlapping with each other in the thickness direction. Therefore, in order to reduce the noise influence, it is preferable to reduce an area of a portion where the supply paths overlap with each other in the thickness direction.

When the electronic device EDV1 according to the present embodiment illustrated in FIG. 3 is considered based on the above description, the electronic device EDV1 has the following configuration. More specifically, the memory chip MC is mounted along each of the chip side Scp2 and the chip side Scp3 of the four sides included in the logic chip LC. Since the power supply line WVQ1 is led into the memory chip M1 and the power supply line WVQ2 is led into the memory chip M2, it is difficult to provide the power supply lines WVH1 and WVH2 so as to cross over the memory chips M1 and M2.

The plurality of signal lines WSG are provided along the chip side Scp4 of the four sides included in the logic chip LC. As illustrated in FIG. 4, in the present embodiment, the terminals CNSG that transmit or receive electric signals to and from the logic chip LC are intensively provided in a region between the chip side Scp4 and the wiring substrate side Sip4. More specifically, while the terminal CNSG is also provided in a region other than the area between the chip side Scp4 and the wiring substrate side Sip4, the plurality of terminals CNSG are arranged with the highest density in the region between the chip side Scp4 and the wiring substrate side Sip4. Therefore, in the region between the chip side Scp4 and the wiring substrate side Sip4, the signal lines WSG connected to the plurality of terminals CNSG are arranged with the highest density.

From the viewpoint of reducing the noise influence on the signal lines WSG, it is preferable that the power supply lines WVH1, WVH2 through which large currents flow do not overlap the signal lines WSG. In particular, in the present embodiment, the plurality of signal lines WSG provided between the chip side Scp4 and the wiring substrate side Sip4 include the plurality of signal lines WSG configuring the analog signal transmission path ANLP (see FIG. 6) to which the analog signal SGANL (see FIG. 6) is input. The analog signal has the noise influence larger than that of the digital signal. Therefore, in the present embodiment, the power supply line WVH1 and the power supply line WVH2 through which the large current flows are not provided in the region between the chip side Scp4 and the wiring substrate side Sip4.

As described above, the memory chip MC and many signal lines WSG are provided outside the chip side Scp2, the chip side Scp3, and the chip side Scp4 of the four sides included in the logic chip LC. On the other hand, the plurality of memory chips MC are not mounted between the chip side Scp1 and the wiring substrate side Sip1 of the four sides included in the logic chip LC. Therefore, in the present embodiment, the power supply line WVH1 and the power supply line WVH2 are led from a region of the chip side Scp1 of the logic chip LC.

More specifically, as illustrated in FIG. 3, in a plan view, the power supply line WVH2 is arranged to cross over the chip side Scp1 of the logic chip LC and the wiring substrate side Sip1 of the wiring substrate IP1. In a plan view, the power supply line WVH2 extends between the power supply line WVH1 and the plurality of memory chips M2 toward the region overlapping with the logic chip. In a region other than the region overlapping with the logic chip LC, the power supply line WVH1 and the power supply line WVH2 are provided so that they do not overlap with each other as much as possible. Therefore, an area of the region of the power supply line WVH2, the region overlapping with the power supply line WVH1 in the thickness direction, is smaller than an area of the region of the power supply line WVH2, the region not overlapping with the power supply line WVH1.

By reducing the area where the power supply line WVH1 and the power supply line WVH2 overlap with each other as described above, the noise influence between the power supply line WVH1 and the power supply line WVH2 can be reduced. Therefore, the power can be stably supplied from the power supply line WVH1 and the power supply line WVH2 to the logic chip LC. A large current can be efficiently supplied to various circuits included in the logic chip LC.

As illustrated in FIG. 3, in a plan view, each of the power supply line WVQ1 and the power supply line WVQ2 is arranged to cross over the wiring substrate side Sip3 of the wiring substrate IP1, and each of the power supply line WVQ1 and the power supply line WVQ2 does not overlap with the logic chip LC in the thickness direction. As illustrated in FIG. 6, the power supply potential VDDQ1 and the power supply potential VDDQ2 are power supply potentials for driving the input/output circuit CAC. Therefore, the power supply potential VDDQ1 and the power supply potential VDDQ2 are supplied to not only the memory chip MC but also the logic chip LC. Therefore, when attention is paid to the stability of power supply to the power supply potential VDDQ1 as a modification example of the present embodiment, it is preferable to lead the power supply line WVQ1 to pass through the region overlapping with the memory chip M1 into the region overlapping with the logic chip LC. When attention is paid to the stability of power supply to the power supply potential VDDQ2, it is preferable to lead the power supply line WVQ2 to pass through the region overlapping with the memory chip M2 into the region overlapping with the logic chip LC.

However, when the power supply line WVQ1 and the power supply line WVQ2 are led into the region overlapping with the logic chip LC, a part of the power supply line WVQ1 and the power supply line WVQ2 overlaps with a part of the power supply line WVH1 or the power supply line WVH2. Therefore, as seen in the present embodiment, when each of the power supply line WVQ1 and the power supply line WVQ2 is arranged so as not to overlap with the logic chip LC in the thickness direction, even if a part of the power supply line WVQ1 and the power supply line WVQ2 overlaps with a part of the power supply line WVH1 or the power supply line WVH2, the area of the overlapping part can be reduced. Alternatively, the power supply line WVQ1 and the power supply line WVQ2 can be configured so as not to overlap with the power supply line WVH1 and the power supply line WVH2. As a result, the noise influence on the power supply line WVH1 or the power supply line WVH2 caused by the power supply line WVQ1 and the power supply line WVQ2 can be reduced.

In the example as illustrated in FIG. 3, the power supply line WVQ1 does not overlap with the power supply line WVH1 and the power supply line WVH2. Therefore, the noise influence on the power supply line WVH1 and the power supply line WVH2 caused by the power supply line WVQ1 can be reduced. In the example as illustrated in FIG. 3, the power supply line WVQ2 does not overlap with the power supply line WVH1 and the power supply line WVH2. Therefore, the noise influence on the power supply line WVH1 and the power supply line WVH2 caused by the power supply line WVQ2 can be reduced.

In the present embodiment, note that the power supply line WVQ1, the power supply line WVQ2, and the power supply line WVH1 are formed in the same wiring layer (for example, the wiring layer MBL4 illustrated in FIG. 2) as one another. On the other hand, the power supply line WVH2 is formed in a wiring layer (for example, the wiring layer MBL3 illustrated in FIG. 2) different from the power supply line WVQ1, the power supply line WVQ2, and the power supply line WVH1. In this case, the power supply line WVH1 does not overlap with the power supply line WVQ1 and the power supply line WVQ2, but has a possibility of the overlap with the power supply line WVQ1 or the power supply line WVQ2 depending on the wiring layout of the power supply line WVH2. In particular, the power supply line WVH2 is provided to pass between the power supply line WVH1 and the power supply line WVQ2, and therefore, a part of the power supply line WVH2 overlaps with the power supply line WVQ2 depending on the wiring width of each of the power supply line WVH2 and the power supply line WVQ2 in some cases. As described above, when a part of the power supply line WVH2 overlaps with a part of the power supply line WVQ2 (or the power supply line WVQ1), the area of the overlapping part is preferably smaller than an area of a part not overlapping with the power supply line WVQ2 (or power supply line WVQ1). In this manner, the noise influence on the power supply line WVH1 and the power supply line WVH2 caused by the power supply line WVQ2 (or the power supply line WVQ1) can be reduced.

As illustrated in FIG. 1, a separation distance PT2 between the memory chip M2 and the logic chip LC is larger than a separation distance PT1 between the memory chip M1 and the logic chip LC. In other words, the memory chip M2 has wide gap (separation distance PT2) from the logic chip LC. As described above, when a wide gap (separation distance PT2) is provided between the memory chip M2 and the logic chip LC, the space between the chip side Scp3 of the logic chip LC and the chip side Smc4 of the memory chip M2 can be used as a space where the power supply line WVH2 is led as illustrated in FIG. 3. In this case, as illustrated in FIG. 3, the power supply line WVH2 is provided to cross over the chip side Scp3 of the logic chip LC. Therefore, the area of the region where the power supply line WVH1 and the power supply line WVH2 overlap with each other can be further reduced.

As illustrated in FIG. 2, in the present embodiment, each of the power supply line WVH1 and the power supply line WVH2 through which such a large current as exceeding 5 amperes flows is provided in a wiring layer of the plurality of wiring layers included in the wiring substrate MB1 other than the wiring layer MBL1 closest to the upper surface MBt. In other words, each of the power supply line WVH1 and the power supply line WVH2 is provided in a wiring layer other than the wiring layer MBL1 closest to the semiconductor device PKG1. As a result, the influence of electromagnetic wave noises (EMI: Electro-Magnetic Interference) on the semiconductor device PKG1 can be reduced. Each of the power supply line WVH1 and the power supply line WVH2 through which such a large current as exceeding 5 amperes flows is formed in an inner layer of the wiring substrate MB1 (in a wiring layer other than the wiring layer MBL1 and the wiring layer MBL6 illustrated in FIG. 2), and therefore, the electromagnetic wave noises generated by the electronic device EDV1 can be reduced.

Figure 11:
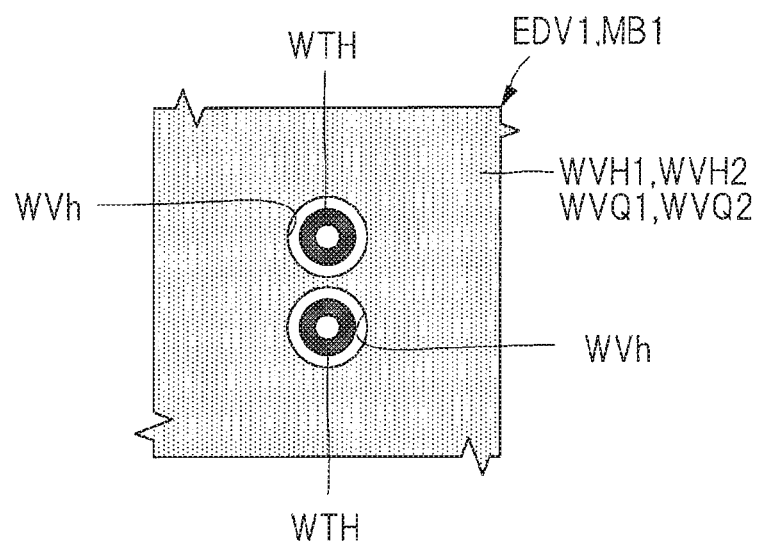
FIG. 11 is an enlarged plan view illustrating a part of a wiring layer in which a power supply line is formed in the wiring substrate illustrated in FIG. 4.
Figure 12:
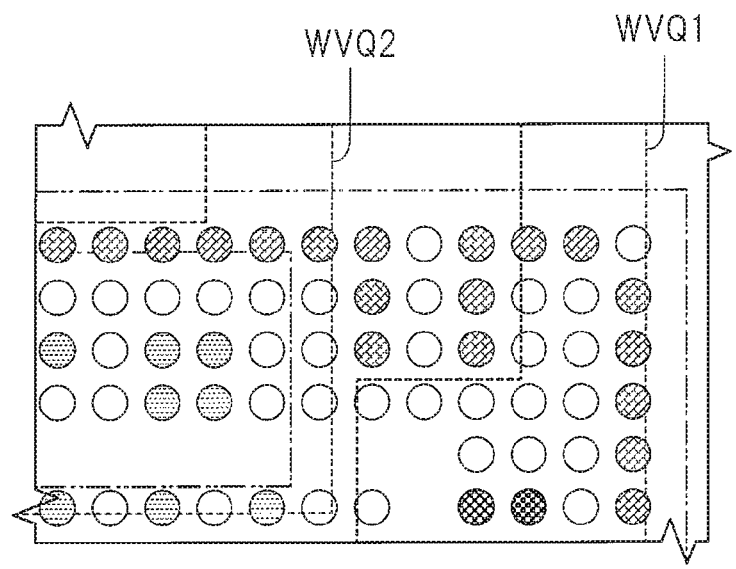
FIG. 12 is an enlarged plan view illustrating a drawing of a terminal arrangement on the lower surface side of the wiring substrate illustrated in FIG. 8 so as to be overlapped with the power supply line illustrated in FIG. 4.

The inventors of the present application have studied the preferable arrangement of the plurality of terminals LD included in the wiring substrate IP1 illustrated in FIG. 8 from the viewpoint of increasing the planar area of the wiring that supplies a large current to stably supplying the power as similar to the power supply line WVH1 and the power supply line WVH2. FIG. 11 is an enlarged plan view illustrating a part of a wiring layer in which the power supply line is formed in the wiring substrate illustrated in FIG. 4. FIG. 12 is an enlarged plan view illustrating a drawing of a terminal arrangement on the lower surface side of the wiring substrate illustrated in FIG. 8 to be overlapped with the power supply line illustrated in FIG. 4.

The cross sectional area of the supply path is preferably large in consideration of the stable power supply in the supply paths of the power supply potentials such as the power supply line WVH1, the power supply line WVH2, the power supply line WVQ1, or the power supply line WVQ2 illustrated in FIG. 4. Here, as illustrated in FIG. 2, a case of usage of a through hole wiring WTH penetrating through the wiring substrate MB1 in the thickness direction as an inter-layer conductor path electrically connecting a plurality of wiring layers will be considered. As illustrated in FIG. 11, it is necessary to form an opening portion WVh in a conductor pattern configuring a power supply line at a portion where the power supply line WVH1, the power supply line WVH2, the power supply line WVQ1, or the power supply line WVQ2 intersects with, for example, the through hole wiring WTH for supplying the power other than the power supply potential such as the wiring for the electric signal. The larger the number of crossing between the power supply line and through hole WTH is, the larger the number of opening portions WVh formed in the conductor pattern configuring the power supply line is. The increase in the number of the opening portions WVh becomes a cause of reduction in the plane area of the power supply line, and therefore, it is preferable to minimize the number of crossing between the power supply line and through hole WTH.

In particular, in a case of the signal terminal CNSG of the plurality of terminals CN illustrated in FIG. 7, the signal terminal through which the electric signal is transmitted, the through hole wiring WTH (see FIG. 11) through which a signal current different from others flows is connected to each signal terminal CNSG. For this reason, if the signal terminal CNSG is placed at a position overlapping with the power supply line, the number of opening portions WVh illustrated in FIG. 11 tends to increase. On the other hand, in a case of a terminal CNVS of the plurality of terminals CN illustrated in FIG. 7, the terminal CNSV to which the reference potential is supplied, the same potential may be supplied to the plurality of terminals CN. Therefore, even if the terminal CNVS for the reference potential supply and the power supply line overlap with each other in the thickness direction, the increase in the number of the opening portions WVh illustrated in FIG. 11 can be suppressed by adjusting the formation position of the through hole WTH.

However, in order to increase the number of the signal terminals CNSG, it is difficult to arrange the signal terminal CNSG and the power supply line so as not to overlap with each other at all. Therefore, in the present embodiment, in the region overlapping with the power supply line WVH1, the power supply line WVH2, the power supply line WVQ1, or the power supply line WVQ2, the number of the arrangements of the signal terminals CN is smaller than that in the other region.

More specifically, as illustrated in FIG. 8, on the lower surface IPb of the wiring substrate IP1, the plurality of terminals LD are arranged in a plurality of rows along the outer periphery of the lower surface IPb. The plurality of terminals LD include a terminal LDVH1 and a terminal LDVH2 each of which supplies the power supply potential to the logic chip LC, and a terminal LDVQ1 and a terminal LDVQ2 each of which supplies the power supply potential to the memory chip MC. The plurality of terminals LD include the terminal LDSG which transmits or receives the electric signal to and from the logic chip LC. The plurality of terminals LD include the terminal LDVS which supplies the reference potential to the logic chip LC and the memory chip MC.

The lower surface IPb of the wiring substrate IP has a first terminal arrangement unit where the terminal LD for power supply potential or the terminal LDVS for reference potential is mainly arranged (the terminal LD for power supply potential or the terminal LDVS for reference potential is arranged to be more than the terminal LDSG for signal). Also, the lower surface IPb of the wiring substrate IP has a second terminal arrangement unit where the terminal LDSG for signal is mainly arranged (the terminals LDSG for LDVS signal is arranged to be as many as or more than the terminal LD for power supply potential and the terminal LDVS for reference potential). Since the terminals LD for signal are mainly arranged on the outer peripheral side of the lower surface IPb, the second terminal arrangement unit is closer to the outer peripheral side than the first terminal arrangement unit explained above.

Here, as illustrated in FIG. 12, in the first region of the lower surface IPb, the first region overlapping with either one of the power supply line WVQ1 and the power supply line WVQ2, the number of rows of the second terminal arrangement unit is smaller than that in the second region of the lower surface IPb, the second region overlapping with the region sandwiched between the power supply line WVQ1 and the power supply line WVQ2.

For example, in the example as illustrated in FIG. 12, in the first region of the lower surface IPb, the first region overlapping with either one of the power supply line WVQ1 and the power supply line WVQ2, the number of the rows in the second terminal arrangement unit is one. On the other hand, in the second region of the lower surface IPb, the second region overlapping with the region sandwiched between the source line WVQ1 and the power supply line WVQ2, the number of rows in the second terminal arrangement unit is three. In the region overlapping with either one of the power supply line WVH1 (see FIG. 4) and the power supply line WVH2 (see FIG. 4) in the example of the present embodiment, the number of rows in the second terminal arrangement unit is one. That is, in the first region of the lower surface IPb in the present embodiment, the first region overlapping with any one of the power supply line WVH1, the power supply line WVH2, the power supply line WVQ1, and the power supply line WVQ2, the number of rows in the second terminal arrangement unit is smaller than that in the second region of the lower surface IPb, the second region overlapping with the region sandwiched between the power supply line WVQ1 and the power supply line WVQ2.

As described above, by decreasing the number of the arrangements of the terminals CN for signals in the region overlapping with the power supply line WVH1, the power supply line WVH2, the power supply line WVQ1, or the power supply line WVQ2 to be smaller than the number of the same in the other region, the reduction of the plane area of the power supply line can be suppressed while the number of the terminals CNSG for signals is increased. Therefore, the power can be supplied stably against, for example, the rapid change in the power demand.

Figure 13:
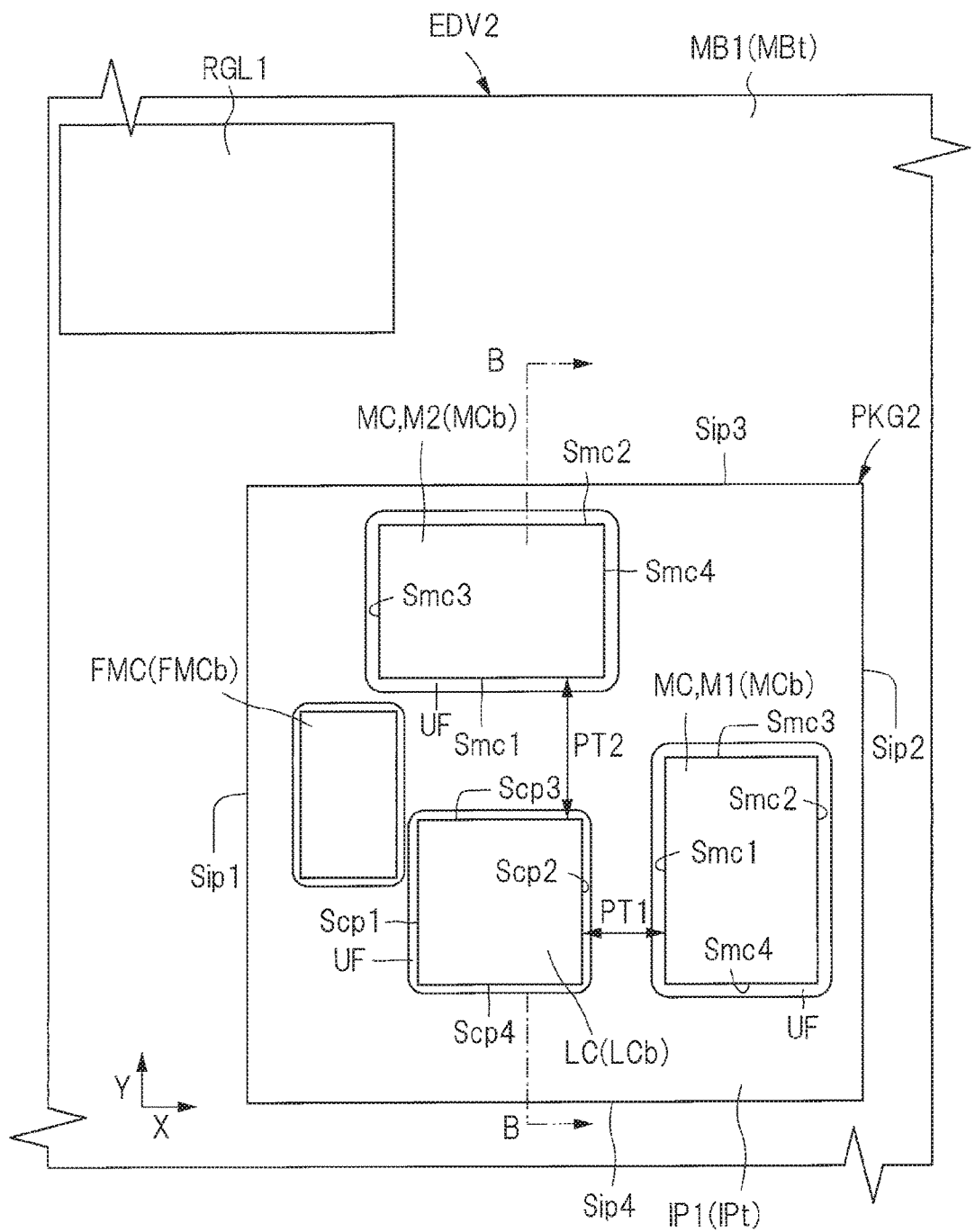
FIG. 13 is an enlarged plan view illustrating a modification example of FIG. 1.
Figure 14:
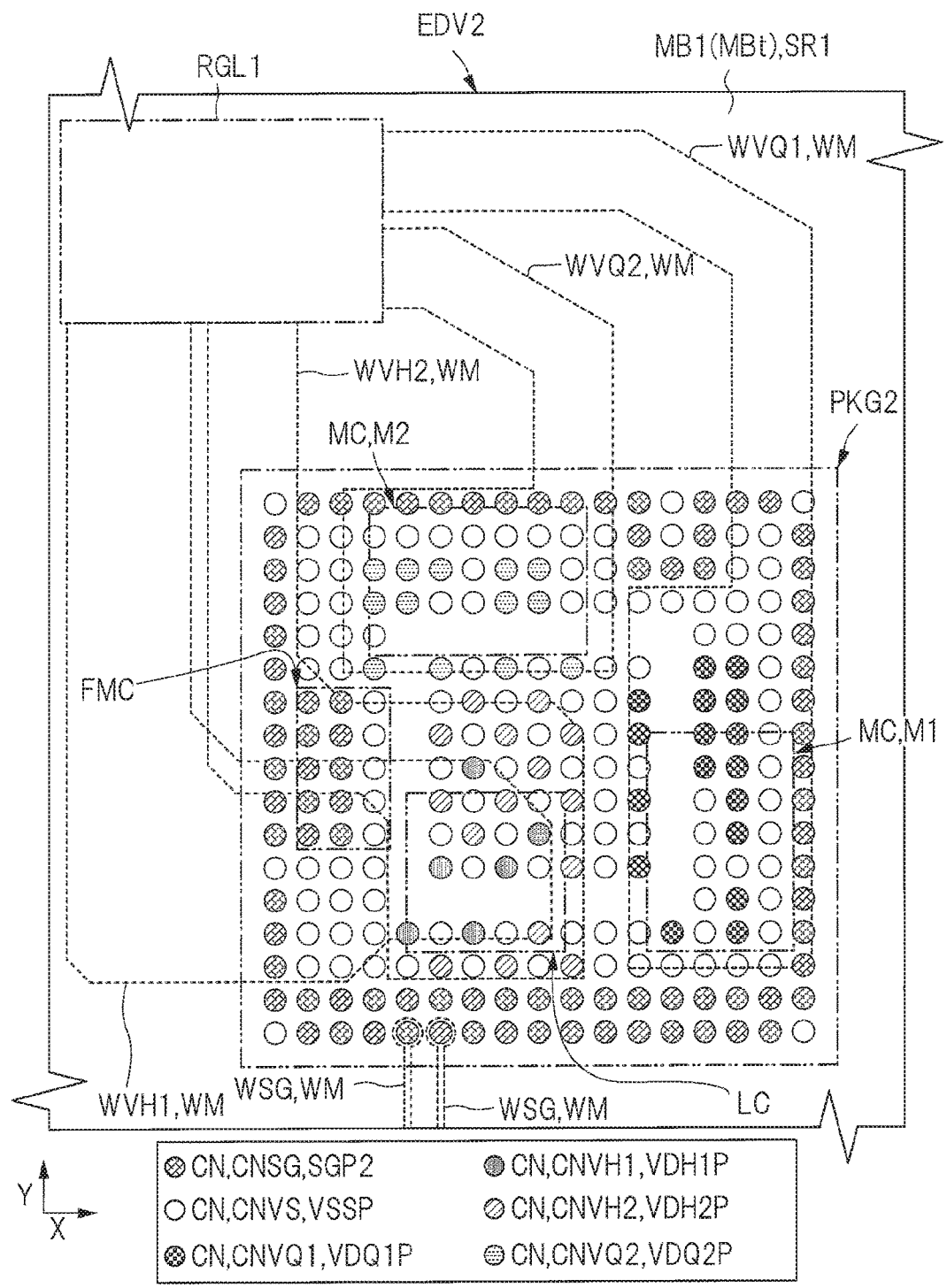
FIG. 14 is an enlarged plan view illustrating an example of a terminal layout in a plan view of a motherboard illustrated in FIG. 13.

However, even when the terminal CNSG for signal is provided in the region overlapping with the power supply line WVH1, the power supply line WVH2, the power supply line WVQ1, or the power supply line WVQ2 illustrated in FIG. 4, this does not affect the plane area of the power supply line if the terminal CNSG for signal is not connected with the through hole WTH illustrated in FIG. 11. For example, as seen in the modification example illustrated in FIG. 13, the terminal CNSG for signal provided in the region overlapping with the power supply line WVH1, the power supply line WVH2, the power supply line WVQ1, or the power supply line WVQ2 is led in the wiring layer MBL illustrated in FIG. 2 and is not connected to another wiring layer in some cases. In this case, the terminal CNSG for signal may overlap with the power supply line WVH1, the power supply line WVH2, the power supply line WVQ1, or the power supply line WVQ2 in the thickness direction. FIG. 13 is an enlarged plan view illustrating a modification example of FIG. 1. FIG. 14 is an enlarged plan view illustrating an example of a terminal layout in the plan view of the motherboard illustrated in FIG. 13.

The semiconductor device PKG2 included in the electronic device EDV2 according to the modification example illustrated in FIG. 13 is different from the semiconductor device PKG1 included in the electronic device EDV1 illustrated in FIG. 1 in that a semiconductor chip FMC is mounted between the chip side Scp1 and the wiring substrate side Sip1 on the upper surface IPt of the wiring substrate IP1. The semiconductor chip FMC is a so-called nonvolatile memory chip including a nonvolatile memory circuit, and the nonvolatile memory circuit is electrically connected to the logic chip LC.

In a case of signal transmission to/from the nonvolatile memory circuit, there is a tendency to shorten the signal transmission distance from the viewpoint of increasing the signal transmission speed. Therefore, as illustrated in FIG. 14, a plurality of the signal terminals CNSG are provided at the position overlapping with the semiconductor chip FMC, but most of the signal terminals CNSG are not connected to the wiring layer other than the wiring layer MBL1 (see FIG. 2) provided in the uppermost layer of the wiring substrate MB2, and is led in the wiring layer MBL1. In other words, the number of first terminals of the plurality of terminals CN for the semiconductor chip FMC, the first terminals being connected to the wiring layer other than the wiring layer MBL1, is smaller than the number of second terminals thereof being not connected to the wiring layer other than the wiring layer MBL1. In this case, as illustrated in FIG. 14, even if the plurality of the signal terminals CNSG for the semiconductor chip FMC overlap at least one of the power supply line WVH1 and the power supply line WVH2 in the thickness direction, the opening portion WVh illustrated in FIG. 11 may not be provided in the power supply line WVH1 or the power supply line WVH2. Therefore, the reduction of the plane area of the power supply line WVH1 or the power supply line WVH2 can be suppressed.

The modification example illustrated in FIG. 13 and FIG. 14 can be considered from the following viewpoints. More specifically, when the number of the semiconductor chips connected to the logic chip LC increases, it is necessary to mount the semiconductor chip so as to face each of the four sides of the logic chip LC. In this case, it is difficult to ensure the path for leading the power supply line WVH1 and the power supply line WVH2 supplying the power supply potential to the logic chip LC. However, as seen in the semiconductor chip FMC, the semiconductor chip FMC mainly connected to the wiring layer MBL1 (see FIG. 2) which is the uppermost layer of the plurality of wiring layers included in the wiring substrate MB2 has the smaller influence on the wiring width of the power supply line WVH1 and the power supply line WVH2. Therefore, by arranging the space on which the semiconductor chip FMC is mounted to overlap with the path for leading the power supply line WVH1 and the power supply line WVH2 into the logic chip LC in the thickness direction, the electronic device EDV2 can be downsized.

Figure 15:
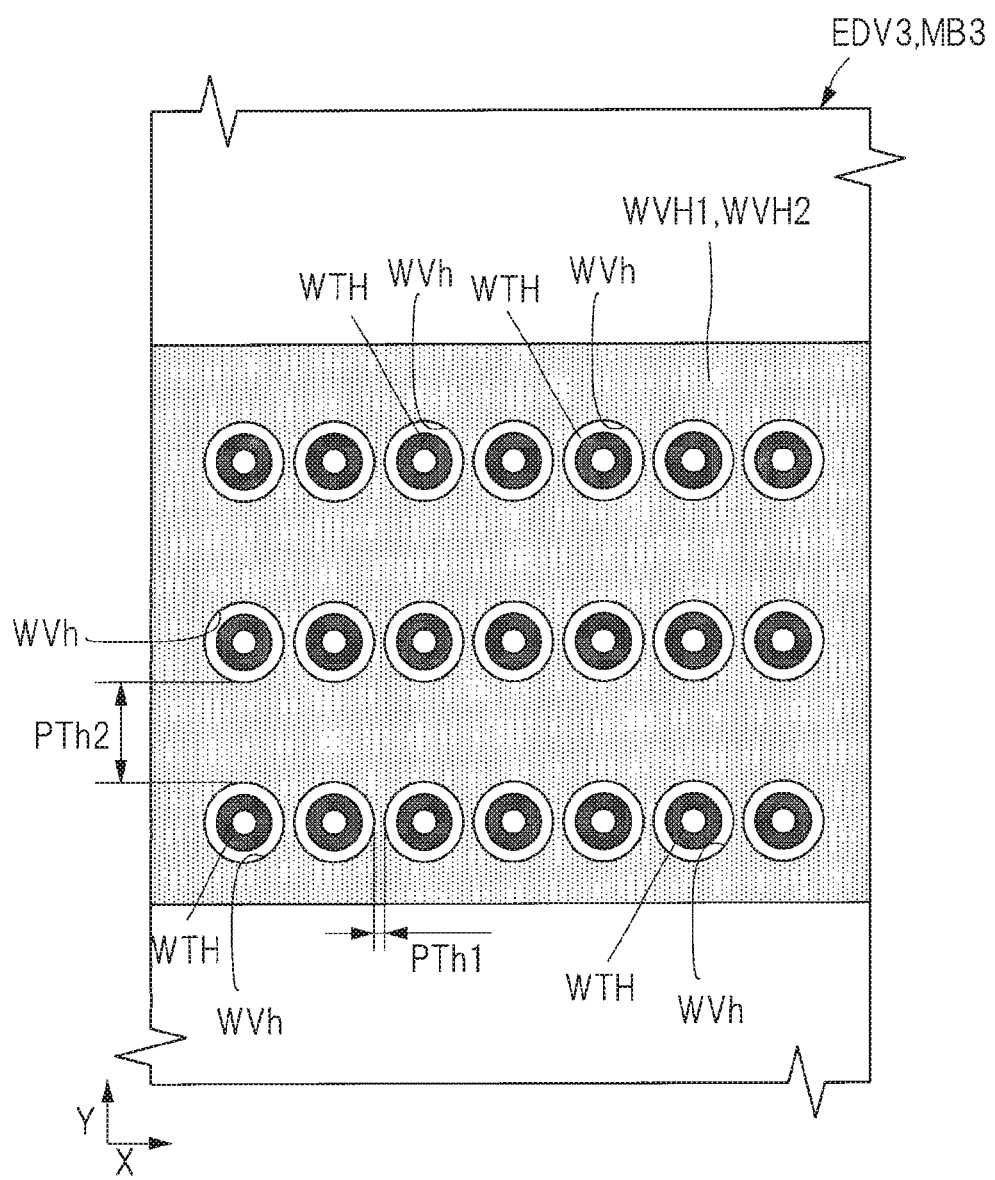
FIG. 15 is an enlarged plan view illustrating a positional relation between the extension direction of the power supply line and the through hole wiring on the wiring substrate included in the electronic device of the modification example of FIG. 11.

Depending on the terminal layout, it is necessary to arrange many through hole wirings WTH (see FIG. 11) at a position crossing the power supply line WVH1 and the power supply line WVH2 illustrated in FIG. 4. In such a case, as seen in the electronic device EDV3 illustrated in FIG. 15, the plurality of through hole wirings WTH and the plurality of opening portions provided for the respective crossings between the through hole wirings WTH and themselves are preferably arranged along the extension direction (X direction in FIG. 15) of the power supply line WVH1 or the power supply line WVH2. FIG. 15 is an enlarged plan view illustrating a positional relation between the extension direction of the power supply line and the through hole wiring on the wiring substrate included in the electronic device according to the modification example of FIG. 11.

The wiring substrate MB3 included in the electronic device EDV illustrated in FIG. 15 is different from the wiring substrate MB1 illustrated in FIG. 11 in that the power supply line WVH1 or the power supply line WVH2 crosses the through hole WTH at many points. More specifically, the wiring substrate MB1 has the plurality of through hole wirings WTH penetrating through at least one of the power supply line WVH1 and the power supply line WVH2 in the thickness direction. The power supply line WVH1 or the power supply line WVH2 has the plurality of opening portions WVh provided at crossing portions with the plurality of through hole wirings WTH. The plurality of through hole wirings WTH and the plurality of opening portions WVh are arranged along the X direction which is the extension direction of the power supply line WVH1 or the power supply line WVH2. A separation distance PTh1 between opening portions WVh adjacent to each other in the X direction among the plurality of opening portions WVh is smaller than a separation distance PTh2 between opening portions WVh adjacent to each other in the Y direction perpendicular to the X direction. In other words, the separation distance PTh2 is larger than the separation distance PTh1.

In the case of the electronic device EDV3, the plurality of through hole wirings WTH are provided at positions overlapping with the power supply line WVH1 or the power supply line WVH2, and therefore, the wiring width of the power supply line WVH1 or the power supply line WVH2 is narrow. However, by providing the plurality of opening portions WVh so that the separation distance PTh2 is larger than the separation distance PTh1, the reduction of the cross sectional area of the power supply path formed by the power supply line WVH1 or the power supply line WVH2 can be suppressed.

As explained with reference to FIG. 3, the power supply line WVQ1 included in the wiring substrate MB1 does not overlap with the power supply line WVH1 and the power supply line WVH2. Therefore, the noise influence on the power supply line WVH1 and the power supply line WVH2 caused by the power supply line WVQ1 can be reduced. In the example as illustrated in FIG. 3, the power supply line WVQ2 does not overlap with the power supply line WVH1 and the power supply line WVH2. Therefore, the noise influence on the power supply line WVH1 and the power supply line WVH2 caused by the power supply line WVQ2 can be reduced. As illustrated in FIG. 3, the region overlapping with the logic chip LC in the thickness direction is covered with the power supply line WVH2, and therefore, each of the power supply line WVQ1 and the power supply line WVQ2 does not overlap with the logic chip LC in the thickness direction.

However, as explained with reference to FIG. 6, the power supply potential VDDQ1 and the power supply potential VDDQ2 are power supplies for driving the input/output circuit CAC between the logic chip LC and the memory chip MC, and therefore, a part of the power supply potential VDDQ1 and a part of the power supply potential VDDQ2 are also supplied to the logic chip LC. Here, in consideration of the stability of the input and output operation in the logic chip LC, the cross sectional area of the power supply path is preferably large at a position close to a power consuming circuit.

Figure 16:
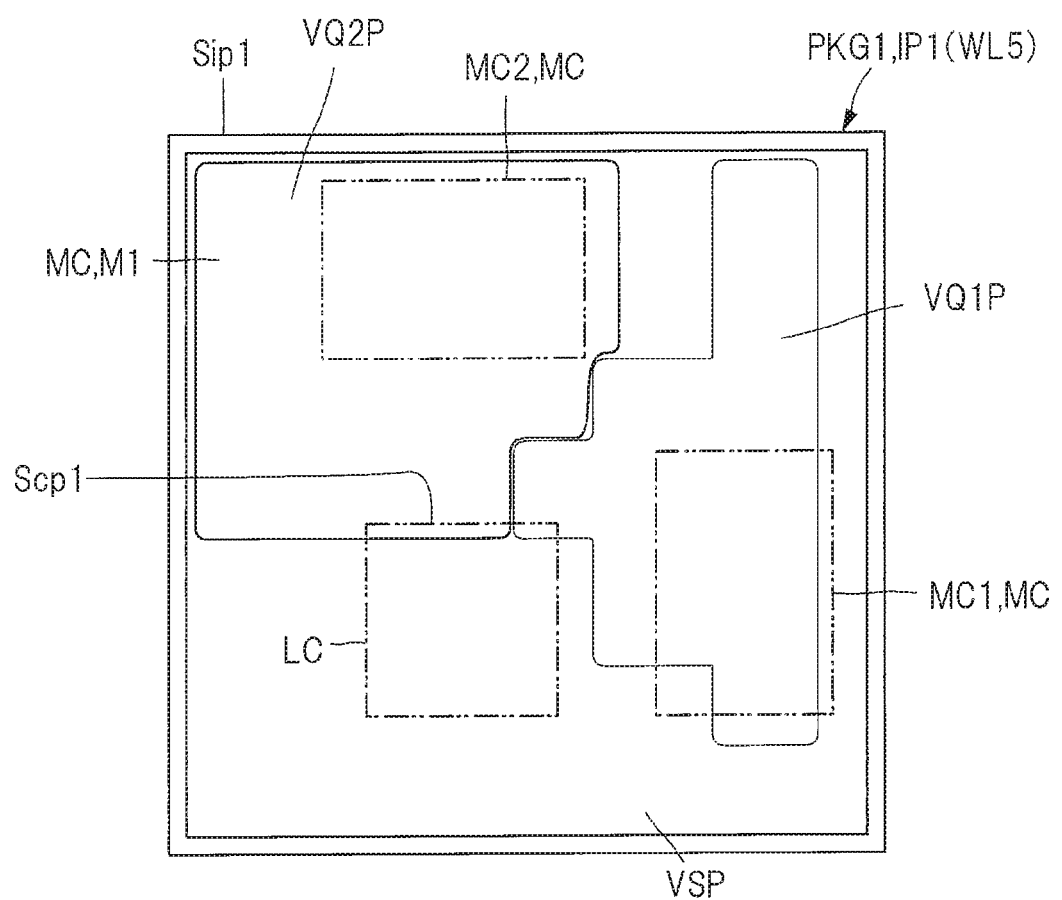
FIG. 16 is a plan view illustrating a layout example of a conductor plane provided in one wiring layer included in the wiring substrate illustrated in FIG. 7.

Therefore, as illustrated in FIG. 16, the semiconductor device PKG1 has a conductor pattern whose area is larger than that of an ordinary wiring in any one of the plurality of wiring layers of the wiring substrate IP1, and supplies the power supply potential VDDQ1 and the power supply potential VDDQ2 illustrated in FIG. 6 via this conductor pattern. FIG. 16 is a plan view illustrating a layout example of a conductor plane provided in one wiring layer of the wiring substrate illustrated in FIG. 7.

In the present application, note that a conductor pattern (conductive film) which has a relatively large area among the conductor patters configuring the transmission paths for the power and for the electric signal is referred to as a conductor plane. A conductor plane which configures the supply path for the power supply potential among the conductor planes is referred to as a power supply plane. A conductor plane which configures the supply path for the reference potential among the conductor planes is referred to as a ground plane.

As illustrated in FIG. 16, a plurality of conductor planes are formed in the circuit layer WL5 included in the wiring substrate IP1 of the semiconductor device PKG1. More specifically, the wiring substrate IP1 has a power supply plane (conductor pattern) VQ1P supplying the power supply potential VDDQ1 (see FIG. 6) to the logic chip LC and the memory chip M1. The wiring substrate IP1 has a power supply plane (conductor pattern) VQ2P supplying the power supply potential VDDQ2 (see FIG. 6) to the logic chip LC and the memory chip M2. The wiring substrate IP1 has a ground plane (conductor pattern) VSP supplying the reference potential VSS (see FIG. 6) to the logic chip LC and the plurality of memory chips MC.

As illustrated in FIG. 16, the area of each of the power supply plane VQ1P and the power supply plane VQ2P is larger than the plane area of each of the plurality of memory chips MC. By providing the power supply plane VQ1P and the power supply plane VQ2P inside the wiring substrate IP1 as described above, the resistance of the supply path for the power supply potential can be reduced. In addition, as a result of the reduction in the resistance of the supply path for the power supply potential, the supply of the power can be stabilized. In addition, as a result of the reduction in the resistance of the supply path for the power supply potential, the temperature rise of the semiconductor device PKG1 during driving can be suppressed, and therefore, the circuit operation can be stabilized.

As illustrated in FIG. 16, a part of each of the power supply plane VQ1P and the power supply plane VQ2P is formed to overlap with the logic chip LC in the thickness direction. Therefore, the transmission distance from the logic chip LC to the power supply plane VQ1P, VQ2P can be reduced.

Figure 17:
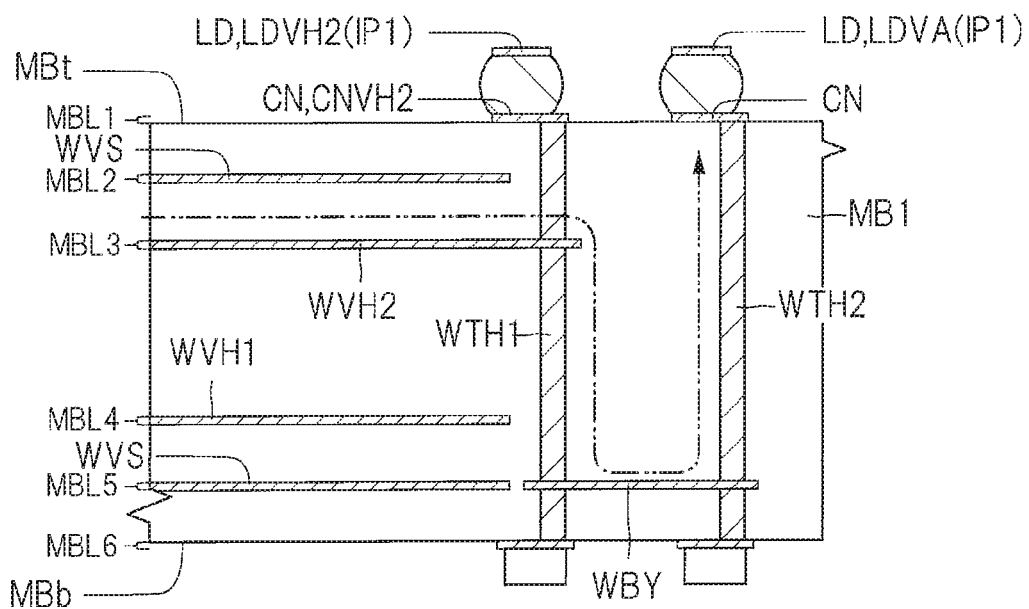
FIG. 17 is an enlarged cross-sectional view schematically illustrating a configuration of a path supplying a power supply potential to an analog circuit included in the semiconductor device illustrated in FIG. 6.
Figure 18:
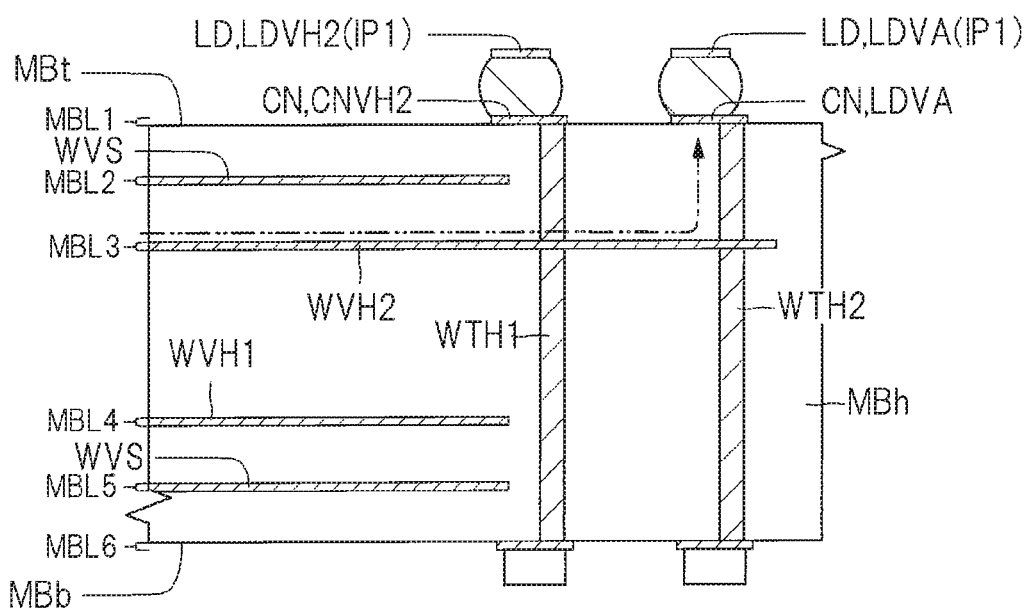
FIG. 18 is an enlarged cross-sectional view illustrating a study example of FIG. 17.

As described above, the plurality of signal transmission paths included in the electronic device EDV1 according to the present embodiment include the analog signal transmission path ANLP for inputting the analog signal SGANL into the logic chip LC as illustrated in FIG. 6. In other words, the semiconductor device PKG1 according to the present embodiment has an analog circuit. A preferred aspect of the supply path for the power supply potential driving this analog circuit will be explained. FIG. 17 is an enlarged cross-sectional view schematically illustrating a configuration of a path supplying the power supply potential to the analog circuit of the semiconductor device illustrated in FIG. 6. FIG. 18 is an enlarged cross-sectional view illustrating a comparative example of FIG. 17.

As illustrated in FIG. 17, the plurality of terminals LD of the wiring substrate IP1 include a terminal (power supply terminal for analog) LDVA for supplying the power supply potential to the analog circuit as described above. The terminal LDVA is electrically connected to the through hole wiring WTH2 penetrating through the wiring substrate MB1 via the solder ball SBp and the terminal CN in the thickness direction. The terminals LD of the wiring substrate IP1 include the terminal (power supply terminal) LDVH2 electrically connected to the power supply line WVH2 via the through hole wiring WTH1. The terminal LDVA is electrically connected to the terminal LDVH2 via the through hole wiring WTH1, the through hole wiring WTH2, and the connection wiring WBY. In other words, the terminal LDVA is electrically connected to the power supply line WVH2 via the through hole wiring WTH1, the through hole wiring WTH2, and the connection wiring WBY. In still other words, in the example as illustrated in FIG. 17, the power supply potential for analog is supplied from the power supply line WVH2.

When several types of power supply potentials are to be supplied to one package as seen in the present embodiment, it is difficult to ensure the lead-in space of the power supply line. Therefore, if there is a power supply potential that can be shared, it is preferable to share the power supply potential as illustrated in FIG. 17. Note that FIG. 17 illustrates an embodiment in which power supply potential for analog is supplied from the power supply line WVH2 as a representative example among the power supply line WVH1 and the power supply line WVH2 illustrated in FIG. 3. However, as a modification example, the power supply potential can also be supplied from the power supply line WVH1 illustrated in FIG. 3.

Here, when the power supply potential for analog is supplied from the power supply line WVH2, a method can be considered, the method directly connecting the power supply line WVH2 and the through hole wiring WTH2 by extending the power supply line WVH2 to the position of the through hole wiring WTH2 as seen in the wiring substrate MBh illustrated in FIG. 18. However, in the case of the power supply for analog, it is more preferable to take the influence of noises into consideration than that in the digital signal.

Therefore, in the present embodiment, as illustrated in FIG. 17, the connection wiring WBY electrically connecting the through hole wiring WTH1 and the through hole wiring WTH2 is arranged in a layer lower than the wiring layer MBL3 and the wiring layer MBL4 (in a region closer to the lower surface MBb). The connection wiring WBY is not provided in the wiring layer MBL3 and the wiring layer MBL4. The connection wiring WBY is not provided in a layer upper than the wiring layer MBL3 and the wiring layer MBL4 (in the region closer to the lower surface MBb).

Therefore, as schematically illustrated with a two-dot chain line in FIG. 17, the supply path for the power supply potential for analog is longer than that in the example illustrated in FIG. 18. According to the wiring substrate MB1 of FIG. 17, the inductance becomes larger because the supply path for the power supply potential for analog is longer, and therefore, high frequency components of digital can be filtered. As a result, the noises coming around the analog circuit can be smaller than that in the example illustrated in FIG. 18.

<Method of Manufacturing Semiconductor Device>

Figure 19:
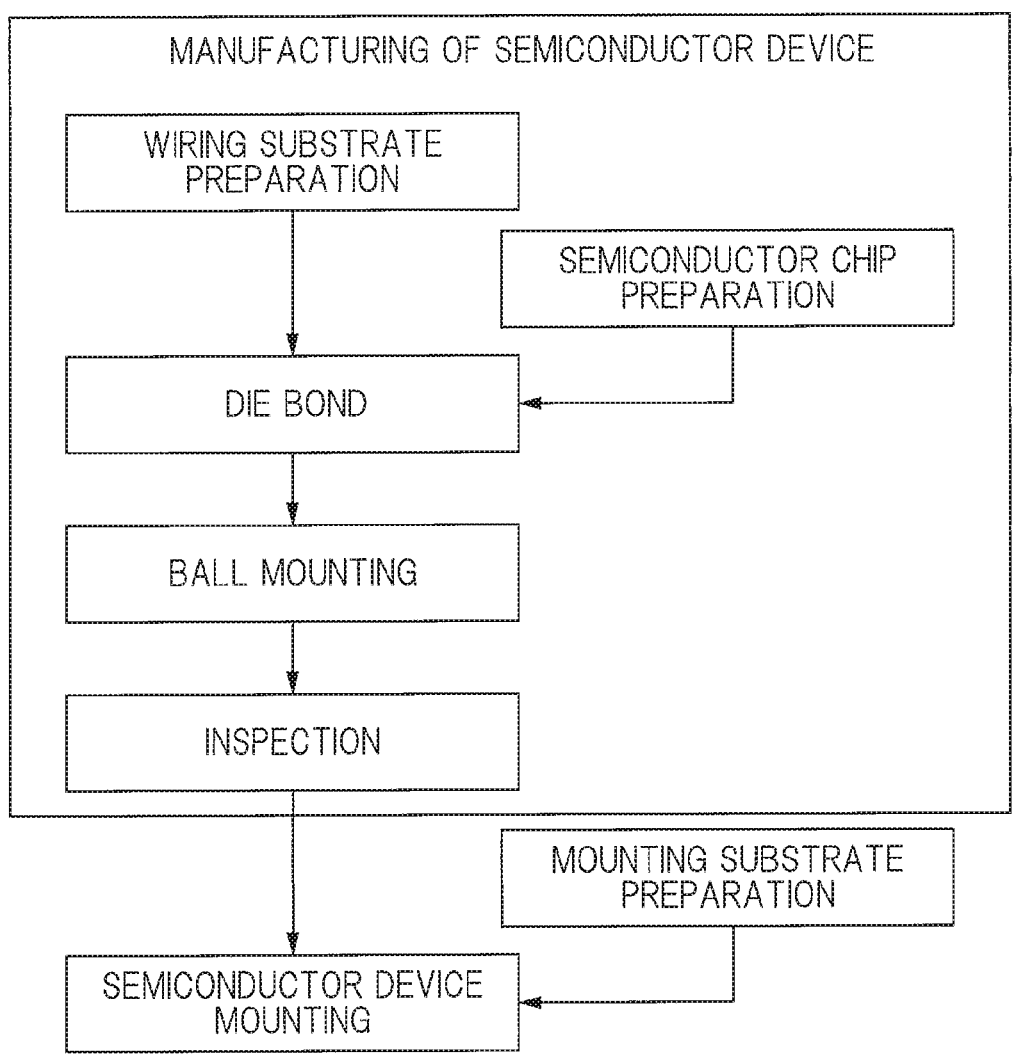
FIG. 19 is an explanatory diagram illustrating overview of steps of manufacturing the semiconductor device explained with reference to FIG. 1 to FIG. 18.

Subsequently, steps of manufacturing the semiconductor device PKG1 described with reference to FIG. 1 to FIG. 18 will be explained. The semiconductor device PKG1 is manufactured along the flow illustrated in FIG. 19 (flowchart). FIG. 19 (flowchart) is an explanatory diagram illustrating overview of the steps for manufacturing the semiconductor device described with reference to FIG. 1 to FIG. 18. Note that FIG. 19 illustrates the steps up to the step of manufacturing the semiconductor device, and then, mounting it on the motherboard to manufacture the electronic device illustrated in FIG. 1.

In the following explanation for the manufacturing method, note that a method of preparing the wiring substrate IP1 that is previously formed in a product size to manufacture the semiconductor device PKG1 for one layer will be explained. However, as a modification example, this explanation can also be applied to a multi-piece taking method of obtaining a plurality of semiconductor devices by preparing so-called a multi-piece taking substrate that is partitioned into a plurality of product formation regions, assembling each of the plurality of product formation regions, and then, dividing the substrate into each of the product formation regions. In this case, an individualization step is added after a ball mount step or an electrical test step illustrated in FIG. 19 (flowchart), the individualization step cutting the multi-piece taking substrate to divide the substrate into each of the product formation regions.

1. Wiring Substrate Preparation Step

Figure 20:
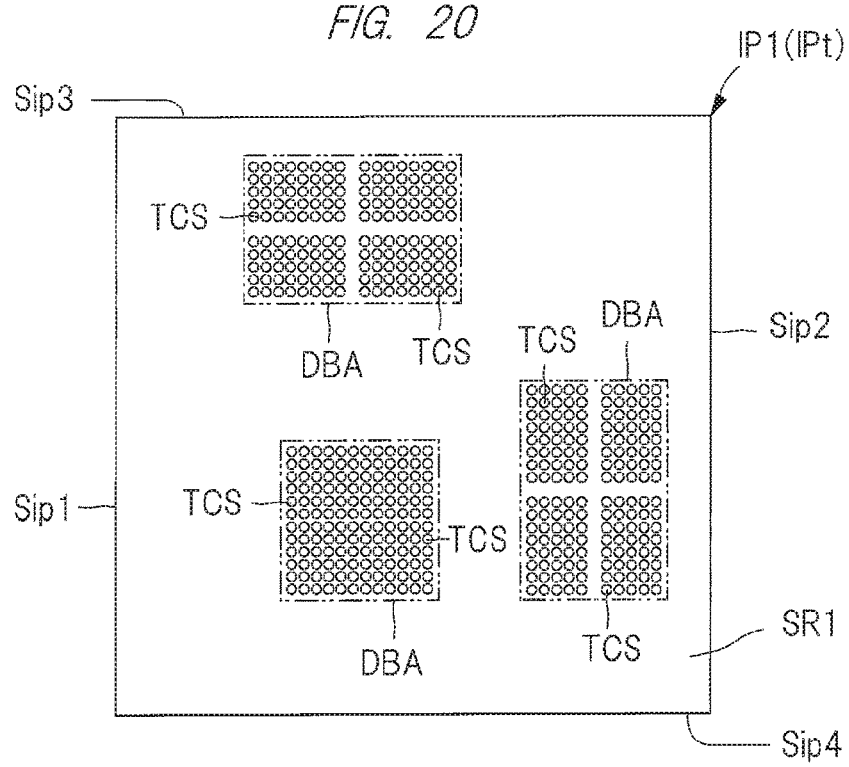
FIG. 20 is a plan view illustrating a chip mounting surface side of a wiring substrate that is prepared in a wiring substrate preparation step illustrated in FIG. 19.

First, in the wiring substrate preparation step illustrated in FIG. 19, the wiring substrate IP1 illustrated in FIG. 20 is prepared. FIG. 20 is a plan view illustrating a chip mounting surface side of the wiring substrate prepared in the wiring substrate preparation step illustrated in FIG. 19. Note that the cross sectional surface of FIG. 20 is the same as a cross sectional surface obtained by removing the logic chip LC, the memory chip MC, the underfill resin UF, and the plurality of solder balls SBc, SBp illustrated in FIG. 7, and therefore, this will be explained with reference to FIG. 7.

As illustrated in FIG. 20, the upper surface IPt of the wiring substrate IP1 includes a plurality of chip mounting regions DBA where the plurality of semiconductor chips are mounted in the semiconductor chip mounting step illustrated in FIG. 19 (flowchart). Note that the chip mounting region DBA is a region where the logic chip LC and the plurality of memory chips MC illustrated in FIG. 1 are supposed to be mounted, and may not have a visible boundary line. FIG. 20 illustrates the boundary of the chip mounting region DBA attached with a two-dot chain line in order to show the position of the chip mounting region DBA.

In each of the plurality of chip mounting regions DBA, the plurality of bonding pads TCS are formed. The plurality of bonding pads TCS are electrode terminals electrically connected to the logic chip LC and the memory chip MC via the protrusion electrodes SBc illustrated in FIG. 7 in the die bond mounting step illustrated in FIG. 19 (flowchart).

Note that FIG. 20 illustrates an example of an arrangement of the bonding pads TCS in a matrix form with a plurality of rows along the outline of the chip mounting region as an example of arrangement of the bonding pads TCS. However, the arrangement of the bonding pads TCS has various modification examples. For example, the bonding pads TCS may be arranged along the peripheral edge portion of the chip mounting region DBA but the bonding pad TCS may not be arranged at the central part of the chip mounting region DBA.

Since the wiring structure of the wiring substrate IP1 illustrated in FIG. 20 has already been described with reference to FIG. 1 to FIG. 13, the repetitive description will be omitted. However, in the present step, the solder ball SBp illustrated in FIG. 7 is not connected. As similar to the present embodiment, as the method of manufacturing the wiring substrate IP1 having the core layer CR which is the core material, the wiring substrate can be manufactured by, for example, the build-up method of stacking the wiring layers on the upper surface side and the lower surface side of the core layer CR using the core layer CR formed with the plurality of through hole wirings TW as the base member. If the core material is not used, the wiring substrate can be manufactured by stacking a plurality of wiring layers on a base member not illustrated, and then, peeling the base member.

2. Die Bond Step

Figure 21:
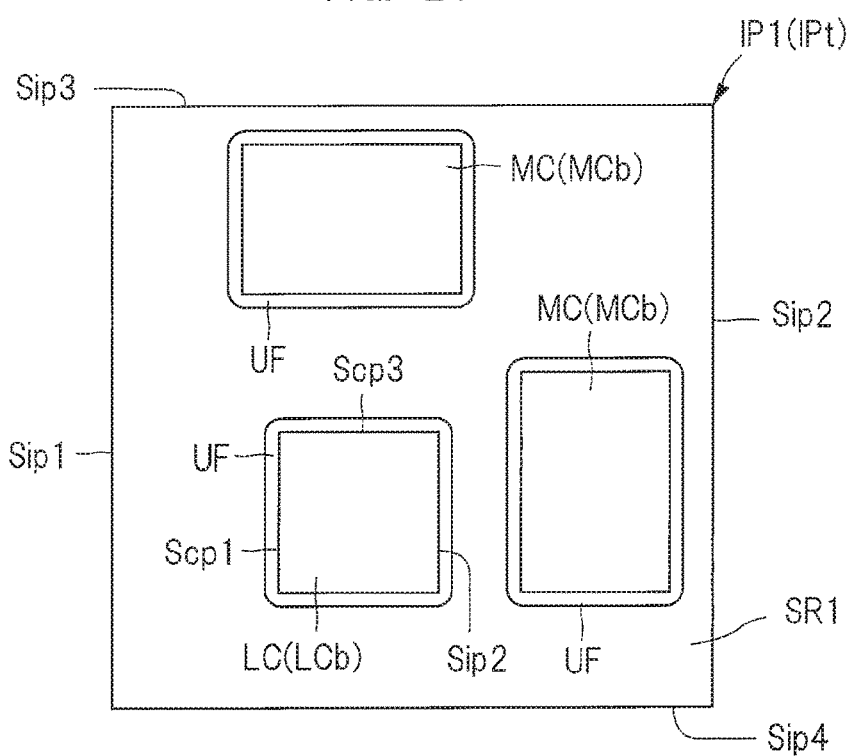
FIG. 21 is a plan view illustrating a state in which the plurality of semiconductor chips are mounted on the wiring substrate illustrated in FIG. 20.

Subsequently, in the die bond step illustrated in FIG. 19 (flowchart), the logic chip LC and the plurality of memory chips MC are mounted on the upper surface IPt of the wiring substrate IP1 as illustrated in FIG. 21. FIG. 21 is a plan view illustrating a state in which the plurality of semiconductor chips are mounted on the wiring substrate illustrated in FIG. 20. Note that the cross sectional surface of FIG. 20 is the same as that obtained by removing the plurality of solder balls SBc and the plurality of solder balls SBp illustrated in FIG. 7, and therefore, this will be explained with reference to FIG. 7.

In the present step, the logic chip LC illustrated in FIG. 9 and the memory chip MC illustrated in FIG. 10 are prepared (in the semiconductor chip preparation step), and are mounted on the chip mounting region DBA of the wiring substrate IP1 (see FIG. 20). In the example as illustrated in FIG. 21 and FIG. 7, the logic chip LC is mounted by the so-called face down mounting method while the front surface LCt of the logic chip LC (see FIG. 7) and the upper surface IPt of the wiring substrate IP1 face each other. In the example as illustrated in FIG. 21 and FIG. 7, the memory chip MC is mounted by the face down mounting method while the front surface MCt of the memory chip MC (see FIG. 7) and the upper surface IPt of the wiring substrate IP1 face each other.

In the present step, as illustrated in FIG. 7, the plurality of electrodes PDL formed on the front surface LCt side of the logic chip LC and the plurality of bonding pads TCS of the wiring substrate IP1 are electrically connected to each other via the plurality of protrusion electrodes SBc. As illustrated in FIG. 7, the plurality of electrodes PDM formed on the front surface MCt side of the memory chip MC and the plurality of bonding pads TCS of the wiring substrate IP1 are electrically connected to each other via the plurality of protrusion electrodes SBc.

When the plurality of bonding pads TCS are arranged in the matrix form as seen in the present embodiment, solder bumps each obtained by forming a solder material into a spherical shape are used as the plurality of protrusion electrodes SBc in some cases. However, the protrusion electrode SBc is not limited to the solder bump, and, for example, a pillar bump obtained by forming a metal material such as copper into a pillar shape may be used.

In the present step, the underfill resin (insulating resin) UF is arranged between the logic chip LC and the wiring substrate IP1 and between the plurality of memory chips MC and the wiring substrate IP1. The underfill resin UF is arranged to seal the electrical connection portion between the semiconductor chip and the wiring substrate IP1 (the joint portion between the plurality of protrusion electrodes SBc). As described above, the underfill resin UF is arranged so as to seal the connection portion between the plurality of protrusion electrodes SBc, so that the stress generated in the electrical connection portion between the logic chip LC and the wiring substrate IP1 can be moderated.

The method of forming this underfill resin UF is roughly classified into two method types. In the first-pasting method which is the first method, the underfill resin UF is arranged on the chip mounting region DBA (see FIG. 20) before the semiconductor chip is mounted. Subsequently, the logic chip LC is pressed onto the underfill resin UF, so that the wiring substrate IP1 and logic chip LC are electrically connected to each other. Then, the underfill resin UF is cured. In the case of the present method of arranging the resin material before the semiconductor chip is mounted, not only the paste-form resin material as described above but also a film-form resin material can be also used.

In a later-injection method which is the second method, the logic chip LC and wiring substrate IP1 are electrically connected to each other before the underfill resin UF is arranged. Then, a liquid resin is injected into a gap between the logic chip LC and the wiring substrate IP1, and the liquid resin is cured. In the present step, either the first-pasting method or the later-injection method described above may be used.

As illustrated in FIG. 7, the thickness of the memory chip MC (the separation distance between the front surface MCt and the back surface MCb) is larger than the thickness of the logic chip LC (the separation distance between the front surface LCt and the back surface LCb). In this case, as the order of mounting the semiconductor chip, it is preferable to mount the relatively thin logic chip LC, and then, mount the memory chip MC. Therefore, at the time of mounting the latter-mounted semiconductor chip, contact of a mounting jig not illustrated with the earlier-mounted semiconductor chip can be prevented.

Therefore, in the present embodiment, first, the logic chip LC is mounted first. The logic chip LC is mounted on the wiring substrate IP1 so that the chip side Scp1 is arranged along the substrate side Sip1 of the wiring substrate IP1. Subsequently, each of the plurality of memory chips MC is mounted between the substrate side Sip2 of the wiring substrate IP1 and the chip side Scp2 of the logic chip LC and between the wiring substrate side Sip3 of the substrate IP1 and the chip side Scp3 of the logic chip LC.

3. Ball Mount Step

Subsequently, in the ball mount step illustrated in FIG. 19 (flowchart), as illustrated in FIG. 7, the plurality of solder balls SBp are attached onto the lower surface IPb side of the wiring substrate IP1. In the present step, the solder balls SBp are joined with the terminals LD by placing the solder balls SBp on the terminals LD exposed from the insulating film SR2 illustrated in FIG. 7 and applying a reflow processing (a processing of applying heat to melt and joint the solder components, and then, cooling). If the solder balls SBp are not used as the conductive material electrically connecting the wiring substrate MB1 and the semiconductor device PKG1 illustrated in FIG. 1, note that the present step can be omitted. Alternatively, in the present step, instead of the solder ball SBp, a metal film such as a thin solder film maybe formed on the exposed surface of the terminal LD.

4. Inspection Step

Subsequently, in an inspection step illustrated in FIG. 19 (flowchart), an inspection body to which the plurality of solder balls SBp are joined in the ball mount step illustrated in FIG. 19 (flowchart) is inspected. In the present step, appearance inspection and electric test for a circuit formed in the inspection body are performed. In the present step, it is determined whether the inspection body is passed or not based on the previously-prepared evaluation criteria for each inspection item. Then, the inspection body that has been determined to be passed is acquired as the semiconductor device PKG1 illustrated in FIG. 7.

The semiconductor device PKG1 that has passed the inspection is carried to the semiconductor device mounting step illustrated in FIG. 19 (flowchart). When the semiconductor device mounting step is conducted at a business establishment that is different from that in the inspection step, note that a packing step of packing the semiconductor device PKG1, and a delivery step of delivering the semiconductor device to a different business establishment or others may be performed after the inspection step.

5. Semiconductor Device Mounting Step (Method of Manufacturing an Electronic Device)

Subsequently, in the semiconductor device mounting step illustrated in FIG. 19 (flowchart), the semiconductor device PKG1 is mounted on the wiring substrate MB1 as illustrated in FIG. 1. In the present step, the wiring substrate MB1 illustrated in FIG. 3 is prepared (in the mounting board preparation step), and the semiconductor device PKG1 illustrated in FIG. 1 is mounted on the upper surface MBt of the wiring substrate MB1.

As illustrated in FIG. 4, the plurality of terminals CN for connecting the semiconductor device PKG1 is formed on the upper surface (mounting surface) MBt of the wiring substrate MB1. Note that the semiconductor device PKG1 has the plurality of solder balls SBp which are external terminals. The power supply device (regulator) RGL1 may be previously mounted on the wiring substrate MB1 at the stage of mounting board preparation step. Alternatively, the power supply device RGL1 may be mounted just before the semiconductor device PKG is mounted. Note that the power supply device RGL1 can be mounted after the semiconductor device PKG is mounted. However, as illustrated in FIG. 2, if the thickness of the power supply device RGL1 is thinner than the thickness of the semiconductor device PKG1, the power supply device RGL1 is preferably mounted before the semiconductor device PKG1 is mounted.

In the present embodiment, as illustrated in FIG. 1, the semiconductor device PKG1 is mounted so that the substrate side Sip1 of the wiring substrate IP1 included in the semiconductor device PKG1 faces the power supply device RGL1 side mounted on the wiring substrate MB1.

In the present step, for example, as illustrated in FIG. 5, the semiconductor device PKG1 and the wiring substrate MB1 are electrically connected to each other by joining the plurality of solder balls SBp of the semiconductor device PKG1 to the plurality of terminals CN of the wiring substrate MB1, respectively. More specifically, the plurality of solder materials (for example, cream solder) not illustrated are applied to each exposed surface of the plurality of terminals CN. Then, the plurality of solder materials are brought into contact with the plurality of solder balls SBp of the semiconductor device PKG1. Then, a heating processing (reflow processing) is performed while the solder material and the solder ball SBp are in contact with each other, so that the solder material and the solder ball SBp are integrally formed with each other. As a result, the plurality of terminals LD of the semiconductor device PKG1 and the plurality of the terminals CN of the wiring substrate MB1 are electrically connected to each other via the plurality of solder balls SBp, respectively.

When an electronic component other than the semiconductor device PKG1 such as the capacitor CC1 illustrated in FIG. 2 is mounted, the electronic component can be mounted before the semiconductor device PKG is mounted or after the semiconductor device PKG1 is mounted.

When the electronic component that is electrically connected to the terminal by using the solder for the mounting as seen in the capacitor CC1, note that the reflow processing is necessary. In this case, if the reflow processing is collectively performed, a common material as a solder material for mounting each electronic component can be used.

MODIFICATION EXAMPLE

In the foregoing, the invention made by the present inventors has been concretely described based on the embodiments. However, it is needless to say that the present invention is not limited to the foregoing embodiments and various modifications and alterations can be made within the scope of the present invention. Note that the plurality of modification examples have been described in the above-described embodiments. However, modification examples other than the above-described modification examples will be described below.

Modification Example 1

For example, the above-described embodiment has been described while exemplifying the case in which the logic chip LC and two memory chips MC are mounted on the wiring substrate IP1 but the electronic components other than the semiconductor chip are not mounted thereon. However, as a modification example of the above-described embodiments, the electronic components (including other semiconductor chips) other than the logic chip LC and the memory chip MC may be mounted.

For example, not only the logic chip LC and the memory chip MC but also an electronic component such as a capacitor not illustrated may be mounted. For example, by mounting a bypass capacitor or a decoupling capacitor on the wiring substrate IP1, the loop of the power path supplied to the circuit of the semiconductor chip can be small. In addition to the above description, if the memory chip MC does not have a terminating power supply therein, the capacitor may be mounted on the wiring substrate IP1 as the terminating power supply.

Modification Example 2

The above-described embodiment has been described while exemplifying the case in which the logic chip LC and two memory chips MC are mounted on the wiring substrate IP1 but the electronic components other than the semiconductor chip are not mounted thereon. However, the number of semiconductor chips mounted on the wiring substrate IP1 has various modification examples besides the above-described embodiments. In particular, as the number of memory chips MC, the necessary storage capacity is different depending on the system provided in the semiconductor device PKG1. Since the value of the storage capacity increases in proportion to the number of memory chips MC, for example, the number of memory chips MC may be two or more, or one. A plurality of logic chips LC may be mounted on the upper surface IPt. Further, a semiconductor chip having a function other than the logic chip LC and the memory chip MC may be mounted.

Figure 22:
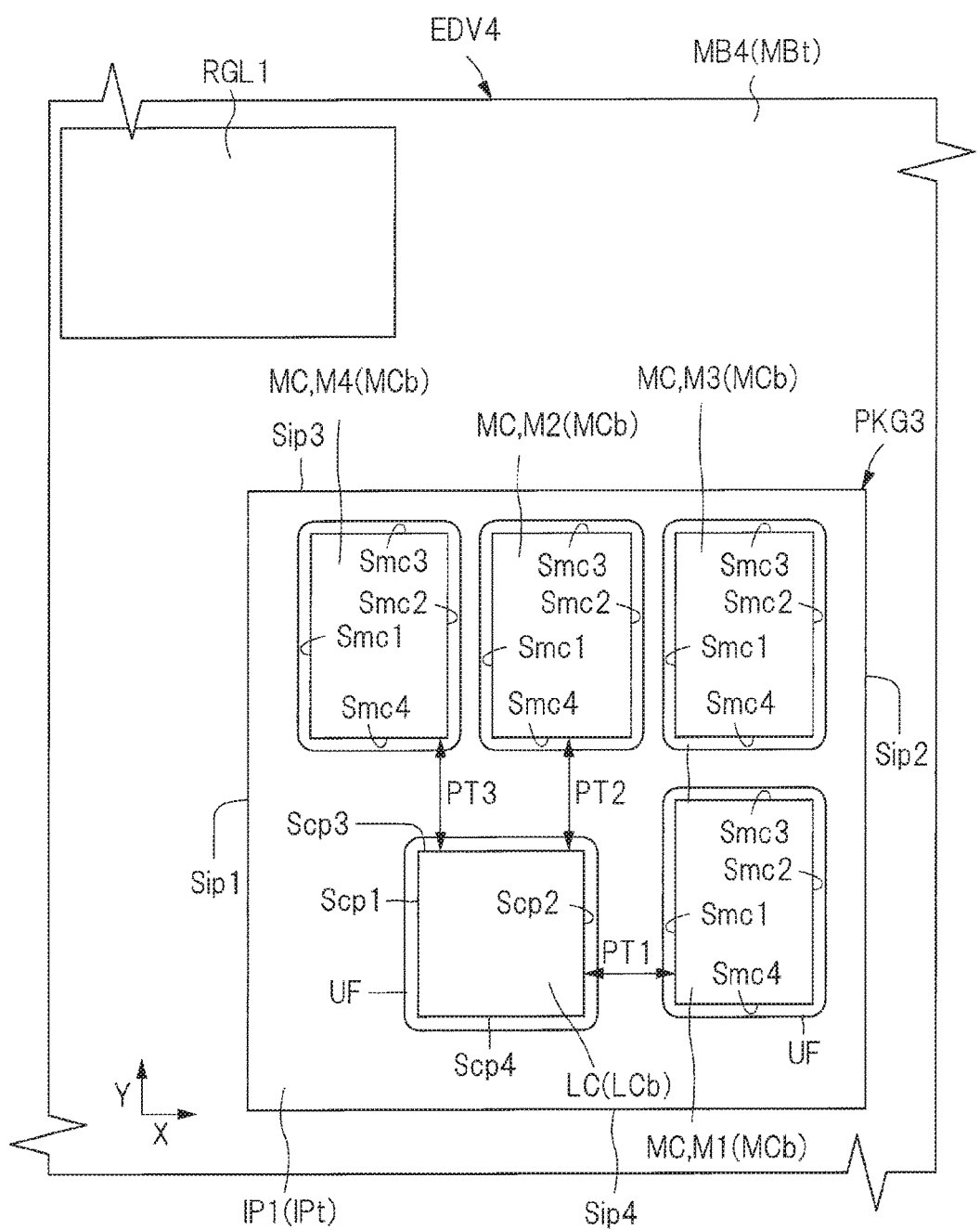
FIG. 22 is a plan view illustrating an electronic device on which a semiconductor device of a modification example of FIG. 1 is mounted.
Figure 23:
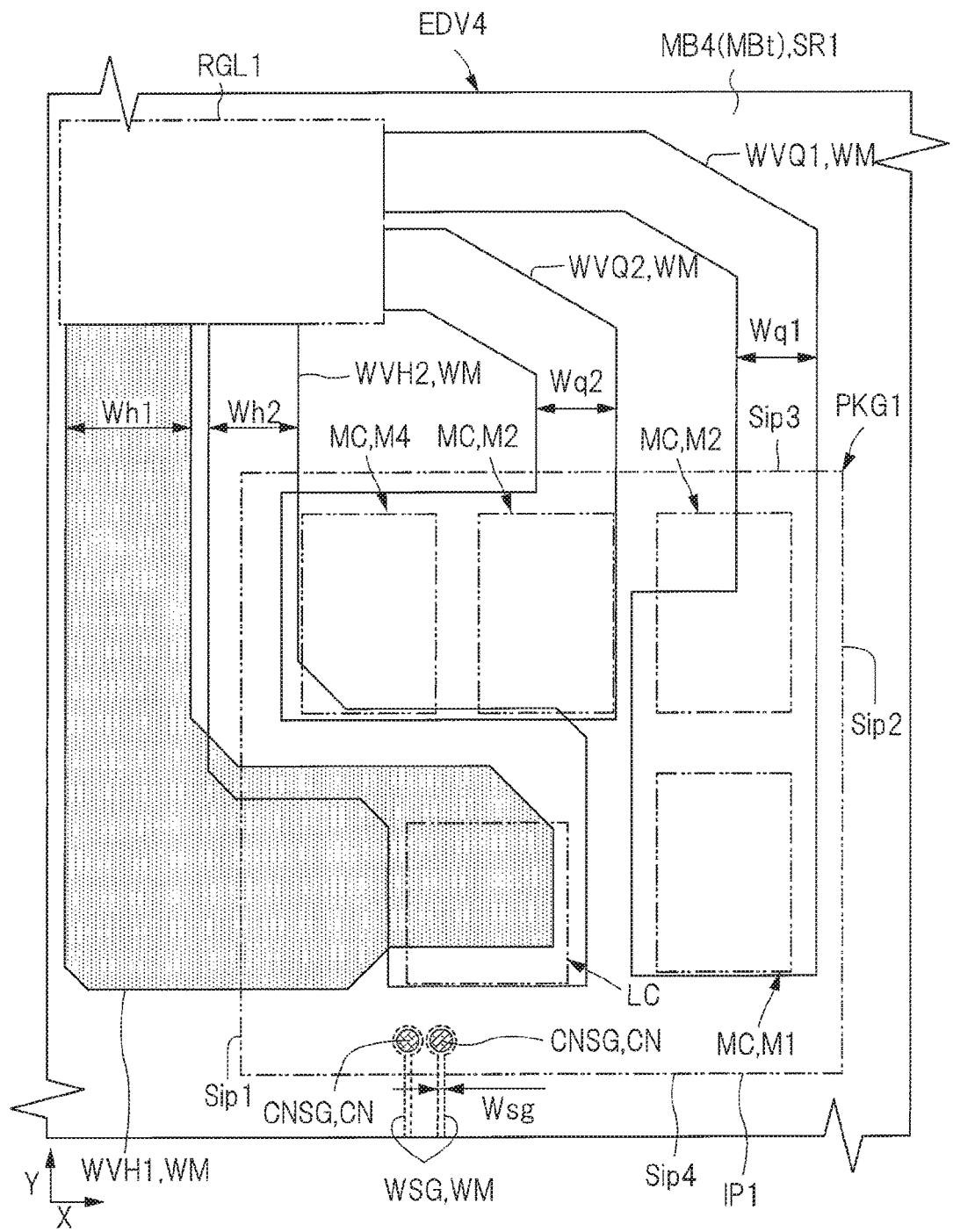
FIG. 23 is an enlarged plan view illustrating an example of a wiring layout in a plan view of a motherboard illustrated in FIG. 22.

A semiconductor device PKG3 and an electronic device EDV4 having four memory chips MC will be described below with reference to FIG. 22 and FIG. 23. FIG. 22 is a plan view illustrating an electronic device on which a semiconductor device according to a modification example of FIG. 1 is mounted. FIG. 23 is an enlarged plan view illustrating an example of a wiring layout in a plan view of the motherboard illustrated in FIG. 22.

The semiconductor device PKG3 illustrated in FIG. 22 is different from the semiconductor device PKG1 illustrated in FIG. 1 in that four memory chips MC are mounted on the wiring substrate IP1. A memory chip M3 and a memory chip M4 newly added as compared with FIG. 1 are mounted between the substrate side Sip3 and the memory chip M1 or the logic chip LC, respectively. More specifically, the memory chip M3 is mounted between the chip side Smc3 of the memory chip M1 and the substrate side Sip3. The memory chip M4 is mounted between the chip side Scp3 of the logic chip LC and the substrate side Sip3. In other words, the memory chips M2, M3, and M4 are mounted side by side between the substrate side Sip3 and the extension line of the chip side Scp3 of the logic chip LC. The memory chip M1 and the memory chip M3 are mounted side by side along the Y direction.

More specifically, the semiconductor device PKG3 has the plurality of memory chips M1, M2, M3, and M4. In a plan view, the plurality of memory chips M1, M2, M3, and M4 are intensively mounted between the chip side Scp2 of the logic chip LC and the substrate side Sip2 of the wiring substrate IP1 and between the chip side Scp3 of the logic chip LC and the substrate side Sip3 of the wiring substrate IP1. In this manner, when each of the plurality of memory chips MC is mounted along two sides of the four sides of the logic chip LC, the technique described in the embodiment can be similarly applied even if the number of memory chips MC is three or larger.

For example, as illustrated in FIG. 23, the power supply potential VDDQ1 (see FIG. 5) is supplied to the memory chip M1 and the memory chip M3 via the power supply line WVQ1. The power supply potential VDDQ2 (see FIG. 5) is supplied to the memory chip M2 and the memory chip M4 via the power supply line WVQ2.

In this case, as illustrated in FIG. 23, apart of power supply line WVQ2 and a part of power supply line WVH2 overlap with each other in some cases due to constraints on the layout of the memory chips M2 and M4. However, as explained in the above-described embodiments, the power supply line WVH2 is provided so as to pass between the power supply line WVH1 and the power supply line WVQ2, and therefore, the area where the power supply line WVH2 and the power supply line WVQ2 overlap with each other can be reduced.

As illustrated in FIG. 22, the separation distance PT2 between the memory chip M2 and the logic chip LC is larger than the separation distance PT1 between the memory chip M1 and the logic chip LC. The separation distance PT3 between the memory chip M4 and the logic chip LC is larger than the separation distance PT1 between the memory chip M1 and the logic chip LC. In other words, each of the memory chip M2 and the memory chip M4 has a wide gap (separation distance PT2) from the logic chip LC. When the wide gaps (separation distances PT2, PT3) are provided between the memory chips M2, M4 and the logic chip LC as described above, the area where the power supply line WVH2 and the power supply line WVQ2 overlap with each other can be further reduced.

By the measures as described above, the area of the region of the power supply line WVH2, the region overlapping with the power supply line WVQ2 in the thickness direction, is smaller than the area of the region of the power supply line WVH2, the region not overlapping with the power supply line WVQ2 as illustrated in FIG. 23.

Modification Example 3

Figure 24:
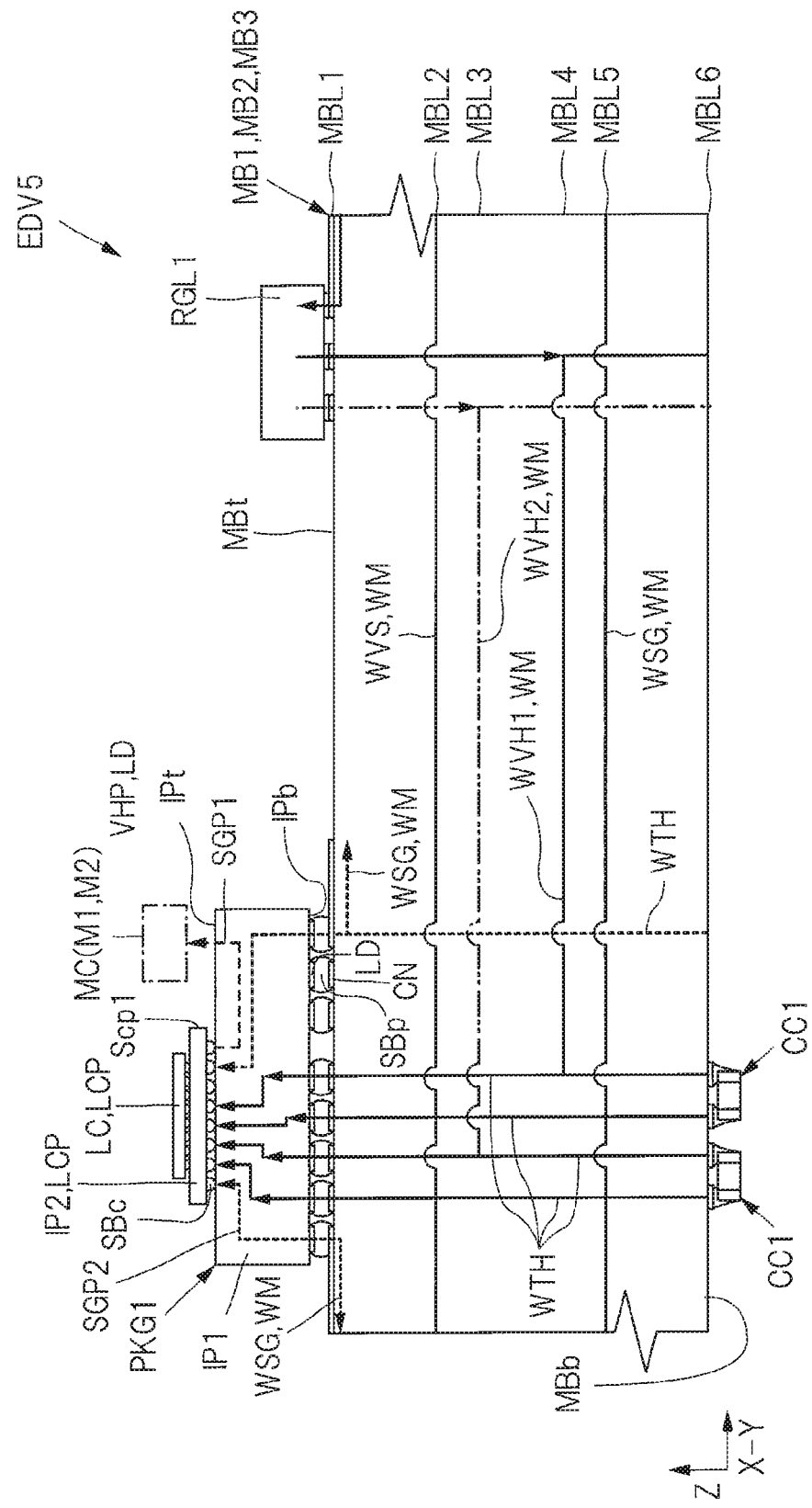
FIG. 24 is an enlarged cross-sectional view illustrating an example of configuration of an electronic device of a modification example of FIG. 2.

The above-described embodiment has described the aspect of mounting the semiconductor chip on the wiring substrate IP1 by the face down mounting method as an example of the semiconductor device PKG1. However, the logic chip LC illustrated in FIG. 7 and the memory chip MC illustrated in FIG. 7 may be mounted not only directly on the wiring substrate IP1 which is the package substrate but also on the wiring substrate IP1 via the interposer. As one example, an aspect of mounting the logic chip LC illustrated in FIG. 2 on the wiring substrate IP1 via a wiring substrate for the interposer that is different from the wiring substrate IP1 will be explained as a modification example of FIG. 2. FIG. 24 is an enlarged cross-sectional view illustrating an example of configuration of an electronic device according to the modification example of FIG. 2.

The logic chip LC included in the electronic device EDV5 illustrated in FIG. 24 is mounted on the upper surface IPt of the wiring substrate IP1 via the wiring substrate IP2 which is an interposer different from the wiring substrate IP1. In other words, a logic package LCP having the logic chip LC mounted on the wiring substrate IP2 is mounted on the upper surface IPt of the wiring substrate IP1.

The description for the logic chip LC described in the above-described embodiment may be replaced with description for the logic package LCP in which the logic chip LC is embedded as illustrated in FIG. 24. When the logic chip LC described in the above-described embodiment is replaced with the logic package LCP, note that each of the plurality of electrodes PDL illustrated in FIG. 7 is made of a material containing, for example, copper (Cu) as a main component.

In FIG. 24, as an example of the semiconductor package mounted on the wiring substrate IP1, the logic package LPC in which the logic chip LC is embedded has been typically exemplified and explained. However, as a modification example of FIG. 24, a memory package (semiconductor package) in which the memory chip MC illustrated in FIG. 7 is embedded may be mounted. More specifically, the memory chip MC illustrated in FIG. 7 may be replaced with a memory package. In this case, each of the plurality of electrodes PDM illustrated in FIG. 7 is made of a material containing copper (Cu) as a main component.

In the present modification example, either one or both of the logic package LCP and the memory package may be mounted.

By using FIG. 19 (flowchart), the above-described embodiment exemplifies the overviews of the step of manufacturing the semiconductor device and the step of manufacturing the electronic device illustrated in FIG. 1 by manufacturing and mounting the semiconductor device on the motherboard. However, the step of manufacturing the semiconductor device and the step of manufacturing the electronic device have various modification examples.

Figure 25:
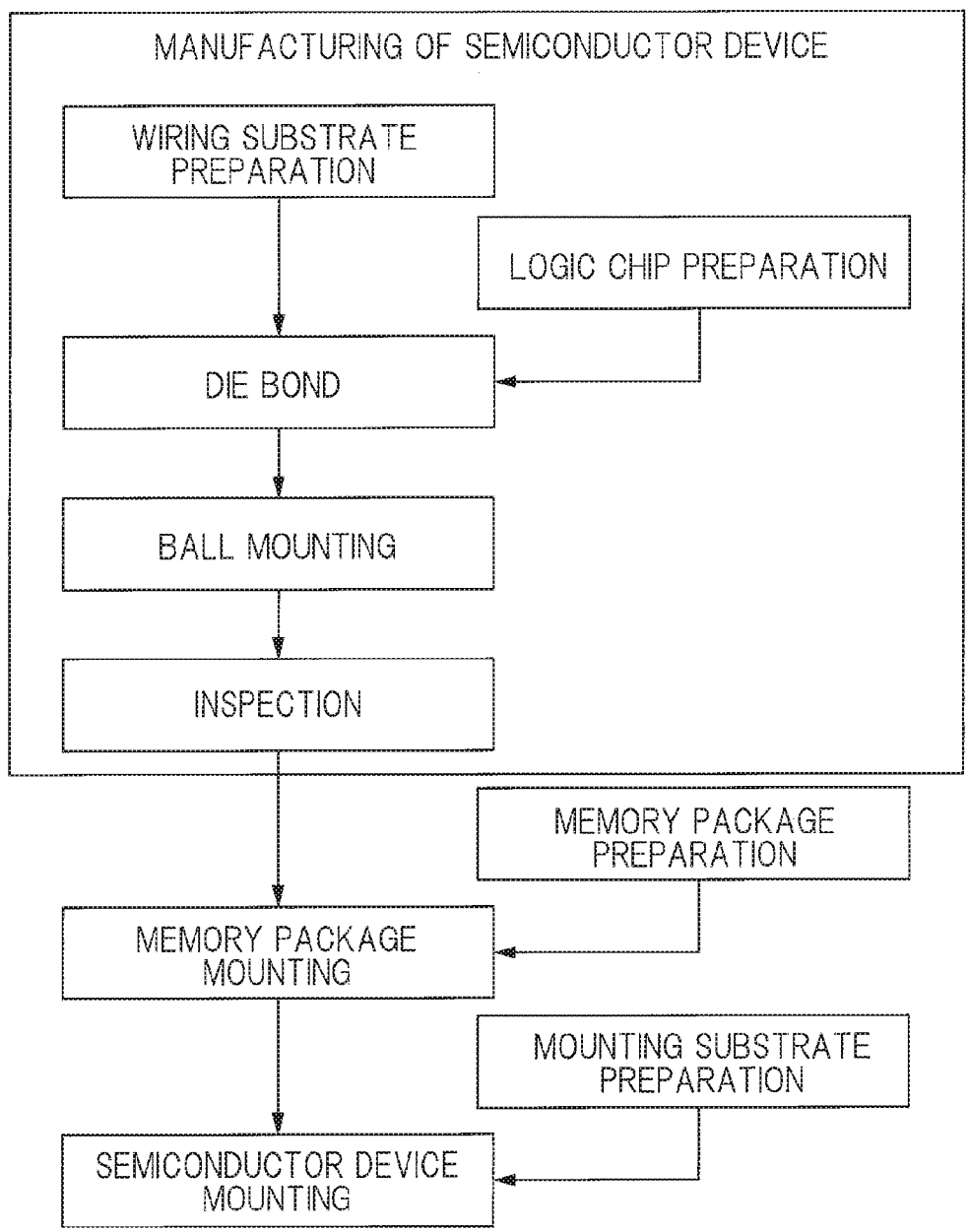
FIG. 25 is an explanatory diagram illustrating a modification example of the manufacturing step illustrated in FIG. 19.

For example, when the memory package is mounted on the wiring substrate IP1 as seen in the present modification example, a manufacturing step illustrated in FIG. 25 is cited. FIG. 25 is an explanatory diagram illustrating the modification example of the manufacturing step illustrated in FIG. 19 (flowchart).

As seen in a modification example described with reference to FIG. 24, a so-called PoP (Package on Package) method is cited as a method of mounting a different semiconductor package on a semiconductor package. In the PoP method, the semiconductor device on the lower stage side and the semiconductor device on the upper stage side are manufactured separately by different manufactures from each other, and a business operator who purchases the semiconductor device from each manufacturer performs the final assembly in some cases.

This case provides the assembly flow illustrated in FIG. 25. More specifically, in the semiconductor device manufacturing step, the inspection is performed in a state the logic chip LC is mounted on the wiring substrate IP1 illustrated in FIG. 2 but the memory chip MC is not mounted thereon, and then, the semiconductor is delivered. And, for example, a different manufacturer manufactures a memory package having the memory chip MC mounted on the wiring substrate (in the memory chip preparation step). Subsequently, a business operator who purchases each of the semiconductor device on which the logic chip LC is mounted and the memory package mounts the memory package on the wiring substrate IP1. Then, the semiconductor device on which the memory package is mounted is mounted on the wiring substrate MB illustrated in FIG. 2. Through the above-described steps, the semiconductor device and the electronic device on which the semiconductor device is mounted manufactured by the PoP method can be obtained.

Modification Example 4

For example, various modifications have been described as described above. However, combination of the modification examples described above can be applied.

EXPLANATION OF REFERENCE CHARACTERS

ANLP analog signal transmission path
CAC input/output circuit
CC1 capacitor
ChA0, ChA1, ChB0, ChB1 channel
CKP1, CKP2 clock signal transmission path
CN, CN1, CN2, CN3, CNSG, CNVH1, CNVH2, CNVQ1, CNVQ2, CNVS terminal (mounting substrate terminal)
CR core layer (core material, core insulating layer)
CTL control circuit
CTP1, CTP2 control signal transmission path
DBA chip mounting region
DTP1, DTP2 data signal transmission path
EDV1, EDV2, EDV3, EDV4, EDV5 electronic device (electronic equipment)
FMC semiconductor chip (nonvolatile memory chip)
IIF internal interface electrode (interface terminal)
IL insulating layer
IP1, IP2 wiring substrate (interposer)
IPb lower surface (surface, main surface, mounting surface)
IPs side surface
IPt upper surface (surface, main surface, chip mounting surface)
LC logic chip (semiconductor chip)
LCb, MCb back surface (main surface, lower surface)
LCP logic package
LCs, MCs side surface
LCt, MCt front surface (main surface, upper surface)
LD, LD1, LD2, LDSG, LDVA, LDVH1, LDVH2, LDVQ1, LDVQ2, LDVS terminal (land, external connection terminal)
M1, M2, M3, M4, MC memory chip (semiconductor chip)
MB1, MB2, MB3, MBh wiring substrate (motherboard, mounting substrate)
MBb lower surface (surface, back surface)
MBL1, MBL2, MBL3, MBL4, MBL5, MBL6, WL1, WL2, WL3, WL4, WL5, WL6, WL7, WL8, WL9, WL10 wiring layer
MBt upper surface (surface, semiconductor device mounting surface)
OIF external interface electrode (interface terminal)
PDL, PDM electrode (chip terminal, bonding pad)
PKG1, PKG2, PKG3 semiconductor device
PRC arithmetic processing circuit
PT1, PT2, PT3, PTh1, PTh2 separation distance
RAM memory circuit (storage circuit)
RGL1 power supply device (regulator)
SBc protrusion electrode (bump electrode)
SBp solder ball (solder material, external terminal, electrode, external electrode)
Scp1, Scp2, Scp3, Scp4, Smc1, Smc2, Smc3, Smc4 chip side
SGANL analog signal
SGCLK1, SGCLK2 clock signal
SGCTL1, SGCTL2 control signal
SGDAT1, SGDAT2 data signal
SGP1, SGP2 signal transmission path
Sip1, Sip2, Sip3, Sip4 substrate side
SR1, SR2, SR3 insulating film
SRk1, SRk2 opening portion
TCS bonding pad (bonding lead, terminal for semiconductor chip connection)
THW, TW through hole wiring
UF underfill resin (insulating resin)
VA via
VDDH1, VDDH2, VDDQ1, VDDQ2 power supply potential
VDH1P, VDH2P, VDQ1P, VDQ2P power supply potential supply path
VQ1P, VQ2P power supply plane (power supply conductor pattern)
VSP ground plane (conductor pattern)
VSS reference potential
VSSP reference potential supply path
WBY connection wiring
Wh1, Wh2, Wq1, Wq2, Wsg wiring width
WM wiring (mounting substrate wiring, motherboard wiring)
WR wiring
WSG signal line
WTH, WTH1, WTH2 through hole wiring
WVh opening portion
WVH1, WVH2, WVQ1, WVQ2 power supply line (wiring)
WVS reference potential line (wiring)

The invention claimed is:
1. An electronic device comprising:
a first wiring substrate including a first surface and a second surface opposite to the first surface; and a semiconductor device including a second wiring substrate, a plurality of first semiconductor chips, and a second semiconductor chip, the second wiring substrate having a third surface, a fourth surface opposite to the third surface, and a plurality of terminals formed on the fourth surface, the plurality of first semiconductor chips being mounted on the third surface of the second wiring substrate, and the second semiconductor chip being mounted side by side with the plurality of first semiconductor chips on the third surface of the second wiring substrate and having a circuit controlling each of the plurality of first semiconductor chips, and the semiconductor device being mounted on the first surface of the first wiring substrate, wherein, in a plan view, a peripheral edge portion of the second wiring substrate includes a first substrate side, a second substrate side opposite to the first substrate side, a third substrate side crossing the first substrate side and the second substrate side, and a fourth substrate side opposite to the third substrate side, in a plan view, a peripheral edge portion of the second semiconductor chip includes a first chip side, a second chip side opposite to the first chip side, a third chip side crossing the first chip side and the second chip side, and a fourth chip side opposite to the third chip side, the second semiconductor chip is mounted on the second wiring substrate so that the first chip side of the second semiconductor chip is side by side with the first substrate side of the second wiring substrate and so that the third chip side of the second semiconductor chip is side by side with the third substrate side of the second wiring substrate, at least one of the plurality of first semiconductor chips is mounted between the second chip side of the second semiconductor chip and the second substrate side of the second wiring substrate, at least another one of the plurality of first semiconductor chips is mounted between the third chip side of the second semiconductor chip and the third substrate side of the second wiring substrate, a plurality of signal wirings are formed between the fourth chip side of the second semiconductor chip and the fourth substrate side of the second wiring substrate, the first wiring substrate includes a first power supply line supplying a first power supply potential to the second semiconductor chip and a second power supply line supplying a second power supply potential larger than the first power supply potential to the second semiconductor chip, in a plan view, the second power supply line is arranged to cross over the first substrate side of the second wiring substrate and the first chip side of the second semiconductor chip, in a plan view, the first power supply line is arranged to pass between the second power supply line and at least one of the plurality of first semiconductor chips and to extend toward a region overlapping with the second semiconductor chip, and an area of a region of the first power supply line, the region overlapping with the second power supply line in a thickness direction, is smaller than an area of another region of the first power supply line, the another region not overlapping with the second power supply line.

2. The electronic device according to claim 1,
wherein the first wiring substrate includes a third power supply line supplying a third power supply potential to at least one of the plurality of first semiconductor chips and a fourth power supply line supplying a fourth power supply potential to at least another one of the plurality of first semiconductor chips, in a plan view, each of the third power supply line and the fourth power supply line is arranged to cross over the third substrate side of the second wiring substrate, and each of the third power supply line and the fourth power supply line does not overlap with the second semiconductor chip in the thickness direction.

3. The electronic device according to claim 2,
wherein the third power supply line does not overlap with the first power supply line and the second power supply line in the thickness direction.

4. The electronic device according to claim 3,
wherein the fourth power supply line does not overlap with the first power supply line and the second power supply line in the thickness direction.

5. The electronic device according to claim 3,
wherein the fourth power supply line overlaps with a part of the first power supply line in the thickness direction but does not overlap with the second power supply line in the thickness direction, and an area of a region of the second power supply line, the region overlapping with the fourth power supply line in the thickness direction, is smaller than an area of another region of the second power supply line, the another region not overlapping with the fourth power supply line.

6. The electronic device according to claim 3,
wherein the third power supply potential is larger than each of the first power supply potential and the second power supply potential.

7. The electronic device according to claim 2,
wherein the plurality of terminals arranged on the fourth surface of the second wiring substrate in a plurality of rows along an outer periphery of the fourth surface include:
a terminal for power supply potential supplying power supply potentials including the first power supply potential, the second power supply potential, the third power supply potential, and the fourth power supply potential;
a terminal for reference potential supplying a reference potential; and
a terminal for signal transmitting an electric signal,
the fourth surface of each of the plurality of terminals includes:
a first terminal arrangement unit in which the terminals for power supply potential or the terminals for reference potential of the plurality of terminals are arranged to be more than the terminal for signal; and
a second terminal arrangement unit which is provided on an outer peripheral side of the fourth surface out of the first terminal arrangement unit and in which a plurality of the terminals for signal are arranged to be as many as or more than the terminal for power supply potential and the terminal for reference potential,
in a first region of the fourth surface, the first region overlapping with either one of the third power supply line and the fourth power supply line, the number of rows of the second terminal arrangement unit is smaller than the number of the same in a second region of the fourth surface, the second region overlapping with a region sandwiched between the third power supply line and the fourth power supply line.

8. The electronic device according to claim 2,
wherein the second wiring substrate includes:
   a third power supply potential supply path supplying the third power supply potential to the second semiconductor chip; and
   a fourth power supply potential supply path supplying the fourth power supply potential to the second semiconductor chip, and
each of the third power supply potential supply path and the fourth power supply potential supply path includes a conductor pattern having an area larger than a planar area of each of the plurality of first semiconductor chips.

9. The electronic device according to claim 8,
wherein each of a first conductor pattern configuring the third power supply potential supply path and a second conductor pattern configuring the third power supply potential supply path overlaps with the second semiconductor chip in the thickness direction.

10. The electronic device according to claim 1,
wherein a wiring width of the second power supply line is larger than a wiring width of the first power supply line.

11. The electronic device according to claim 1,
wherein the plurality of signal wirings formed between the fourth chip side of the second semiconductor chip and the fourth substrate side of the second wiring substrate include a plurality of analog signal wirings to which analog signals are supplied.

12. The electronic device according to claim 1,
wherein a first semiconductor chip of the plurality of first semiconductor chips, the first semiconductor chip being mounted between the second chip side of the second semiconductor chip and the second substrate side of the second wiring substrate, has a first separation distance from the second semiconductor chip,
another first semiconductor chip of the plurality of first semiconductor chips, the another first semiconductor chip being mounted between the third chip side of the second semiconductor chip and the third substrate side of the second wiring substrate, has a second separation distance from the second semiconductor chip,
the second separation distance is larger than the first separation distance, and
the first power supply line is arranged to cross over the third chip side of the second semiconductor chip.

13. The electronic device according to claim 1,
wherein the first wiring substrate includes a plurality of wiring layers, and
each of the first power supply line and the second power supply line is formed in a wiring layer of the plurality of wiring layers, the wiring layer being not a first wiring layer arranged closest to the first surface.

14. The electronic device according to claim 1,
wherein the first wiring substrate includes:
   a third power supply line supplying a third power supply potential to at least one of the plurality of first semiconductor chips; and
   a fourth power supply line supplying a fourth power supply potential to at least another one of the plurality of first semiconductor chips,
the plurality of terminals arranged on the fourth surface of the second wiring substrate in a plurality of rows along an outer periphery of the fourth surface include:
   a terminal for power supply potential supplying power supply potentials including the first power supply potential, the second power supply potential, the third power supply potential, and the fourth power supply potential;
   a terminal for reference potential supplying a reference potential; and
   a terminal for signal transmitting an electric signal,
the fourth surface of each of the plurality of terminals includes:
   a first terminal arrangement unit in which the terminals for power supply potential or the terminals for reference potential of the plurality of terminals are arranged to be more than the terminal for signal; and
   a second terminal arrangement unit which is provided on an outer peripheral side of the fourth surface out of the first terminal arrangement unit and in which a plurality of the terminals for signal are arranged to be as many as or more than the terminal for power supply potential and the terminal for reference potential, and,
in a first region of the fourth surface, the first region overlapping with any one of the first power supply line, the second power supply line, the third power supply line, the fourth power supply line, the number of rows of the second terminal arrangement unit is smaller than the number of the same in a second region of the fourth surface, the second region overlapping with a region sandwiched between the third power supply line and the fourth power supply line.

15. The electronic device according to claim 1,
wherein the semiconductor device includes a third semiconductor chip between the first chip side of the second semiconductor chip and the first substrate side of the second wiring substrate on the third surface of the second wiring substrate, the third semiconductor chip being mounted at a position overlapping with the first power supply line or the second power supply line in a thickness direction and being electrically connected to the first semiconductor chip,
the third semiconductor chip is electrically connected to a plurality of terminals for the third semiconductor chip among the plurality of terminals formed on the fourth surface of the second wiring substrate,
the first wiring substrate includes a plurality of wiring layers including: a first wiring layer provided with the first power supply line; a second wiring layer provided with the second power supply line; and a first-surface-sided wiring layer arranged closest to the first surface, and
the number of first terminals of the plurality of terminals for the third semiconductor chip, the first terminal being connected to a wiring layer being not the first-surface-sided wiring layer, is smaller than the number of second terminals of the same, the second terminal being not connected to a wiring layer being not the first-surface-sided wiring layer.

16. The electronic device according to claim 1,
wherein the first wiring substrate includes a plurality of through hole wirings penetrating through the first power supply line or the second power supply line in a thickness direction,
the first power supply line or the second power supply line is provided with a plurality of opening portions arranged at crossing portions with the plurality of through hole wirings along a first direction in which the first power supply line or the second power supply line extends, and a first separation distance between opening portions of the plurality of opening portions, the opening portions being adjacent to each other in the first direction, is smaller than a second separation distance between another opening portions of the same, the another opening portions being adjacent to each other in a second direction perpendicular to the first direction.

17. The electronic device according to claim 1,
wherein the plurality of terminals of the second wiring substrate include:
   a first power supply terminal connected to the first power supply line or the second power supply line via a first through hole wiring penetrating through the first wiring substrate in a thickness direction; and
   a power supply terminal for analog supplying a power supply potential to an analog circuit included in the second semiconductor chip,
the first wiring substrate includes a plurality of wiring layers including a first wiring layer in which the first power supply line is provided and a second wiring layer in which the second power supply line is provided,
the power supply terminal for analog is electrically connected to the first power supply terminal via a second through hole wiring penetrating through the first wiring substrate in the thickness direction and via a connection wiring connecting the first through hole wiring and the second through hole wiring, and
the connection wiring is provided in a wiring layer of the plurality of wiring layers of the first wiring layer, the wiring layer being closer to the second surface than the first wiring layer and the second wiring layer, and is not provided in the first wiring layer, the second wiring layer, and a wiring layer closer to the first surface than the first wiring layer and the second wiring layer.

18. An electronic device comprising:
a first wiring substrate including a first surface and a second surface opposite to the first surface; and
a semiconductor device including a second wiring substrate, a plurality of first semiconductor chips, and a second semiconductor chip, the second wiring substrate including a third surface, a fourth surface opposite to the third surface, and a plurality of terminals formed on the fourth surface, the plurality of first semiconductor chips being mounted on the third surface of the second wiring substrate, and the second semiconductor chip being mounted side by side with the plurality of first semiconductor chips on the third surface of the second wiring substrate and having a circuit controlling each of the plurality of first semiconductor chips, the semiconductor device being mounted on the first surface of the first wiring substrate,
wherein, in a plan view, a peripheral edge portion of the second wiring substrate includes a first substrate side, a second substrate side opposite to the first substrate side, a third substrate side crossing the first substrate side and the second substrate side, and a fourth substrate side opposite to the third substrate side,
in a plan view, a peripheral edge portion of the second semiconductor chip includes a first chip side, a second chip side opposite to the first chip side, a third chip side crossing the first chip side and the second chip side, and a fourth chip side opposite to the third chip side,
the second semiconductor chip is mounted on the second wiring substrate so that the first chip side of the second semiconductor chip is side by side with the first substrate side of the second wiring substrate and so that the third chip side of the second semiconductor chip is side by side with the third substrate side of the second wiring substrate,
at least one of the plurality of first semiconductor chips is mounted between the second chip side of the second semiconductor chip and the second substrate side of the second wiring substrate,
at least another one of the plurality of first semiconductor chips is mounted between the third chip side of the second semiconductor chip and the third substrate side of the second wiring substrate,
a plurality of signal wirings are formed between the fourth chip side of the second semiconductor chip and the fourth substrate side of the second wiring substrate,
the first wiring substrate includes a first power supply line supplying a first power supply potential to the second semiconductor chip and a second power supply line having a wiring width wider than the first power supply line and supplying a second power supply potential to the second semiconductor chip,
in a plan view, the second power supply line is arranged to cross over the first substrate side of the second wiring substrate and the first chip side of the second semiconductor chip,
in a plan view, the first power supply line is arranged to pass between the second power supply line and at least one of the plurality of first semiconductor chips and to extend toward a region overlapping with the second semiconductor chip, and
an area of a region of the first power supply line, the region overlapping with the second power supply line in a thickness direction, is smaller than an area of another region of the first power supply line, the another region not overlapping with the second power supply line.

19. An electronic device comprising:
a first wiring substrate including a first surface and a second surface opposite to the first surface; and
a semiconductor device including a second wiring substrate, a plurality of first semiconductor chips, and a second semiconductor chip, the second wiring substrate including a third surface, a fourth surface opposite to the third surface, and a plurality of terminals formed on the fourth surface, the plurality of first semiconductor chips being mounted on the third surface of the second wiring substrate, and the second semiconductor chip being mounted side by side with the plurality of first semiconductor chips on the third surface of the second wiring substrate and having a circuit controlling each of the plurality of first semiconductor chips, the semiconductor device being mounted on the first surface of the first wiring substrate,
wherein, in a plan view, a peripheral edge portion of the second wiring substrate includes a first substrate side, a second substrate side opposite to the first substrate side, a third substrate side crossing the first substrate side and the second substrate side, and a fourth substrate side opposite to the third substrate side,
in a plan view, a peripheral edge portion of the second semiconductor chip includes a first chip side, a second chip side opposite to the first chip side, a third chip side crossing the first chip side and the second chip side, and a fourth chip side opposite to the third chip side,
the second semiconductor chip is mounted on the second wiring substrate so that the first chip side of the second semiconductor chip is side by side with the first substrate side of the second wiring substrate and so that the third chip side of the second semiconductor chip is side by side with the third substrate side of the second wiring substrate, at least one of the plurality of first semiconductor chips is mounted between the second chip side of the second semiconductor chip and the second substrate side of the second wiring substrate, at least another one of the plurality of first semiconductor chips is mounted between the third chip side of the second semiconductor chip and the third substrate side of the second wiring substrate, a plurality of signal wirings are formed between the fourth chip side of the second semiconductor chip and the fourth substrate side of the second wiring substrate, the first wiring substrate includes a first power supply line supplying a first current to the second semiconductor chip and a second power supply line supplying a second current larger than the first current to the second semiconductor chip, in a plan view, the second power supply line is arranged to cross over the first substrate side of the second wiring substrate and the first chip side of the second semiconductor chip, in a plan view, the first power supply line is arranged to pass between the second power supply line and at least one of the plurality of first semiconductor chips and to extend toward a region overlapping with the second semiconductor chip, and an area of a first region of the first power supply line, the first region overlapping with the second power supply line in a thickness direction, is smaller than an area of a second region of the first power supply line, the second region not overlapping with the second power supply line.

* * * * *